(12) United States Patent
Takahashi

(10) Patent No.: US 11,105,965 B2
(45) Date of Patent: Aug. 31, 2021

(54) RADIATION-SENSITIVE COMPOSITION, OPTICAL FILTER, LAMINATE, PATTERN FORMING METHOD, SOLID IMAGE PICKUP ELEMENT, IMAGE DISPLAY DEVICE, AND INFRARED SENSOR

(71) Applicant: FUJIFILM Corporation, Tokyo (JP)

(72) Inventor: Kazutaka Takahashi, Haibara-gun (JP)

(73) Assignee: FUJIFILM Corporation, Tokyo (JP)

( * ) Notice: Subject to any disclaimer, the term of this patent is extended or adjusted under 35 U.S.C. 154(b) by 480 days.

(21) Appl. No.: 16/108,322

(22) Filed: Aug. 22, 2018

(65) Prior Publication Data

US 2018/0356575 A1 Dec. 13, 2018

Related U.S. Application Data

(63) Continuation of application No. PCT/JP2017/006565, filed on Feb. 22, 2017.

(30) Foreign Application Priority Data

Feb. 26, 2016 (JP) .............................. JP2016-035021

(51) Int. Cl.
  *G02B 5/22* (2006.01)
  *G03F 7/032* (2006.01)
  *G03F 7/031* (2006.01)
  *G03F 7/033* (2006.01)
  *G02B 5/20* (2006.01)
  *G03F 7/027* (2006.01)
  *H01L 27/32* (2006.01)
  *H01L 27/146* (2006.01)
  *G02F 1/1335* (2006.01)
  *H01L 31/0232* (2014.01)
  *G03F 7/00* (2006.01)

(52) U.S. Cl.
  CPC ............... *G02B 5/223* (2013.01); *G02B 5/20* (2013.01); *G02B 5/22* (2013.01); *G02F 1/1335* (2013.01); *G03F 7/0007* (2013.01); *G03F 7/027* (2013.01); *G03F 7/0275* (2013.01); *G03F 7/031* (2013.01); *G03F 7/033* (2013.01); *H01L 27/1462* (2013.01); *H01L 27/14621* (2013.01); *H01L 27/322* (2013.01); *H01L 31/0232* (2013.01); *G02F 1/133509* (2013.01); *G02F 2203/055* (2013.01); *G02F 2203/11* (2013.01); *H01L 27/14623* (2013.01)

(58) Field of Classification Search
  CPC ........ G03F 7/0007; G03F 7/027; G03F 7/275; G03F 7/028; G03F 7/031; G03F 7/032; G03F 7/033; G02F 1/133514; G02F 1/133516; G02F 1/133509; G02F 2203/11; G02B 5/208; G02B 5/22; G02B 5/223; H01L 27/14621; H01L 27/322; H01L 31/0232

USPC ................................................... 430/7, 281.1
See application file for complete search history.

(56) References Cited

U.S. PATENT DOCUMENTS

| 2011/0070407 | A1* | 3/2011 | Kato | C09B 23/0058 |
| | | | | 428/172 |
| 2011/0245538 | A1 | 10/2011 | Kato et al. | |
| 2014/0349220 | A1* | 11/2014 | Moon | G03F 7/0007 |
| | | | | 430/7 |
| 2015/0185383 | A1* | 7/2015 | Katoh | G02B 5/206 |
| | | | | 428/323 |
| 2016/0011336 | A1 | 1/2016 | Takakuwa et al. | |
| 2016/0282531 | A1 | 9/2016 | Murayama et al. | |
| 2016/0327860 | A1 | 11/2016 | Murayama et al. | |
| 2017/0038507 | A1 | 2/2017 | Norizuki et al. | |
| 2017/0090083 | A1 | 3/2017 | Takishita et al. | |

FOREIGN PATENT DOCUMENTS

| JP | 2003-131377 A | 5/2003 |
| JP | 2009-92731 A | 4/2009 |
| JP | 2009-210688 A | 9/2009 |
| JP | 2011-68731 A | 4/2011 |
| JP | 2011-208101 A | 10/2011 |

(Continued)

OTHER PUBLICATIONS

Computer-generated translation of JP 2014-149432 (Aug. 2014). (Year: 2014).*

(Continued)

*Primary Examiner* — John A McPherson
(74) *Attorney, Agent, or Firm* — Birch, Stewart, Kolasch & Birch, LLP

(57) ABSTRACT

Provided is a radiation-sensitive composition with which a pattern having excellent infrared shielding properties and excellent rectangularity can be formed. In addition, provided are an optical filter, a laminate, a pattern forming method, a solid image pickup element, an image display device, and an infrared sensor. This radiation-sensitive composition includes: a near infrared absorber; a resin; a radically polymerizable compound; and a photoradical polymerization initiator, in which the radiation-sensitive composition has an absorption maximum in a wavelength range of 700 to 1000 nm, a ratio absorbance Amax/absorbance A550 of an absorbance Amax at the absorption maximum to an absorbance A550 at a wavelength of 550 nm is 50 to 500, the resin includes a resin having an acid group, and a mass ratio radically polymerizable compound/resin having an acid group of the radically polymerizable compound to the resin having an acid group is 0.3 to 0.7.

26 Claims, 1 Drawing Sheet

(56) References Cited

FOREIGN PATENT DOCUMENTS

| | | | |
|---|---|---|---|
| JP | 2012-77153 | A | 4/2012 |
| JP | 2013-137337 | A | 7/2013 |
| JP | 2014-149432 | A | 8/2014 |
| JP | 2014-191190 | A | 10/2014 |
| JP | 2014-224921 | A | 12/2014 |
| JP | 2015-163955 | A | 9/2015 |
| TW | 201430040 | A | 8/2014 |
| TW | 201531800 | A | 8/2015 |
| TW | 201542779 | A | 11/2015 |
| TW | 201600892 | A | 1/2016 |
| WO | WO 2014/069197 | A1 | 5/2014 |
| WO | WO 2015/115539 | A1 | 8/2015 |
| WO | WO 2015/163156 | A1 | 10/2015 |
| WO | WO 2015/166779 | A1 | 11/2015 |
| WO | WO 2015/182278 | A1 | 12/2015 |

OTHER PUBLICATIONS

Partial translation of JP 2014-149432 (Aug. 2014). (Year: 2014).*

Japanese Office Action dated Aug. 13, 2019, for Japanese Application No. 2018-501731, with English translation.

Taiwanese Office Action and Search Report dated Nov. 26, 2020 for corresponding Application No. 106105672 with an English translation of the Office Action.

Japanese Office Action for corresponding Japanese Application No. 2018-501731, dated Feb. 12, 2020, with English translation.

English Translation of Written Opinion of the International Searching Authority dated May 16, 2017, issued in PCT/JP2017/006565 (Form PCT/ISA/237).

International Search Report dated May 16, 2017, issued in PCT/JP2017/006565 (Form PCT/ISA/210).

* cited by examiner

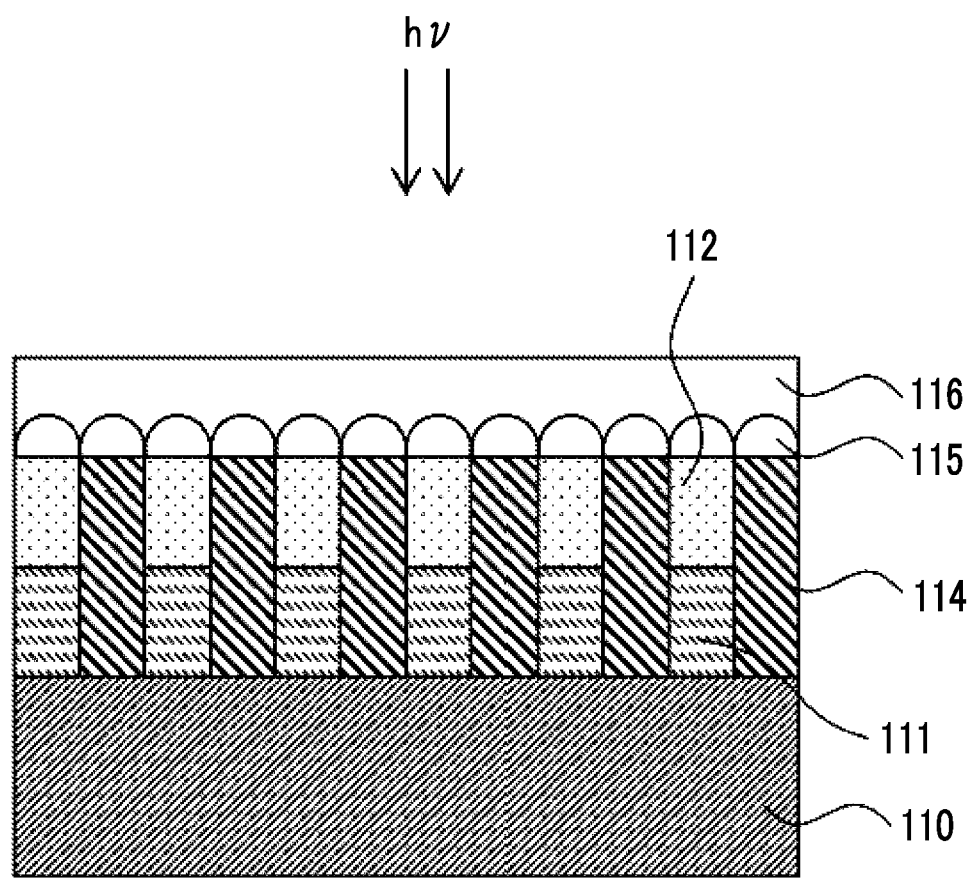

RADIATION-SENSITIVE COMPOSITION, OPTICAL FILTER, LAMINATE, PATTERN FORMING METHOD, SOLID IMAGE PICKUP ELEMENT, IMAGE DISPLAY DEVICE, AND INFRARED SENSOR

This application is a Continuation of PCT International Application No. PCT/JP2017/006565 filed on Feb. 22, 2017, which claims priority under 35 U.S.C. § 119(a) to Japanese Patent Application No. 2016-035021 filed on Feb. 26, 2016. Each of the above application(s) is hereby expressly incorporated by reference, in its entirety, into the present application.

BACKGROUND OF THE INVENTION

1. Field of the Invention

The present invention relates to a radiation-sensitive composition, an optical filter, a laminate, a pattern forming method, a solid image pickup element, an image display device, and an infrared sensor.

2. Description of the Related Art

In a video camera, a digital still camera, a mobile phone with a camera function, or the like, a charge coupled device (CCD) or a complementary metal-oxide semiconductor (CMOS), which is a solid image pickup element for a color image, is used. In a light receiving section of this solid image pickup element, a silicon photodiode having sensitivity to infrared light is used. Therefore, visibility may be corrected using a near infrared cut filter.

A near infrared cut filter has high infrared shielding properties. Therefore, a method of manufacturing a near infrared cut filter using a radiation-sensitive composition including a near infrared absorber is known. For example, JP2014-191190A describes that a near infrared cut filter or the like is manufactured using a radiation-sensitive composition including a pyrrolopyrrole compound. JP2013-137337A describes that a near infrared cut filter or the like is manufactured using a radiation-sensitive composition including cesium tungsten oxide or the like. JP2014-224921A describes that a near infrared cut filter or the like is manufactured using a radiation-sensitive composition including a naphthalocyanine colorant or the like.

SUMMARY OF THE INVENTION

In the related art, a near infrared cut filter has been used as a planarizing film. Recently, the use of a near infrared cut filter on which a pattern is formed has been considered. For example, the use of a laminate in which each pixel (for example, a red pixel, a blue pixel, or a green pixel) of a color filter is formed on a pattern of a near infrared cut filter has been considered. In a case where this laminate is manufactured, it is desirable that the pattern of the near infrared cut filter has excellent rectangularity. In a case where the rectangularity of the pattern of the near infrared cut filter is excellent, when the laminate is formed by forming each pixel of a color filter on the pattern of the near infrared cut filter, formation of pores, mixing of colors, or the like can be suppressed.

However, according to an investigation by the present inventors, it was found that, in a case where a pattern is formed using a radiation-sensitive composition including a near infrared absorber, rectangularity is more likely to deteriorate as compared to a case where, for example, a pixel pattern of a color filter or the like is formed using a coloring composition including a chromatic colorant. In addition, a radiation-sensitive composition including a near infrared absorber that is well-known in the related art is not a composition that is assumed to be used for forming a pattern. In addition, it cannot be said that the well-known radiation-sensitive composition of the related art has sufficient rectangularity, and further improvement of rectangularity is desired.

Accordingly, an object of the present invention is to provide a radiation-sensitive composition with which a pattern having excellent infrared shielding properties and excellent rectangularity can be formed. In addition, another object of the present invention is to provide an optical filter, a laminate, a pattern forming method, a solid image pickup element, an image display device, and an infrared sensor.

As a result of thorough investigation under the above-described circumstances, the present inventors found that the object of the present invention can be achieved using a radiation-sensitive composition described below, thereby completing the present invention. The present invention provides the following.

<1> A radiation-sensitive composition comprising:
a near infrared absorber;
a resin;
a radically polymerizable compound; and
a photoradical polymerization initiator,
in which the radiation-sensitive composition has an absorption maximum in a wavelength range of 700 to 1000 nm,
a ratio absorbance Amax/absorbance A550 of an absorbance Amax at the absorption maximum to an absorbance A550 at a wavelength of 550 nm is 50 to 500,
the resin includes a resin having an acid group, and
a mass ratio radically polymerizable compound/resin having an acid group of the radically polymerizable compound to the resin having an acid group is 0.3 to 0.7.

<2> The radiation-sensitive composition according to <1>,
in which the resin includes an alkali-soluble resin, and
a mass ratio radically polymerizable compound/alkali-soluble resin of the radically polymerizable compound to the alkali-soluble resin is 0.3 to 0.7.

<3> The radiation-sensitive composition according to <1> or <2>,
in which the photoradical polymerization initiator includes an oxime compound.

<4> The radiation-sensitive composition according to <1> or <2>,
in which the photoradical polymerization initiator includes an oxime compound and an α-aminoketone compound.

<5> The radiation-sensitive composition according to any one of <1> to <4>,
in which the radically polymerizable compound is a radically polymerizable compound having an acid group.

<6> The radiation-sensitive composition according to any one of <1> to <5>, further comprising:
a chain transfer agent.

<7> The radiation-sensitive composition according to any one of <1> to <6>, further comprising:
an ultraviolet absorber.

<8> The radiation-sensitive composition according to any one of <1> to <7>, in which the near infrared absorber includes at least one selected from the group consisting of an organic pigment and an inorganic pigment.

<9> The radiation-sensitive composition according to any one of <1> to <7>, in which a content of the near infrared absorber is 20 mass % or higher with respect to a total solid content of the radiation-sensitive composition.

<10> An optical filter which is obtained using the radiation-sensitive composition according to any one of <1> to <9>.

<11> The optical filter according to <10>, in which the optical filter is a near infrared cut filter or an infrared transmitting filter.

<12> The optical filter according to <10> or <11>, further comprising:

an antireflection film.

<13> A laminate comprising:

a near infrared cut filter that is formed using the radiation-sensitive composition according to any one of <1> to <9>; and a color filter that includes a chromatic colorant.

<14> A pattern forming method comprising:

a step of forming a radiation-sensitive composition layer on a support using the radiation-sensitive composition according to any one of <1> to <9>;

a step of exposing the radiation-sensitive composition layer in a pattern shape; and a step of forming a pattern by removing a non-exposed portion by development.

<15> The pattern forming method according to <14>, further comprising:

a step of exposing the radiation-sensitive composition layer after removing the non-exposed portion by development.

<16> A solid image pickup element comprising:

the optical filter according to any one of <10> to <12>.

<17> An image display device comprising:

the optical filter according to any one of <10> to <12>.

<18> An infrared sensor comprising:

the optical filter according to any one of <10> to <12>.

According to the present invention, it is possible to provide a radiation-sensitive composition with which a pattern having excellent infrared shielding properties and excellent rectangularity can be formed. In addition, it is possible to provide an optical filter, a laminate, a pattern forming method, a solid image pickup element, an image display device, and an infrared sensor.

BRIEF DESCRIPTION OF THE DRAWINGS

FIG. 1 is a schematic diagram showing an embodiment of an infrared sensor.

DESCRIPTION OF THE PREFERRED EMBODIMENTS

Hereinafter, the details of the present invention will be described.

In this specification, numerical ranges represented by "to" include numerical values before and after "to" as lower limit values and upper limit values.

In this specification, unless specified as a substituted group or as an unsubstituted group, a group (atomic group) denotes not only a group (atomic group) having no substituent but also a group (atomic group) having a substituent. For example, "alkyl group" denotes not only an alkyl group having no substituent (unsubstituted alkyl group) but also an alkyl group having a substituent (substituted alkyl group).

In this specification, unless specified otherwise, "exposure" denotes not only exposure using light but also drawing using a corpuscular beam such as an electron beam or an ion beam. Examples of the light generally used for exposure include an actinic ray or radiation, for example, a bright light spectrum of a mercury lamp, a far ultraviolet ray represented by excimer laser, an extreme ultraviolet ray (EUV ray), an X-ray, or an electron beam.

In this specification, "(meth)acrylate" denotes acrylate and methacrylate, "(meth)acryl" denotes acryl and methacryl, and "(meth)acryloyl" denotes acryloyl and methacryloyl.

In this specification, a weight-average molecular weight and a number-average molecular weight are defined as values in terms of polystyrene measured by gel permeation chromatography (GPC).

Near infrared light denotes light (electromagnetic wave) having an absorption maximum in a wavelength range of 700 to 2500 nm.

In this specification, the term "step" denotes not only an individual step but also a step which is not clearly distinguishable from another step as long as an effect expected from the step can be achieved.

<Radiation-Sensitive Composition>

A radiation-sensitive composition according to the present invention (hereinafter, also referred to as "composition") includes:

a near infrared absorber;

a resin;

a radically polymerizable compound; and a photoradical polymerization initiator, in which the radiation-sensitive composition has an absorption maximum in a wavelength range of 700 to 1000 nm, a ratio absorbance Amax/absorbance A550 of an absorbance Amax at the absorption maximum to an absorbance A550 at a wavelength of 550 nm is 50 to 500, the resin includes a resin having an acid group, and a mass ratio radically polymerizable compound/resin having an acid group of the radically polymerizable compound to the resin having an acid group is 0.3 to 0.7.

By using the above-described radiation-sensitive composition, a pattern having excellent infrared shielding properties and excellent rectangularity can be formed. The radiation-sensitive composition according to the present invention includes a near infrared absorber, and the ratio absorbance Amax/absorbance A550 is 50 to 500. Therefore, a pattern having excellent infrared shielding properties can be formed. In addition, the radiation-sensitive composition according to the present invention includes the radically polymerizable compound and the resin having an acid group at a mass ratio of 0.3 to 0.7 (radically polymerizable compound/resin having an acid group). As a result, a pattern having excellent rectangularity can be formed. That is, in a case where a pattern is formed using the radiation-sensitive composition according to the present invention, when the radiation-sensitive composition according to the present invention is exposed through a mask, curing properties of the radiation-sensitive composition in a mask peripheral portion can be improved. In addition, the ratio radically polymerizable compound/resin having an acid group is 0.3 or higher. As a result, a lower side of the pattern (support side of the film) is not likely to be thinner than a designed value, and formation of an undercut (overhang shape) can be suppressed. In addition, the ratio radically polymerizable compound/resin having an acid group is 0.7 or lower. As a result, an upper side of the pattern (surface side of the film) is not likely to be thinner than a designed value, and formation of an overcut (forwardly tapered shape) can be suppressed. Therefore, a pattern having excellent rectangularity can be formed. Further, the radiation-sensitive composition according to the present invention includes the radically polymerizable compound and the resin having an acid group at a mass ratio of 0.3 to 0.7 (radically polymerizable compound/resin having an acid group). As a result, formation of a residue can also be suppressed during the pattern formation.

The radiation-sensitive composition has an absorption maximum in a wavelength range of 700 to 1000 nm, preferably in a wavelength range of 720 to 980 nm, and more preferably in a wavelength range of 740 to 960 nm. In addition, in the radiation-sensitive composition according to the present invention, the ratio absorbance Amax/absorbance A550 is 50 to 500, preferably 70 to 450, and more preferably 100 to 400. The conditions of the absorbance may be satisfied using any means. For example, by adjusting the kind and content of the near infrared absorber, the conditions of the absorbance can be suitably satisfied.

An absorbance $A\lambda$ at a wavelength $\lambda$ is defined by the following expression.

$$A\lambda = \log(T\lambda)$$

$A\lambda$ represents the absorbance at the wavelength $\lambda$, and $T\lambda$ represents a transmittance at the wavelength $\lambda$.

In the present invention, it is preferable that a value of the absorbance is a value in a film which is formed using the radiation-sensitive composition. The absorbance can be measured using a well-known spectrophotometer of the related art.

In one preferable aspect, the radiation-sensitive composition according to the present invention further includes a chain transfer agent. According to this aspect, the curing of the film surface can be accelerated during exposure of the radiation-sensitive composition. Therefore, for example, a decrease in film thickness during exposure can be suppressed, and a pattern having higher rectangularity can be easily formed.

In addition, in one preferable aspect, the radiation-sensitive composition according to the present invention further includes an ultraviolet absorber. According to this aspect, when the radiation-sensitive composition according to the present invention is exposed through a mask, curing properties of the radiation-sensitive composition in a mask peripheral portion can be improved. Therefore, a pattern having higher rectangularity can be easily formed.

In addition, in one preferable aspect, the radiation-sensitive composition according to the present invention includes an oxime compound and an α-aminoketone compound as the photoradical polymerization initiator. According to this aspect, radical generation caused by energy transfer is used in combination. As a result, an upper side of the pattern (surface side of the film) is not likely to be thinner than a designed value, formation of an overcut can be suppressed, and rectangularity can be improved.

Hereinafter, each of the components of the radiation-sensitive composition according to the present invention will be described.

<<Near Infrared Absorber>>

The radiation-sensitive composition according to the present invention (hereinafter, also referred to as "the composition according to the present invention") includes a near infrared absorber. In the present invention, the near infrared absorber refers to a material having an absorption in a near infrared range (preferably in a wavelength range of 700 to 1300 nm and more preferably in a wavelength range of 700 to 1000 mu).

It is preferable that the near infrared absorber includes a near infrared absorbing compound (hereinafter, referred to as "near infrared absorbing compound A") that has an absorption maximum in a wavelength range of 700 to 1000 nm and in which a ratio absorbance Amax/absorbance A550 of an absorbance Amax at the absorption maximum to an absorbance A550 at a wavelength of 550 nm is 50 to 500. In addition, in a case where a film having a thickness of 0.7 μm is formed using a composition including 26 mass % of the near infrared absorbing compound A with respect to the total solid content of the composition, it is preferable that the film satisfies spectral characteristics that the ratio absorbance Amax/absorbance A550 in the film is 50 to 500. The upper limit is more preferably 450 or lower and still more preferably 400 or lower. The lower limit is more preferably 70 or higher and still more preferably 100 or higher. According to this aspect, a pattern having excellent visible transparency and infrared shielding properties can be easily formed.

The near infrared absorbing compound A may be a pigment or a dye. It is preferable that the near infrared absorbing compound A is a pigment because a pattern having excellent rectangularity can be easily formed. In addition, the pigment may be an organic pigment or an inorganic pigment. From the viewpoint of spectral characteristics, it is preferable that the pigment is an organic pigment.

In the present invention, the pigment refers to a compound that is insoluble in a specific solvent. For example, the pigment has a solubility of preferably 0.1 mass % or lower and more preferably 0.01 mass % or lower in any solvent of propylene glycol monomethyl ether acetate, propylene glycol monomethyl ether, cyclohexanone, cyclopentanone, and diethylene glycol monobutyl ether acetate at 23° C.

The near infrared absorbing compound A is not particularly limited as long as it is a compound that has an absorption maximum in a wavelength range of 700 to 1000 nm and having ratio absorbance Amax/absorbance A550 of 50 to 500. Examples of the near infrared absorbing compound A include a pyrrolopyrrole compound, a cyanine compound, a squarylium compound, a phthalocyanine compound, a naphthalocyanine compound, a rylene compound, a merocyanine compound, a croconium compound, an oxonol compound, a diiminium compound, a dithiol compound, a triarylmethane compound, a pyrromethene compound, an azomethine compound, an anthraquinone compound, and a dibenzofuranone compound. Among these, a pyrrolopyrrole compound, a cyanine compound, a squarylium compound, a phthalocyanine compound, a naphthalocyanine compound, or a rylene compound is preferable, a pyrrolopyrrole compound, a cyanine compound, or a squarylium compound is more preferable, and a pyrrolopyrrole compound is still more preferable.

In addition, as the near infrared absorbing compound A, for example, IRA828, IRA842, IRA848, IRA850, IRA851, IRA866, IRA870, or IRA884 (manufactured by Exiton, Inc.); SDO-C33 (manufactured by Arimoto Chemical Co., Ltd.); EXCOLOR IR-14, EXCOLOR IR-10A, EXCOLOR TX-EX-801B, EXCOLOR TX-EX-805K, or EXCOLOR TX-EX-815K (manufactured by Nippon Shokubai Co., Ltd.); Shigenox NIA-8041, Shigenox NIA-8042, Shigenox NIA-814, Shigenox NIA-820, or Shigenox NIA-839 (manufactured by Hakkol Chemical Co., Ltd.); Epolight V-63, Epolight 3801, or Epolight3036 (manufactured by Epolin Inc.); PRO-JET 825LDI (manufactured by Fujifilm Corporation); NK-3027, NKX-113, NKX-1199, SMP-363, SMP-387, SMP-388, or SMP-389 (manufactured by Hayashibara Co., Ltd.); or YKR-3070 (manufactured by Mitsui Chemicals, Inc.) can also be used.

In the near infrared absorber, the content of the near infrared absorbing compound A is preferably 60 mass % or higher. The upper limit may be 100 mass % or lower, 90 mass % or lower, or 80 mass % or lower. The lower limit is preferably 70 mass % or higher, more preferably 80 mass % or higher, and still more preferably 90 mass % or higher.

In the near infrared absorber, the content of the pigment is preferably 80 mass % or higher, more preferably 90 mass % or higher, and still more preferably 95 mass % or higher. The upper limit may be 100 mass %.

In the composition according to the present invention, the content of the near infrared absorber is preferably 20 mass % or higher with respect to the total solid content of the composition according to the present invention. The upper limit is preferably 60 mass % or lower, and more preferably 50 mass % or lower. In the above-described range, a pattern having excellent infrared shielding properties and excellent rectangularity can be formed. In a case where the near infrared absorber consists of only the near infrared absorbing compound A, the content of the near infrared absorber corresponds to the content of the near infrared absorbing compound A. In addition, the near infrared absorber includes near infrared absorbing compound A and other near infrared absorbing compounds described below, the sum of the content of the near infrared absorbing compound A and the content of the other near infrared absorbing compounds corresponds to the content of the near infrared absorber.

In the composition according to the present invention, the content of the near infrared absorbing compound A is preferably 20 mass % or higher with respect to the total solid content of the composition according to the present invention. The upper limit is preferably 60 mass % or lower, and more preferably 50 mass % or lower. In the above-described range, a pattern having excellent infrared shielding properties and excellent rectangularity can be formed.

(Pyrrolopyrrole Compound)

In the present invention, it is preferable that the pyrrolopyrrole compound is a compound represented by the following Formula (I). It is preferable that the following compound is a compound having the above-described absorbance ratio.

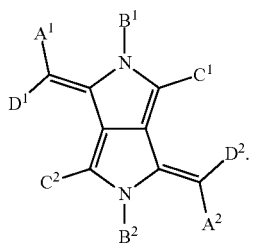
(I)

In Formula (I), $A^1$ and $A^2$ each independently represent a heteroaryl group.

$B^1$ and $B^2$ each independently represent a —$BR^1R^2$ group, $R^1$ and $R^2$ each independently represent a substituent, and $R^1$ and $R^2$ may be bonded to each other to form a ring.

$C^1$ and $C^2$ each independently represent an alkyl group, an aryl group, or a heteroaryl group.

$D^1$ and $D^2$ each independently represent a substituent.

In Formula (I), $A^1$ and $A^2$ each independently represent a heteroaryl group. $A^1$ and $A^2$ may represent the same group or different groups. It is preferable that $A^1$ and $A^2$ represent the same group.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the heteroaryl group is preferably 1 to 3. It is preferable that the heteroatoms constituting the heteroaryl group are a nitrogen atom, an oxygen atom, or a sulfur atom. The number of carbon atoms constituting the heteroaryl group is preferably 3 to 30, more preferably 3 to 18, still more preferably 3 to 12 and even still more preferably 3 to 10. It is preferable that the heteroaryl group is a 5-membered or 6-membered ring.

It is preferable that the heteroaryl group is a group represented by the following Formula (A-1) or a group represented by the following Formula (A-2).

(A-1)

(A-2)

In Formula (A-1), $X^1$'s each independently represent O, S, $NR^{X1}$, or $CR^{X2}R^{X3}$, $R^{X1}$ to $R^{X3}$ each independently represent a hydrogen atom or a substituent, $R^3$ and $R^4$ each independently represent a hydrogen atom or a substituent, and $R^3$ and $R^4$ may be bonded to each other to form a ring. * represents a binding site to Formula (I).

Preferable examples of the substituent represented by $R^3$, $R^4$, and $R^{X1}$ to $R^{X3}$ include an alkyl group, an alkenyl group, an aryl group, a heteroaryl group, an alkoxy group, an aryloxy group, a heteroaryloxy group, an acyl group, an alkoxycarbonyl group, an aryloxycarbonyl group, a heteroaryloxycarbonyl group, an acyloxy group, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxyl group, a nitro group, a hydroxamic acid group, a sulfino group, a hydrazino group, an imino group, a silyl group, a hydroxyl group, a halogen atom, and a cyano group. Among these, an alkyl group, an aryl group, or a halogen atom is preferable.

The number of carbon atoms in the alkyl group is preferably 1 to 20, more preferably 1 to 15, and still more preferably 1 to 8. The alkyl group may be linear, branched, or cyclic and is preferably linear or branched. The alkyl group may have a substituent or may be unsubstituted. Examples of the substituent include the above-described groups such as a halogen atom or an aryl group.

The number of carbon atoms in the aryl group is preferably 6 to 30, more preferably 6 to 20, and still more preferably 6 to 12. The aryl group may have a substituent or may be unsubstituted. Examples of the substituent include the above-described groups such as a halogen atom or an alkyl group.

Examples of the halogen atom include a fluorine atom, a chlorine atom, a bromine atom, and an iodine atom.

The ring which is formed by $R^3$ and $R^4$ being bonded to each other is preferably an aromatic ring. In a case where $R^3$ and $R^4$ are bonded to each other to form a ring, examples of the group represented by (A-1) include a group represented by the following (A-1-1) and a group represented by the following (A-1-2).

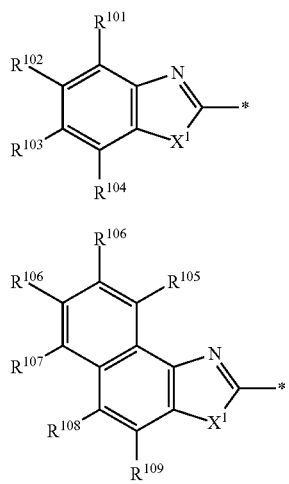

In the formula, $X^1$'s each independently represent O, S, $NR^{X1}$, or $CR^{X2}R^{X3}$, $R^{X1}$ to $R^{X3}$ each independently represent a hydrogen atom or a substituent, and $R^{101}$ to $R^{109}$ each independently represent a hydrogen atom or a substituent. * represents a binding site to Formula (I).

In Formula (A-2), $Y^1$ to $Y^4$ each independently represent N or $CR^{Y1}$, at least two of $Y^1$, $Y^2$, $Y^3$, or $Y^4$ represent $CR^{Y1}$, $R^{Y1}$ represents a hydrogen atom or a substituent, and adjacent $R^{Y1}$'s may be bonded to each other to form a ring. * represents a binding site to Formula (I).

Examples of the substituent represented by $R^{Y1}$ include the above-described substituents. Among these, an alkyl group, an aryl group, or a halogen atom is preferable. The number of carbon atoms in the alkyl group is preferably 1 to 20, more preferably 1 to 15, and still more preferably 1 to 8. The alkyl group may be linear, branched, or cyclic and is preferably linear or branched. The alkyl group may have a substituent or may be unsubstituted. Examples of the substituent include the above-described substituents such as a halogen atom or an aryl group.

The number of carbon atoms in the aryl group is preferably 6 to 30, more preferably 6 to 20, and still more preferably 6 to 12. The aryl group may have a substituent or may be unsubstituted. Examples of the substituent include the above-described substituents such as a halogen atom or an alkyl group.

Examples of the halogen atom include a fluorine atom, a chlorine atom, a bromine atom, and an iodine atom.

At least two of $Y^1$, $Y^2$, $Y^3$, or $Y^4$ represent $CR^{Y1}$, and adjacent $R^{Y1}$'s may be bonded to each other to form a ring.

The ring which is formed by adjacent $R^{Y1}$'s being bonded to each other is preferably an aromatic ring. In a case where adjacent $R^{Y1}$'s are bonded to each other to form a ring, for example, examples of the group represented by (A-2) include groups represented by the following (A-2-1) to (A-2-5).

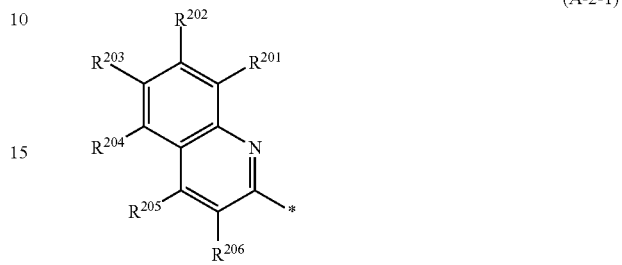

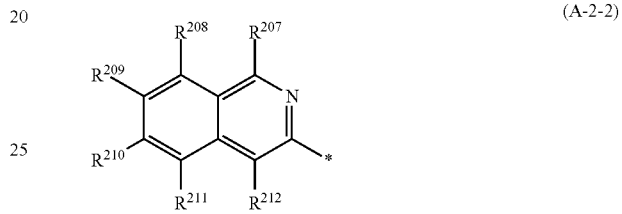

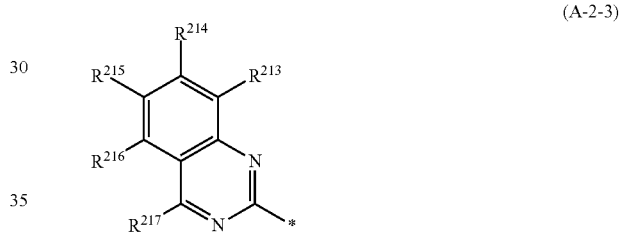

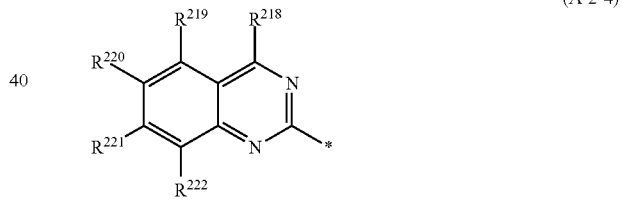

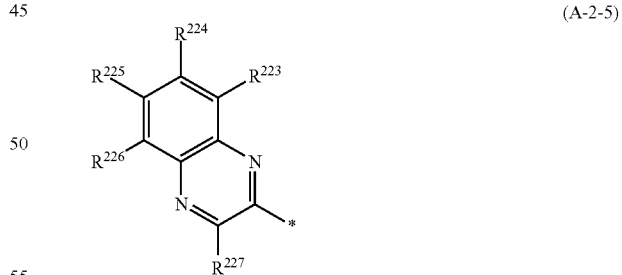

In the formula, $R^{201}$ to $R^{227}$ each independently represent a hydrogen atom or a substituent, and * represents a binding site to Formula (I).

Specific examples of $A^1$ and $A^2$ are as follows. In the following description, Bu represents a butyl group. * represents a binding site to Formula (I).

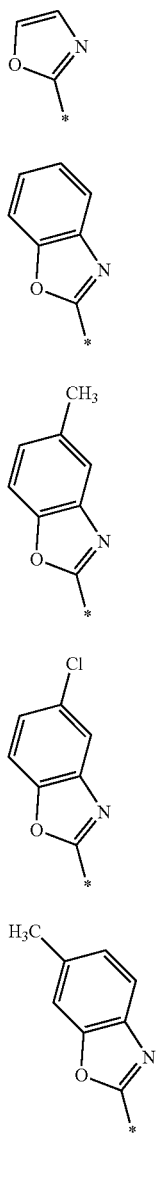
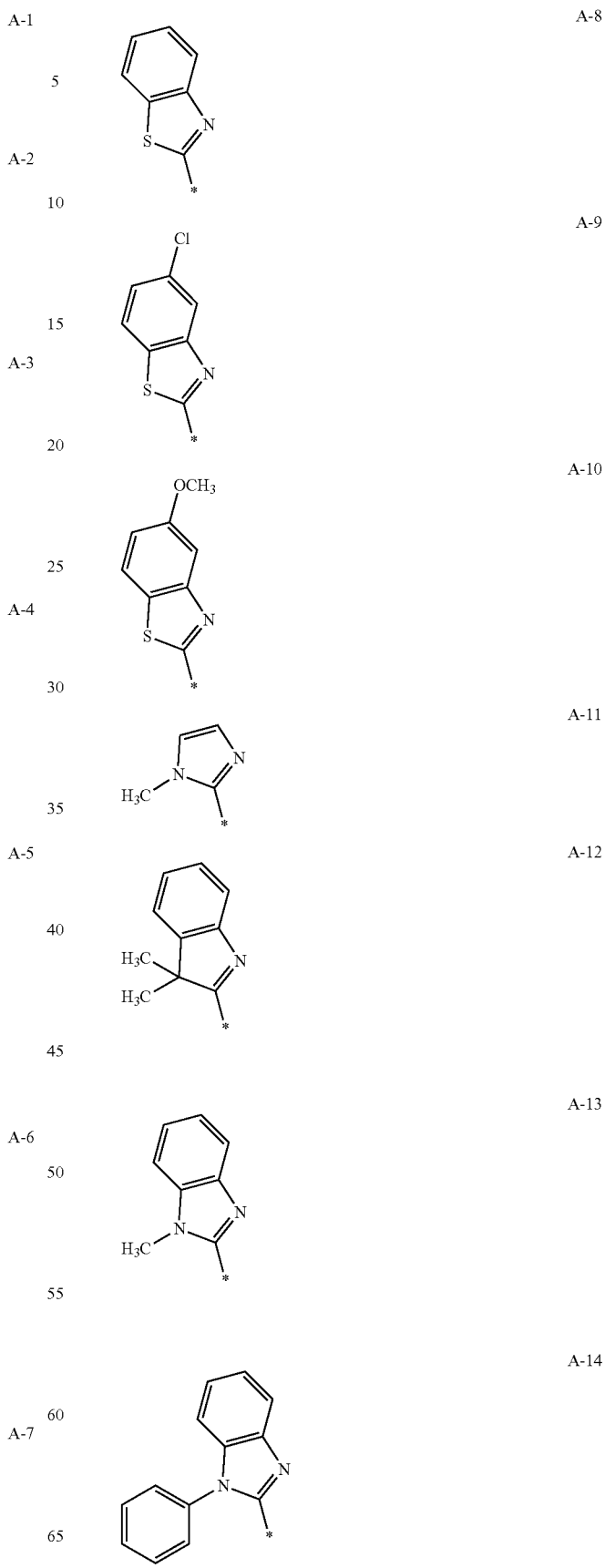

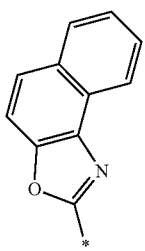
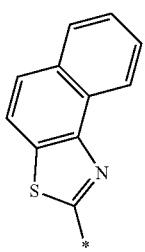
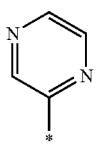
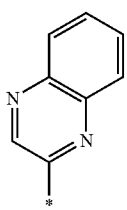
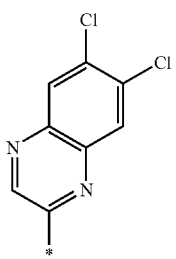
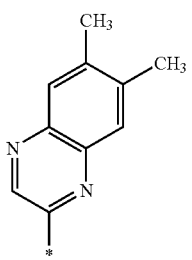
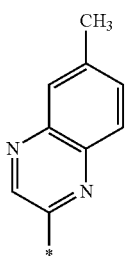
A-15
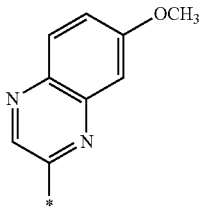
A-16
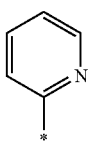
A-17
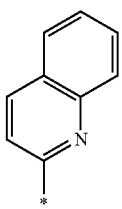
A-18
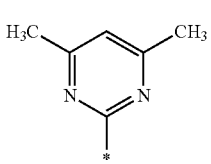
A-19
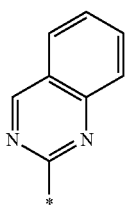
A-20
A-21
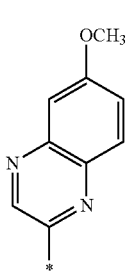

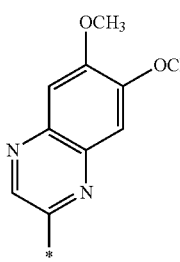

A-29

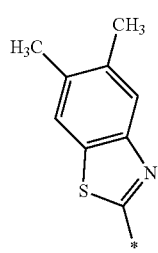

A-30

A-31

A-32

A-33

A-34

In Formula (I), $B^1$ and $B^2$ each independently represent a —$BR^1R^2$ group, and $R^1$ and $R^2$ each independently represent a substituent. $R^1$ and $R^2$ may be bonded to each other to form a ring. Examples of the substituent include the groups described regarding $A^1$ and $A^2$. Among these, a halogen atom, an alkyl group, an alkenyl group, an alkoxy group, an aryl group, or a heteroaryl group is preferable, a halogen atom, an aryl group, or a heteroaryl group is more preferable, and an aryl group or a heteroaryl group is still more preferable. $R^1$ and $R^2$ may represent the same group or different groups. It is preferable that $R^1$ and $R^2$ represent the same group. In addition, $B^1$ and $B^2$ may represent the same group or different groups. It is preferable that $B^1$ and $B^2$ represent the same group.

As the halogen atom, a fluorine atom, a chlorine atom, a chlorine atom, a bromine atom, or an iodine atom is preferable, and a fluorine atom is more preferable.

The number of carbon atoms in the alkyl group is preferably 1 to 40. For example, the lower limit is more preferably 3 or more. For example, the upper limit is more preferably 30 or less and still more preferably 25 or less. The alkyl group may be linear, branched, or cyclic and is preferably linear or branched.

The number of carbon atoms in the alkenyl group is preferably 2 to 40. For example, the lower limit is more preferably 3 or more, still more preferably 5 or more, even still more preferably 8 or more, and even yet still more preferably 10 or more. The upper limit is more preferably 35 or less and still more preferably 30 or less. The alkenyl group may be linear, branched, or cyclic.

The number of carbon atoms in the alkoxy group is preferably 1 to 40. For example, the lower limit is more preferably 3 or more. For example, the upper limit is more preferably 30 or less and still more preferably 25 or less. The alkoxy group may be linear, branched, or cyclic.

The number of carbon atoms in the aryl group is preferably 6 to 20 and more preferably 6 to 12. The aryl group may have a substituent or may be unsubstituted. Examples of the substituent include an alkyl group, an alkoxy group, and a halogen atom. The details of the groups are as described above.

The heteroaryl group may be monocyclic or polycyclic. The number of heteroatoms constituting the heteroaryl group is preferably 1 to 3. It is preferable that the heteroatoms constituting the heteroaryl group are a nitrogen atom, an oxygen atom, or a sulfur atom. The number of carbon atoms constituting the heteroaryl group is preferably 3 to 30, more preferably 3 to 18, still more preferably 3 to 12 and even still more preferably 3 to 5. It is preferable that the heteroaryl group is a 5-membered or 6-membered ring. The heteroaryl group may have a substituent or may be unsubstituted. Examples of the substituent include an alkyl group, an alkoxy group, and a halogen atom: The details of the groups are as described above.

$R^1$ and $R^2$ of the —$BR^1R^2$ group may be bonded to each other to form a ring. Examples of the ring include structures represented by the following (B-1) to (B-4). In the following formulae, R represents a substituent, $R^{a1}$ to $R^{a4}$ each independently represent a hydrogen atom or a substituent, m1 to m3 each independently represent an integer of 0 to 4, and * represents a binding site to Formula (I). Examples of the substituent represented by R and $R^{a1}$ to $R^{a4}$ include the substituents described above regarding $R^1$ and $R^2$. Among these, a halogen atom or an alkyl group is preferable.

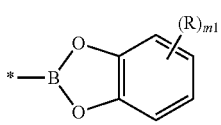

(B-1)

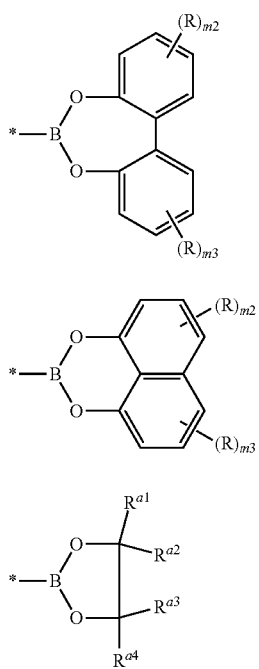
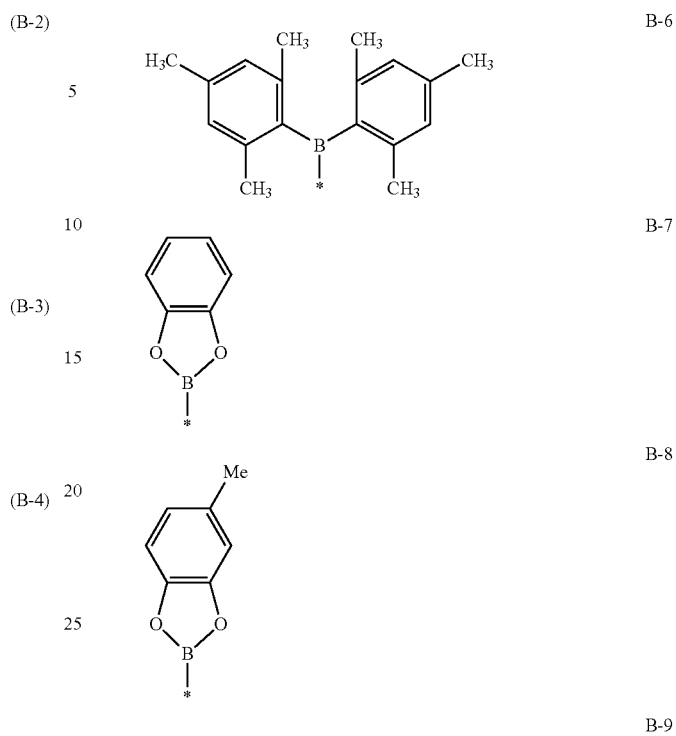
Specific examples of $B^1$ and $B^2$ are as follows. In the following formulae, Me represents a methyl group, and Bu represents a butyl group. * represents a binding site to Formula (I).
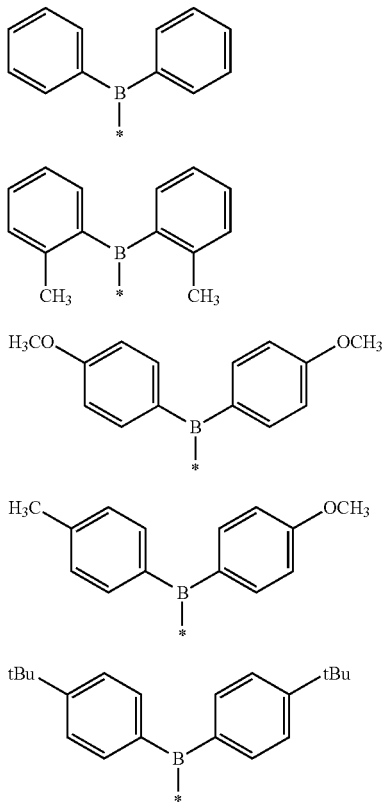
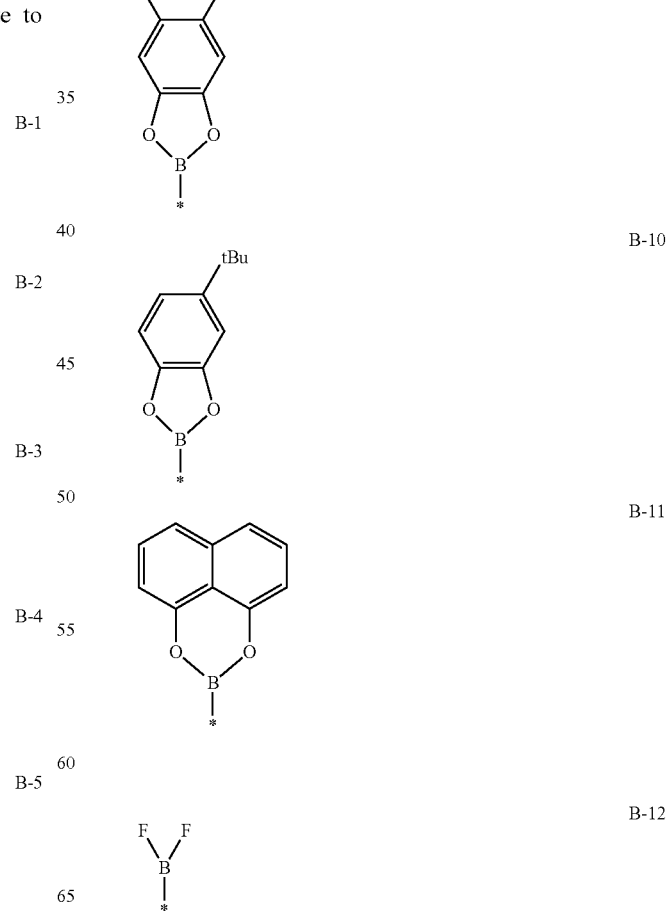

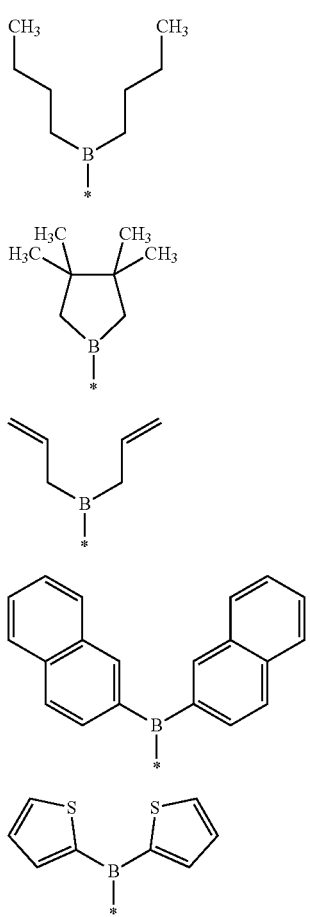

In Formula (I), $C^1$ and $C^2$ each independently represent an alkyl group, an aryl group, or a heteroaryl group. $C^1$ and $C^2$ may represent the same group or different groups. It is preferable that $C^1$ and $C^2$ represent the same group. $C^1$ and $C^2$ each independently represent preferably an aryl group or a heteroaryl group, and more preferably an aryl group.

The number of carbon atoms in the alkyl group is preferably 1 to 40, more preferably 1 to 30, and still more preferably 1 to 25. The alkyl group may be linear, branched, or cyclic and is preferably linear or branched and more preferably branched.

As the aryl group, an aryl group having 6 to 20 carbon atoms is preferable, and an aryl group having 6 to 12 carbon atoms is more preferable. A phenyl group or a naphthyl group is still more preferable.

The heteroaryl group may be monocyclic or polycyclic. The number of heteroatoms constituting the heteroaryl group is preferably 1 to 3. It is preferable that the heteroatoms constituting the heteroaryl group are a nitrogen atom, an oxygen atom, or a sulfur atom. The number of carbon atoms constituting the heteroaryl group is preferably 3 to 30, more preferably 3 to 18, and still more preferably 3 to 12.

The alkyl group, the aryl group, and the heteroaryl group may have a substituent or may be unsubstituted. It is preferable that the groups have a substituent.

Examples of the substituent include a hydrocarbon group which may have an oxygen atom, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxyl group, a nitro group, a hydroxamic acid group, a sulfino group, a hydrazino group, an imino group, a silyl group, a hydroxyl group, a halogen atom, and a cyano group.

Examples of the halogen atom include a fluorine atom, a chlorine atom, a bromine atom, and an iodine atom.

Examples of the hydrocarbon group include an alkyl group, an alkenyl group, and an aryl group.

The number of carbon atoms in the alkyl group is preferably 1 to 40. The lower limit is more preferably 3 or more, still more preferably 5 or more, even still more preferably 8 or more, and even yet still more preferably 10 or more. The upper limit is more preferably 35 or less and still more preferably 30 or less. The alkyl group may be linear, branched, or cyclic and is preferably linear or branched and more preferably branched. The number of carbon atoms in the branched alkyl group is preferably 3 to 40. The lower limit is, for example, preferably 5 or more, more preferably 8 or more, and still more preferably 10 or more. The upper limit is more preferably 35 or less and still more preferably 30 or less. For example, the number of branches in the branched alkyl group is preferably 2 to 10 and more preferably 2 to 8.

The number of carbon atoms in the alkenyl group is preferably 2 to 40. For example, the lower limit is more preferably 3 or more, still more preferably 5 or more, even still more preferably 8 or more, and even yet still more preferably 10 or more. The upper limit is more preferably 35 or less and still more preferably 30 or less. The alkenyl group may be linear, branched, or cyclic and is preferably linear or branched and more preferably branched. The number of carbon atoms in the branched alkenyl group is preferably 3 to 40. The lower limit is, for example, preferably 5 or more, more preferably 8 or more, and still more preferably 10 or more. The upper limit is more preferably 35 or less and still more preferably 30 or less. The number of branches in the branched alkenyl group is preferably 2 to 10 and more preferably 2 to 8.

The number of carbon atoms in the aryl group is preferably 6 to 30, more preferably 6 to 20, and still more preferably 6 to 12.

Examples of the hydrocarbon group having an oxygen atom include a group represented by $-L-R^{x1}$.

L represents $-O-$, $-CO-$, $-COO-$, $-OCO-$, $-(OR^{x2})_m-$, or $-(R^{x2}O)_m-$. $R^{x1}$ represents an alkyl group, an alkenyl group, or an aryl group. $R^{x2}$ represents an alkylene group or an arylene group. m represents an integer of 2 or more, and an m number of $R^{x2}$'s may be the same as or different from each other.

L represents preferably $-O-$, $-(OR^{x2})_m-$, or $-(R^{x2}O)_m-$, and more preferably $-O-$.

The alkyl group, the alkenyl group, and the aryl group represented by $R^{x1}$ have the same definitions and the same preferable ranges as described above. $R^{x1}$ represents preferably an alkyl group or an alkenyl group and more preferably an alkyl group.

The number of carbon atoms in the alkylene group represented by $R^{x2}$ is preferably 1 to 20, more preferably 1 to 10, and still more preferably 1 to 5. The alkylene group may be linear, branched, or cyclic and is preferably linear or branched. The number of carbon atoms in the arylene group represented by $R^{x2}$ is preferably 6 to 20 and more preferably 6 to 12. $R^{x2}$ represents preferably an alkylene group.

m represents an integer of 2 or more, preferably 2 to 20, and more preferably 2 to 10.

The substituent which may be included in the alkyl group, the aryl group, and the heteroaryl group is preferably a group having a branched alkyl structure. In addition, as the substituent, a hydrocarbon group which may have an oxygen atom is preferable, and a hydrocarbon group having an oxygen atom is more preferable. The hydrocarbon group having an oxygen atom is preferably a group represented by —O—$R^{x1}$. $R^{x1}$ represents preferably an alkyl group or an alkenyl group, more preferably an alkyl group, and still more preferably a branched alkyl group. That is, the substituent is more preferably an alkoxy group and still more preferably a branched alkoxy group. In a case where the substituent is an alkoxy group, a film having excellent heat resistance and light fastness can be easily obtained. The number of carbon atoms in the alkoxy group is preferably 1 to 40. For example, the lower limit is more preferably 3 or more, still more preferably 5 or more, even still more preferably 8 or more, and even yet still more preferably 10 or more. The upper limit is more preferably 35 or less and still more preferably 30 or less. The alkoxy group may be linear, branched, or cyclic and is preferably linear or branched and more preferably branched. The number of carbon atoms in the branched alkoxy group is preferably 3 to 40. The lower limit is, for example, preferably 5 or more, more preferably 8 or more, and still more preferably 10 or more. The upper limit is more preferably 35 or less and still more preferably 30 or less. The number of branches in the branched alkoxy group is preferably 2 to 10 and more preferably 2 to 8.

Specific examples of $C^1$ and $C^2$ are as follows. In the following formulae, Me represents a methyl group, and Bu represents a butyl group. * represents a binding site to Formula (I). In addition, the following optical isomers can also be preferably used.

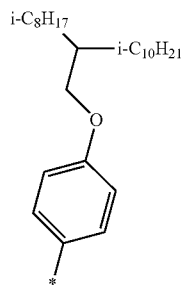

C-1

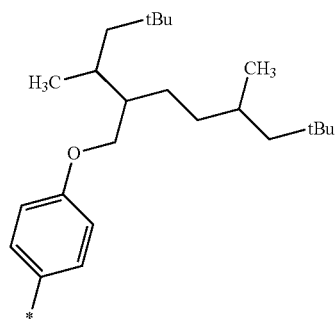

C-2

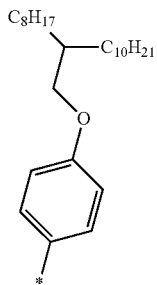

C-3

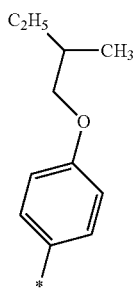

C-4

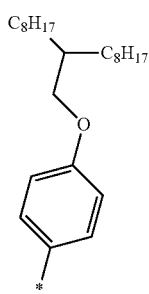

C-5

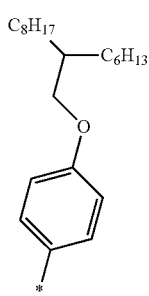

C-6

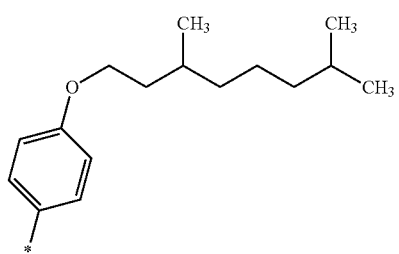

C-7

-continued

C-8

C-9

C-10

C-11

C-12

C-13

C-14

C-15

C-16

C-17

C-18

C-19

C-20

C-21

-continued

C-22
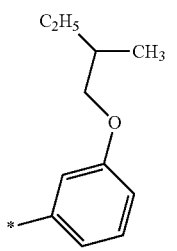

C-23
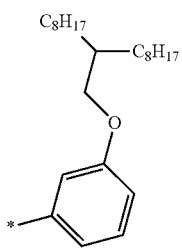

C-24
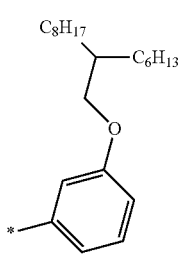

C-25
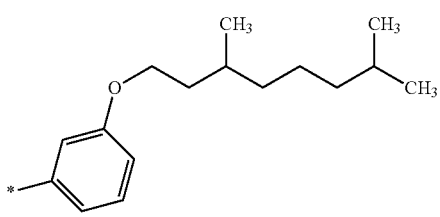

C-26
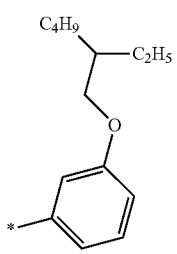

C-27
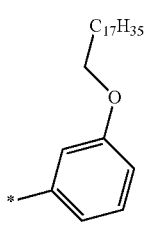

-continued

C-28
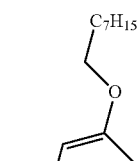

C-29
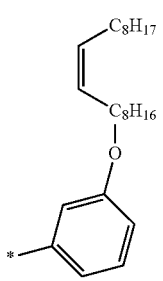

C-30
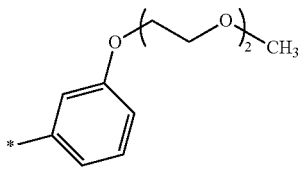

C-31
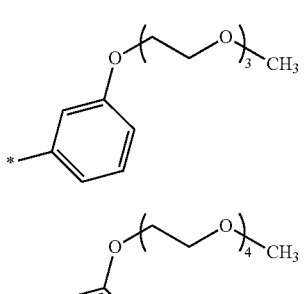

C-32

C-33
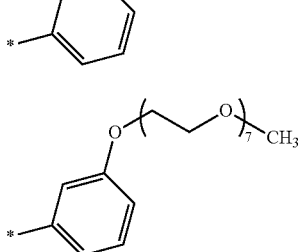

C-34
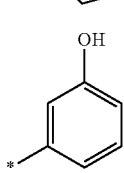

In Formula (I), $D^1$ and $D^2$ each independently represent a substituent. $D^1$ and $D^2$ may represent the same group or different groups. It is preferable that $D^1$ and $D^2$ represent the same group.

Examples of the substituent include an alkyl group, an alkenyl group, an aryl group, a heteroaryl group, an alkoxy group, an aryloxy group, a heteroaryloxy group, an acyl group, an alkoxycarbonyl group, an aryloxycarbonyl group, a heteroaryloxycarbonyl group, an acyloxy group, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxyl group, a nitro group, a hydroxamic acid group, a sulfino group, a hydrazino group, an imino group, a silyl group, a hydroxyl group, a halogen atom, and a cyano group. It is preferable that $D^1$ and $D^2$ represent an electron-withdrawing group.

A substituent having a positive Hammett substituent constant sigma para value ($\sigma_p$ value) functions as an electron-withdrawing group. In the present invention, a substituent having a Hammett $\sigma_p$ value of 0.2 or higher can be used as an example of the electron-withdrawing group. The $\sigma_p$ value is preferably 0.25 or higher, more preferably 0.3 or higher, and still more preferably 0.35 or higher. The upper limit is not particularly limited and is preferably 0.80 or lower. Specific examples of the electron-withdrawing group include a cyano group (0.66), a carboxyl group (—COOH: 0.45), an alkoxycarbonyl group (for example, —COOMe: 0.45), an aryloxycarbonyl group (for example, —COOPh: 0.44), a carbamoyl group (for example, —CONH$_2$: 0.36), an alkylcarbonyl group (for example, —COMe: 0.50), an arylcarbonyl group (for example, —COPh: 0.43), an alkylsulfonyl group (for example, —SO$_2$Me: 0.72), and an arylsulfonyl group (for example, —SO$_2$Ph: 0.68). As the electron-withdrawing group, a cyano group, an alkylcarbonyl group, an alkylsulfonyl group, or an arylsulfonyl group is preferable, and a cyano group is more preferable. Here, Me represents a methyl group, Ph represents a phenyl group, and numerical values in parentheses represent $\sigma_p$ values. The details of the Hammett $\sigma_p$ value can be found in paragraphs "0024" and "0025" of JP2009-263614A, the content of which is incorporated herein by reference.

Specific examples of $D^1$ and $D^2$ are as follows. * represents a binding site to Formula (I).

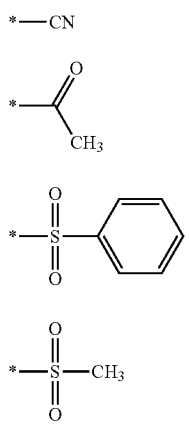

It is preferable that the pyrrolopyrrole compound is a compound represented by the following Formula (II) or a compound represented by the following Formula (III). According to this aspect, a pattern having excellent infrared shielding properties and light fastness can be easily formed.

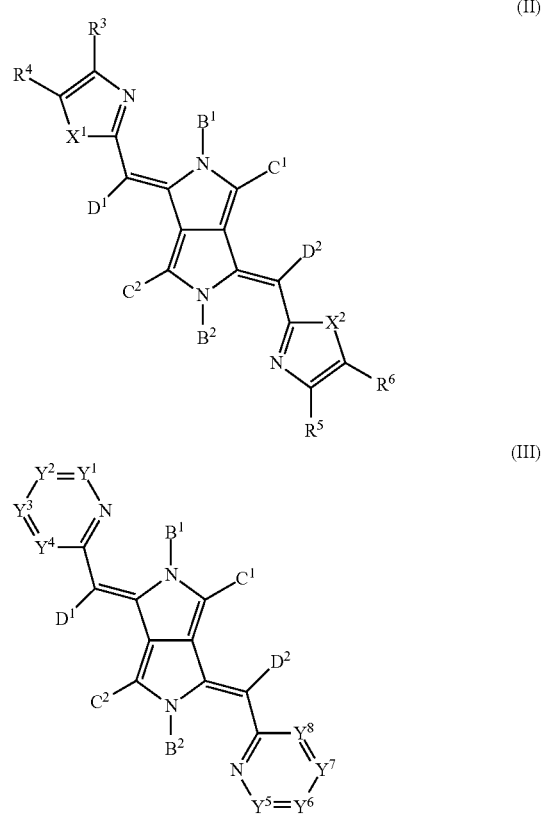

In Formula (II), $X^1$ and $X^2$ each independently represent O, S, NR$^{X1}$, or CR$^{X2}$R$^{X3}$, and R$^{X1}$ to R$^{X3}$ each independently represent a hydrogen atom or a substituent.

$R^3$ to $R^6$ each independently represent a hydrogen atom or a substituent.

$R^3$ and $R^4$, or $R^5$ and $R^6$ may be bonded each other to form a ring.

$B^1$ and $B^2$ each independently represent a —BR$^1$R$^2$ group, $R^1$ and $R^2$ each independently represent a substituent, and $R^1$ and $R^2$ may be bonded to each other to form a ring.

$C^1$ and $C^2$ each independently represent an alkyl group, an aryl group, or a heteroaryl group.

$D^1$ and $D^2$ each independently represent a substituent.

$B^1$, $B^2$, $C^1$, $C^2$, $D^1$, and $D^2$ in Formula (II) have the same definitions and the preferable ranges as $B^1$, $B^2$, $C^1$, $C^2$, $D^1$, and $D^2$ in Formula (I). $X^1$, $X^2$, and $R^3$ to $R^6$ in Formula (II) have the same definitions and the same preferable ranges as $X^1$, $R^3$, and $R^4$ in Formula (A-1).

In Formula (III), $Y^1$ to $Y^8$ each independently represent N or CR$^{Y1}$, at least two of $Y^1$, $Y^2$, $Y^3$, or $Y^4$ represent CR$^{Y1}$, at least two of $Y^5$, $Y^6$, $Y^7$, or $Y^8$ represent CR$^{Y1}$, R$^{Y1}$ represents a hydrogen atom or a substituent, and adjacent R$^{Y1}$'s may be bonded to each other to form a ring.

$B^1$ and $B^2$ each independently represent a —BR$^1$R$^2$ group, $R^1$ and $R^2$ each independently represent a substituent, and $R^1$ and $R^2$ may be bonded to each other to form a ring.

$C^1$ and $C^2$ each independently represent an alkyl group, an aryl group, or a heteroaryl group.

$D^1$ and $D^2$ each independently represent a substituent.

$B^1$, $B^2$, $C^1$, $C^2$, $D^1$, and $D^2$ in Formula (III) have the same definitions and the preferable ranges as $B^1$, $B^2$, $C^1$, $C^2$, $D^1$, and $D^2$ in Formula (I). $Y^1$ to $Y^8$ in Formula (III) have the same definitions and the same preferable ranges as $Y^1$ to $Y^4$ in Formula (A-2).

Specific examples of the pyrrolopyrrole compound include the following compounds. In the following structural formulae, Ph represents a phenyl group, Me represents a methyl group, and Bu represents a butyl group. In addition, specific examples of the pyrrolopyrrole compound include a compound described in paragraphs "0049" to "0058" of JP2009-263614A, the content of which is incorporated herein by reference.

II-9

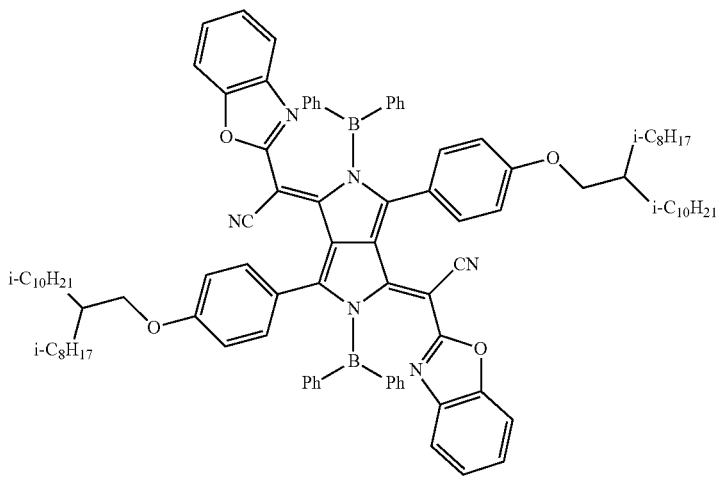

II-10

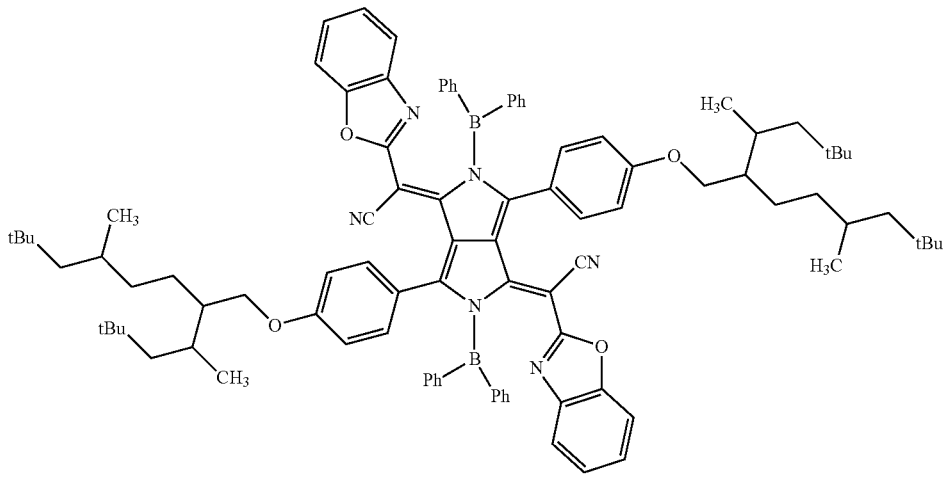

II-27

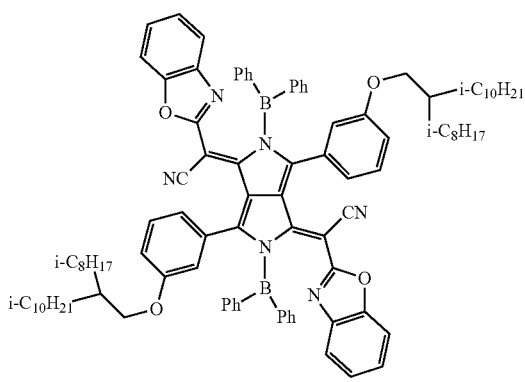

II-43

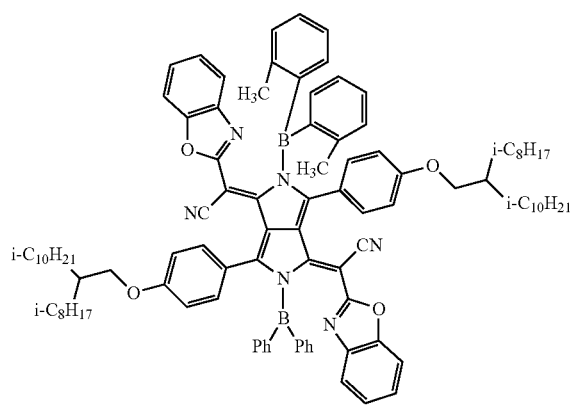

II-44
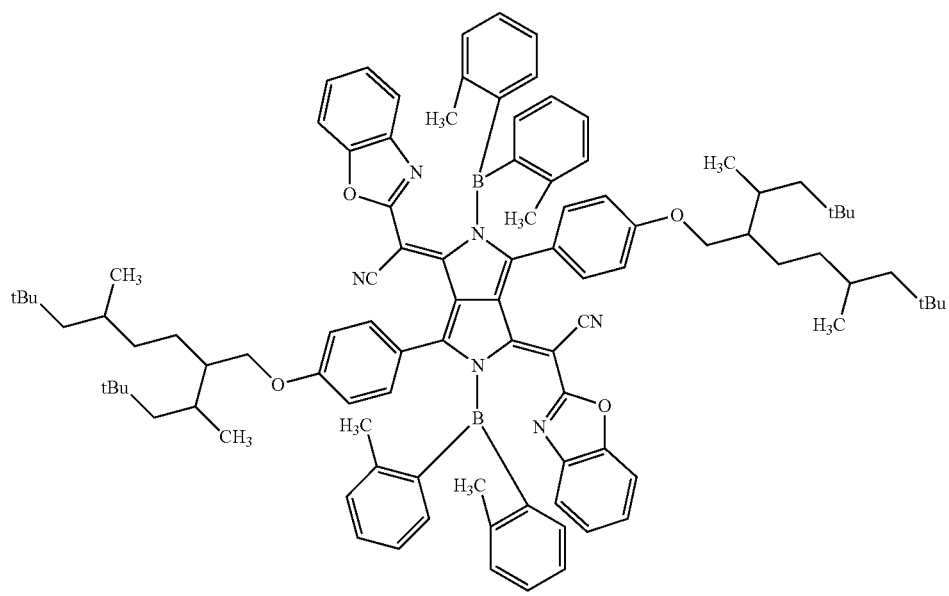
II-91
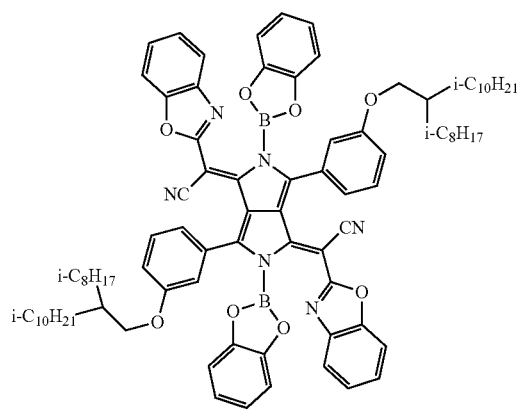
II-167
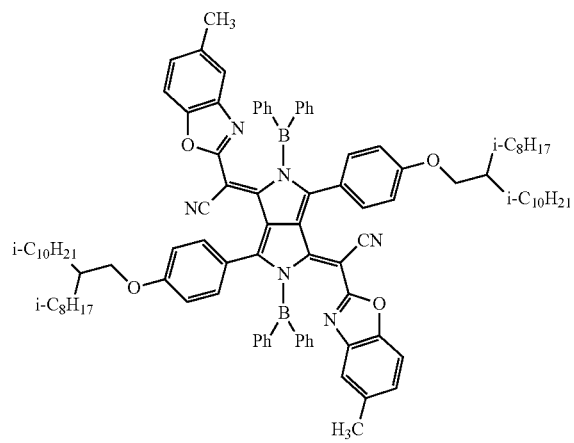
II-168
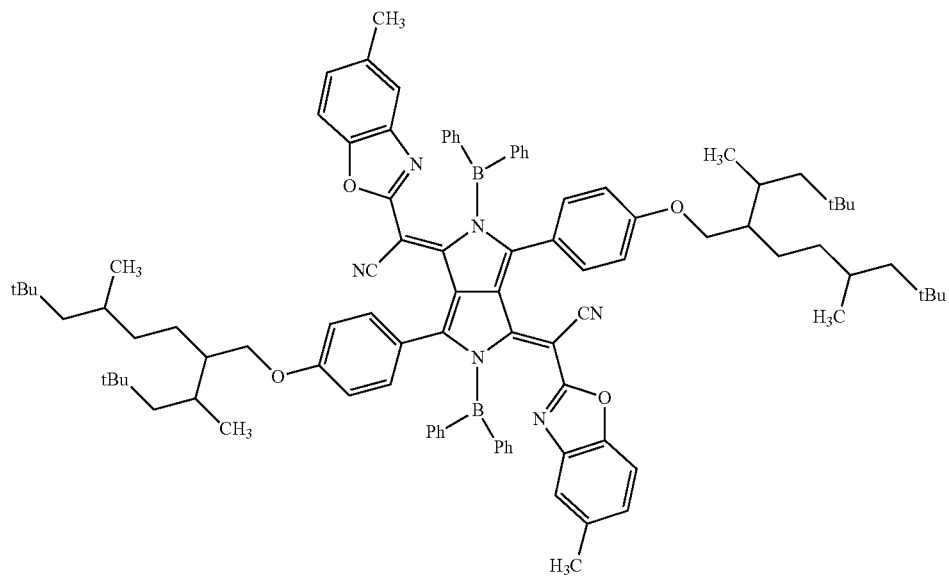

II-184
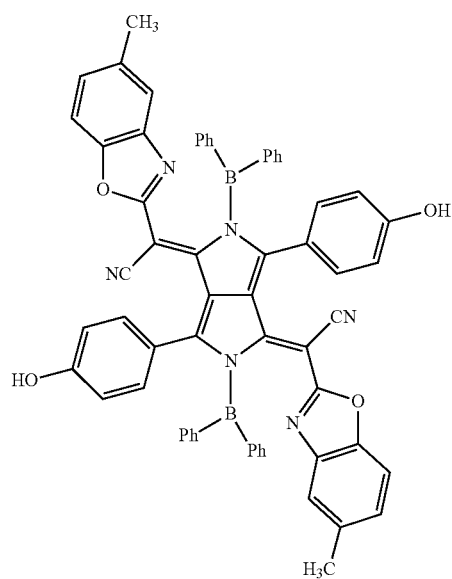
II-185
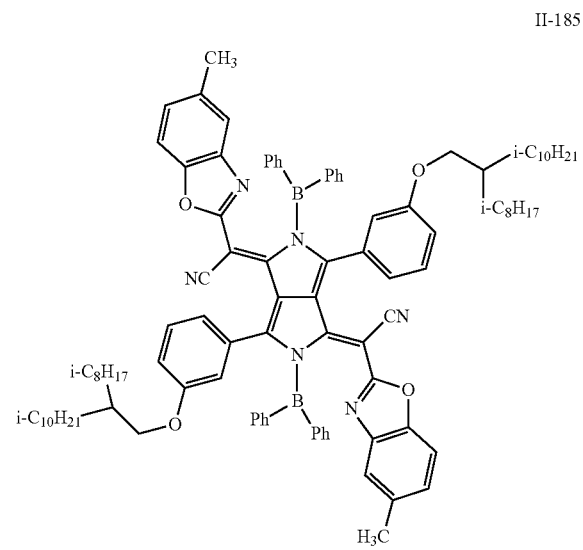
II-186
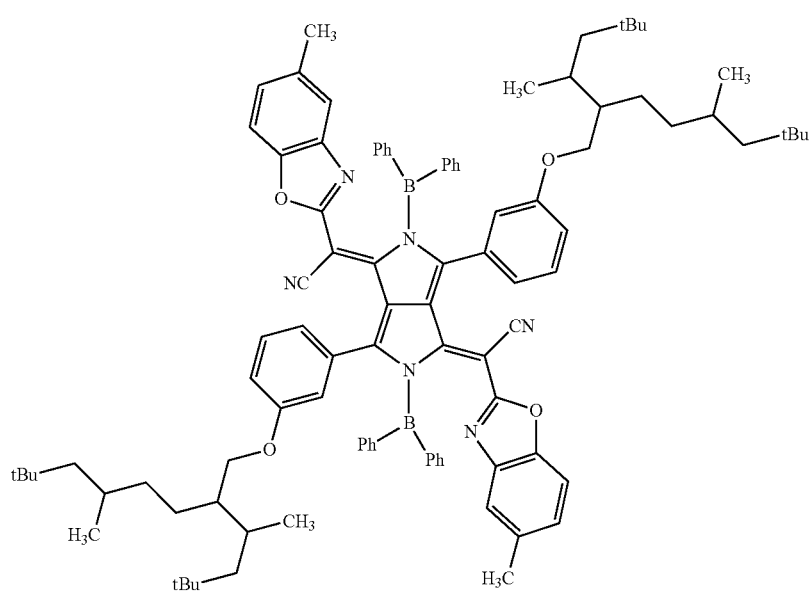

-continued
II-201
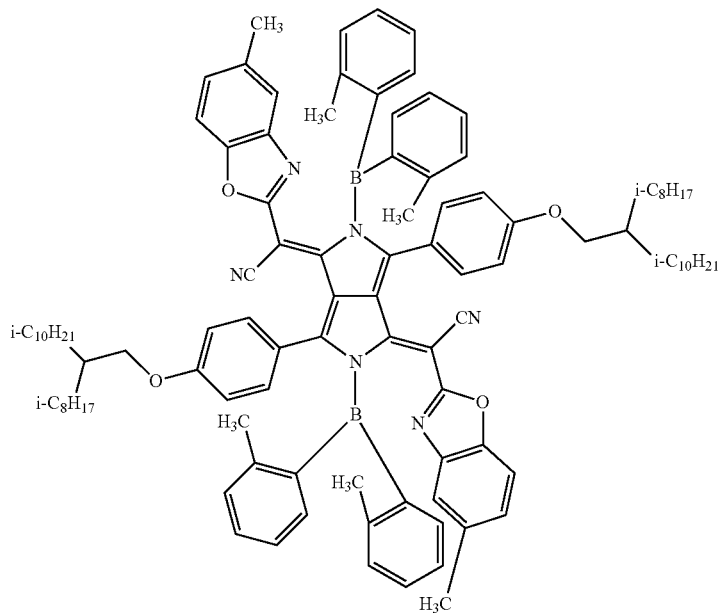
II-202
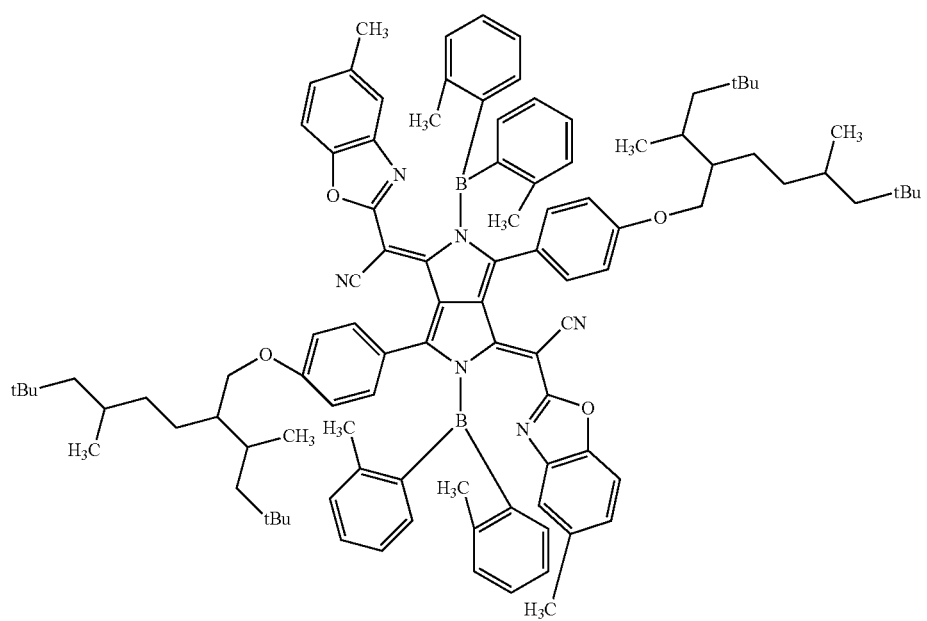

-continued
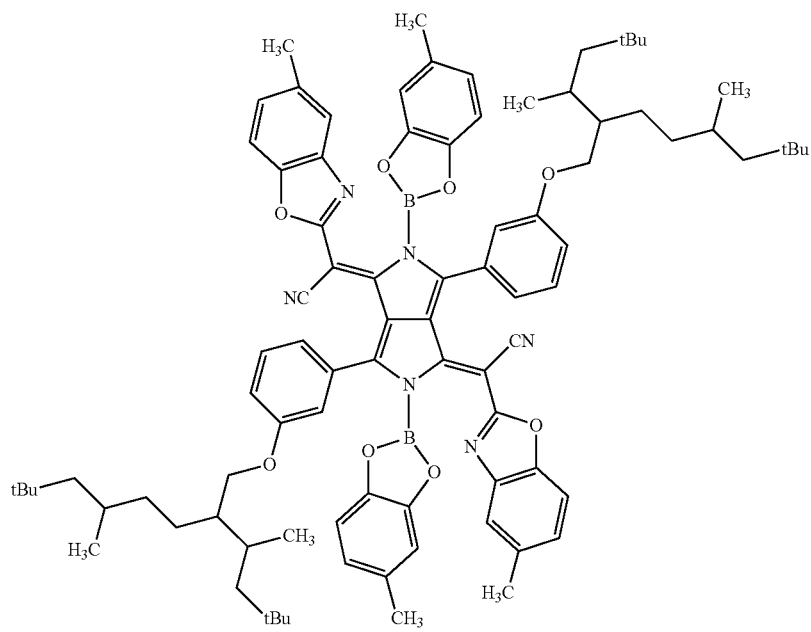
II-269
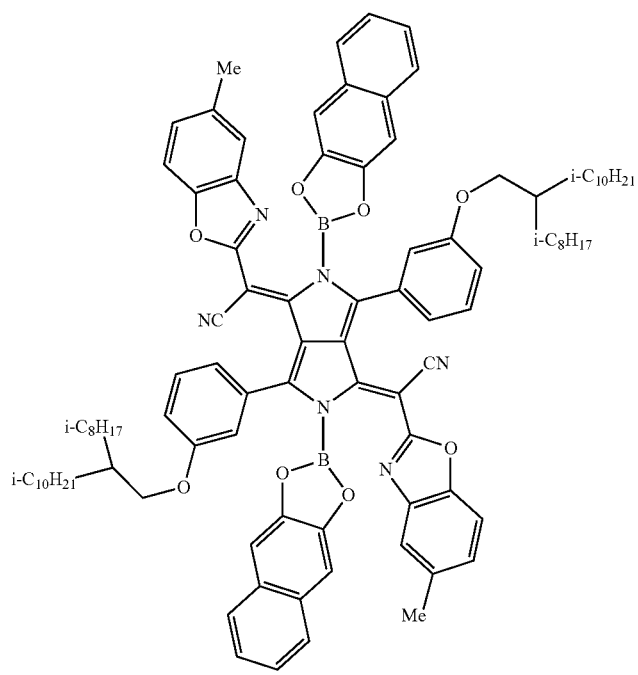
II-274

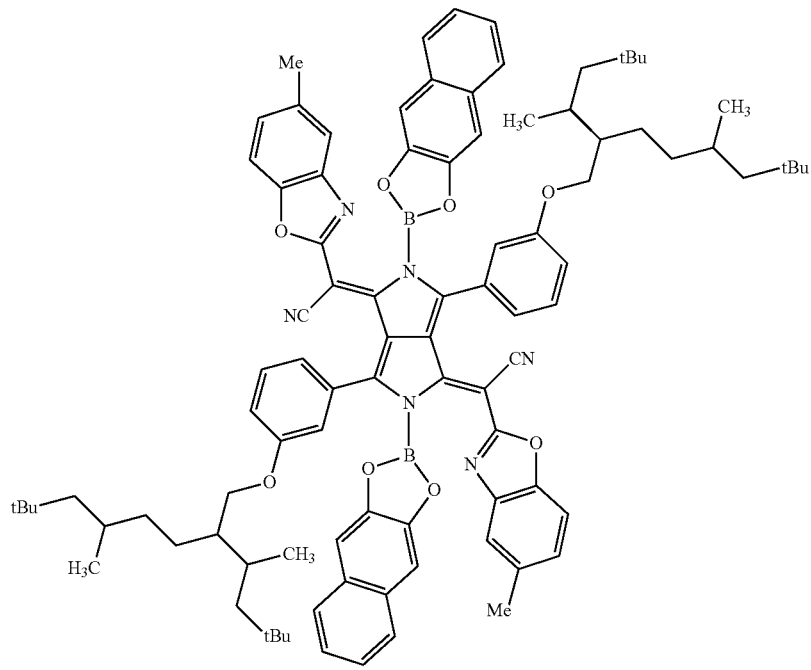
II-275
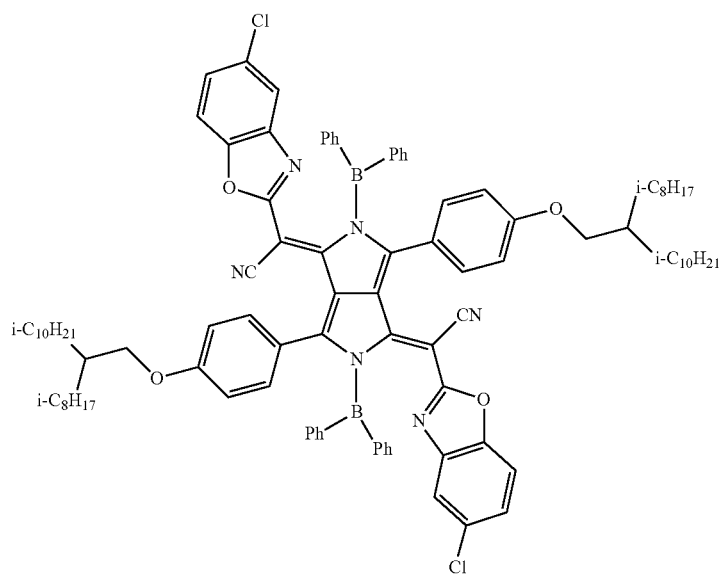
II-325

II-408
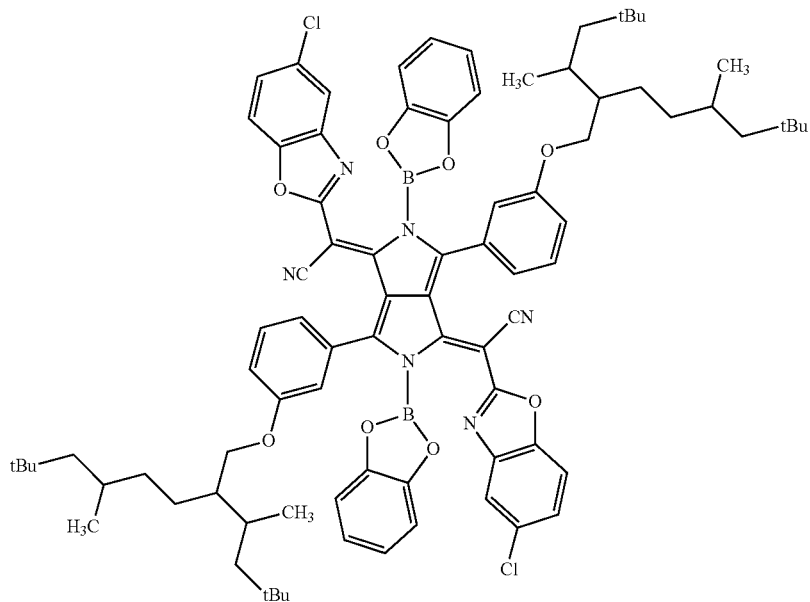
II-507
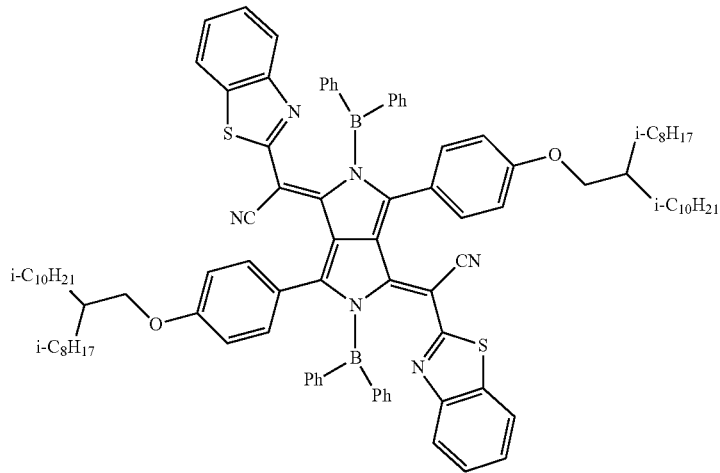
II-508
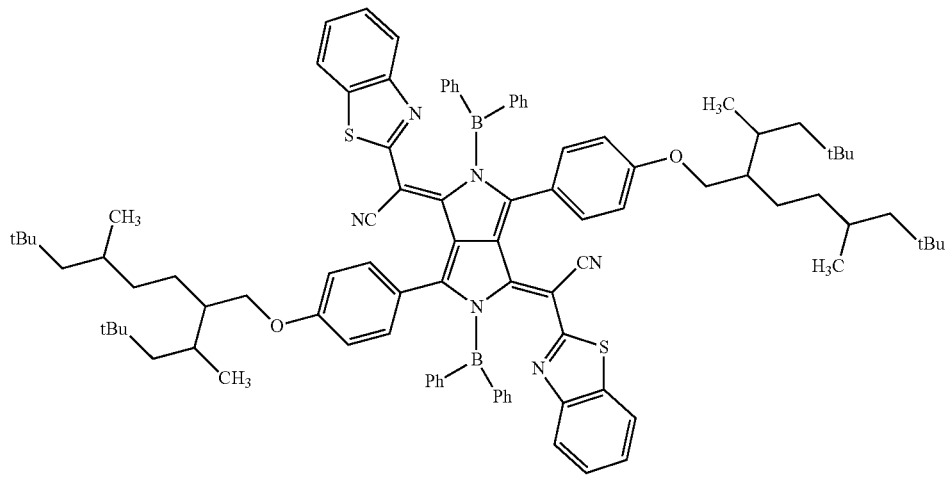

-continued
II-524
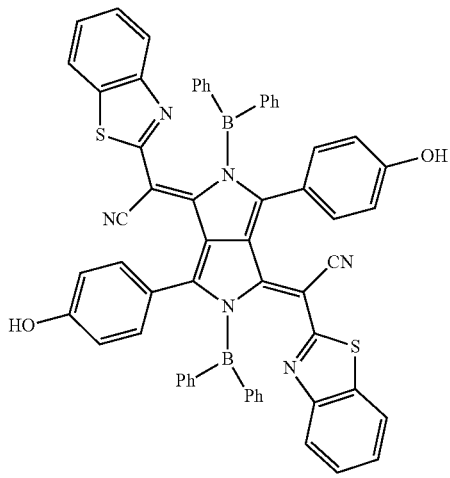
II-525
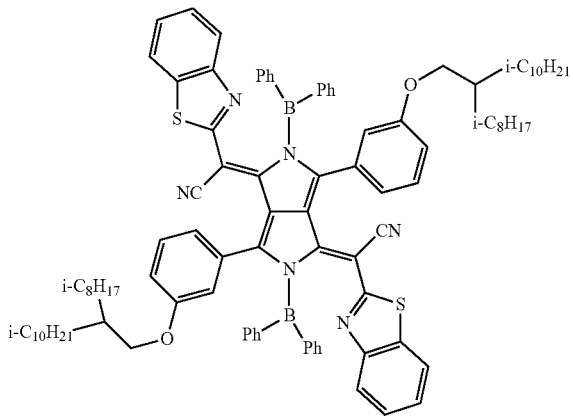
II-541
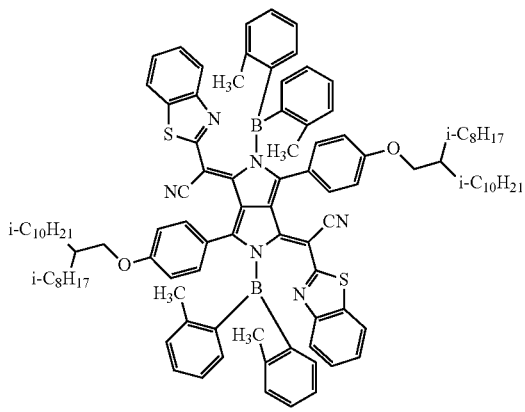
II-589
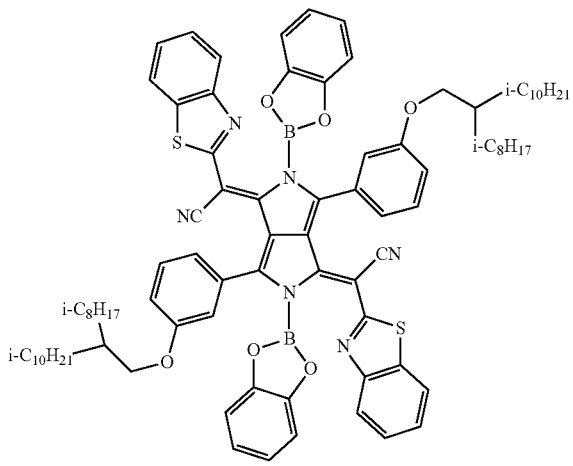
II-590
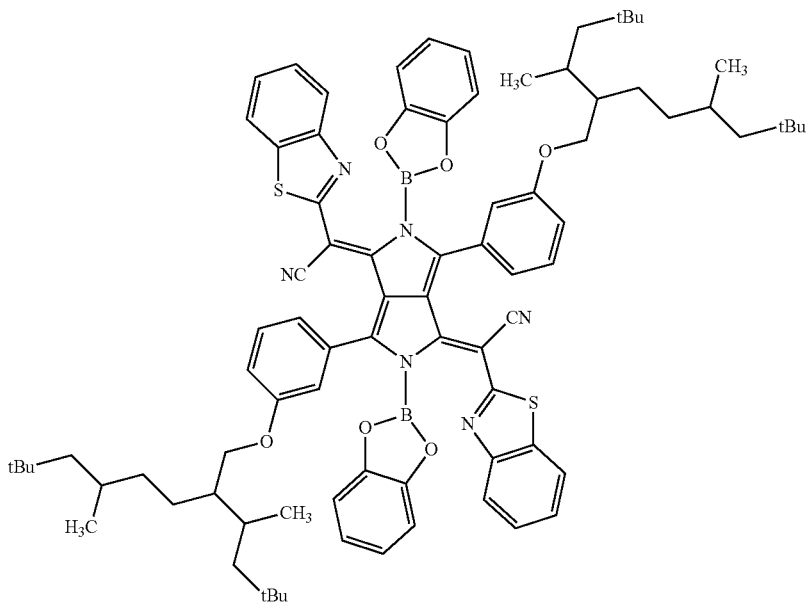

-continued
II-673
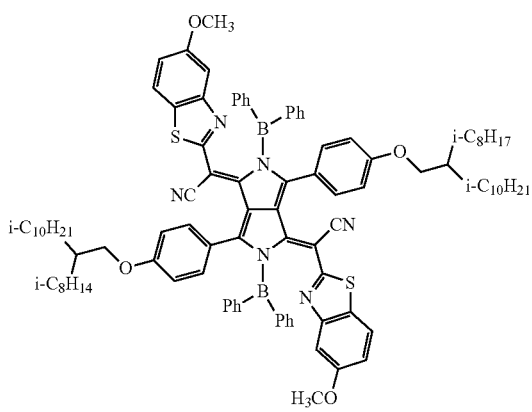
II-697
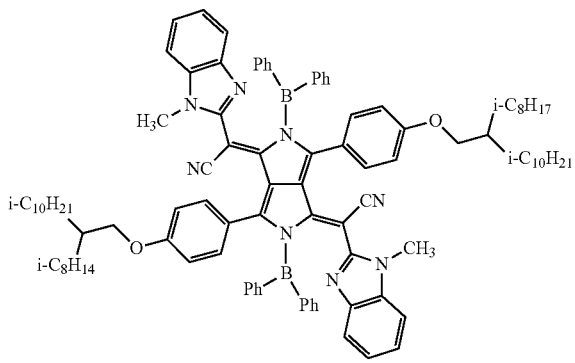
II-715
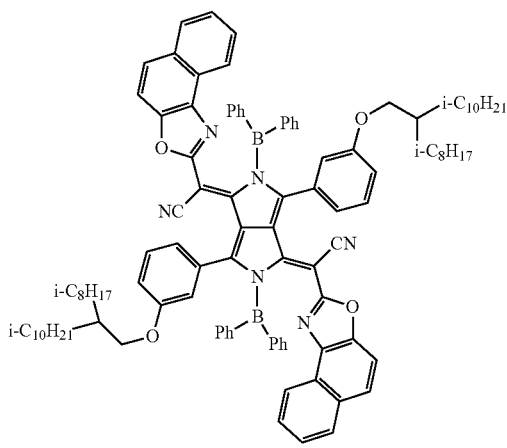
III-9
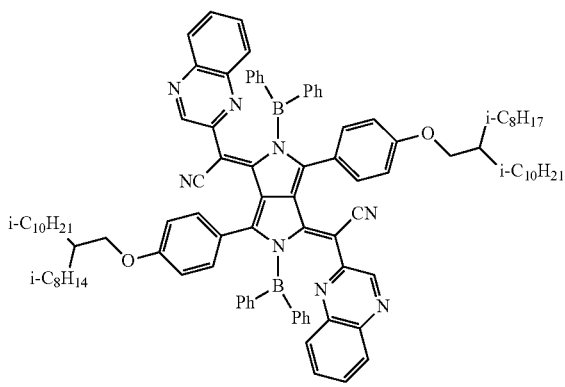
III-28
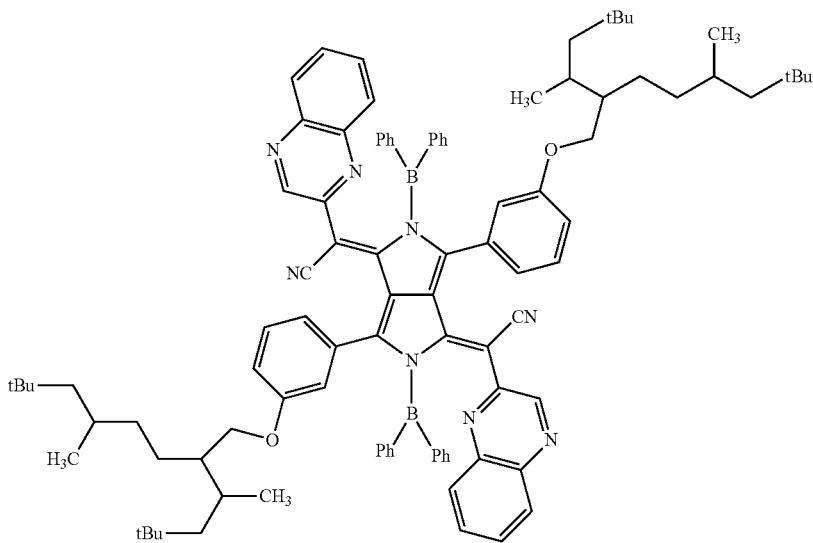

-continued
III-29
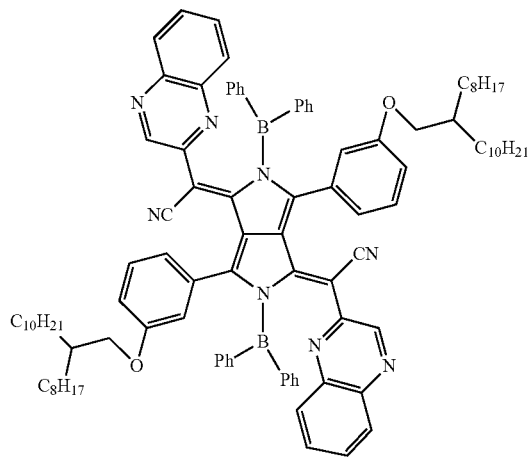
III-167
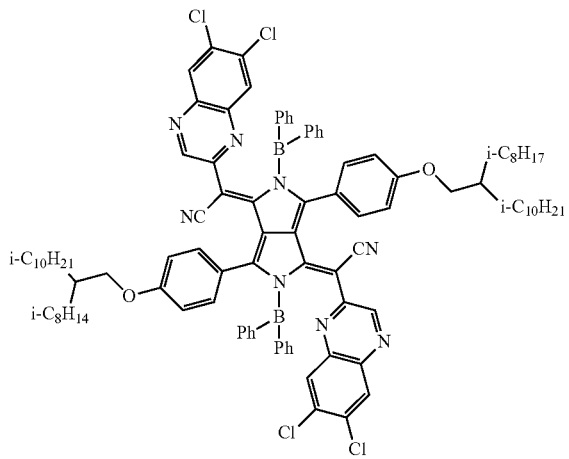
III-168
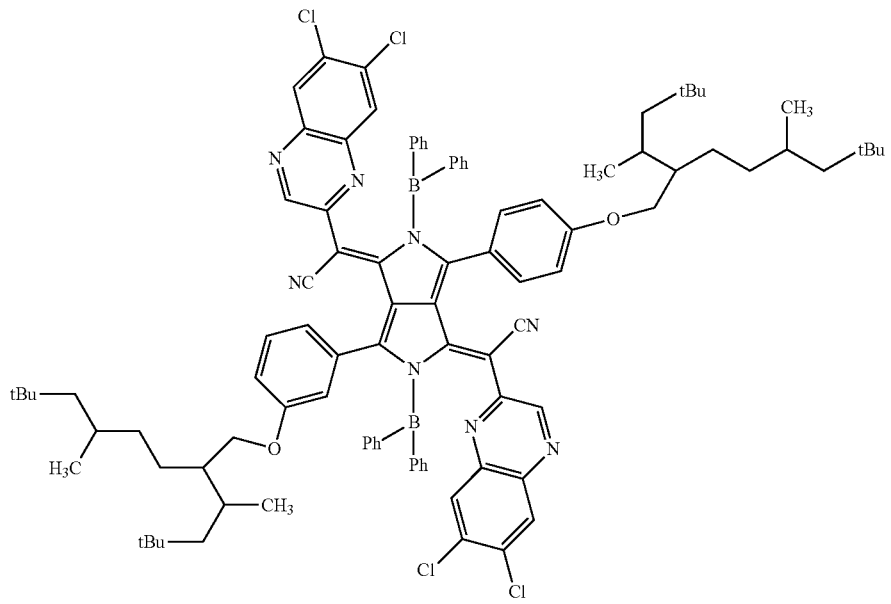

III-328
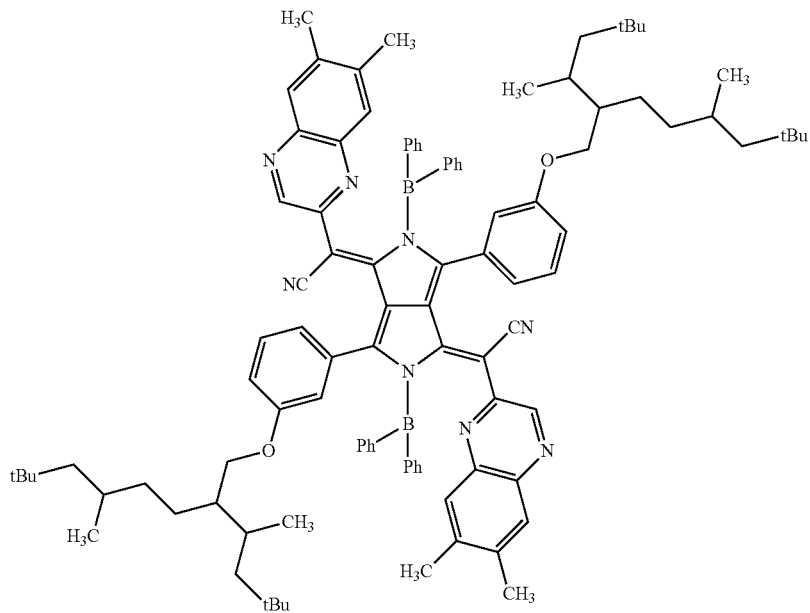
III-349
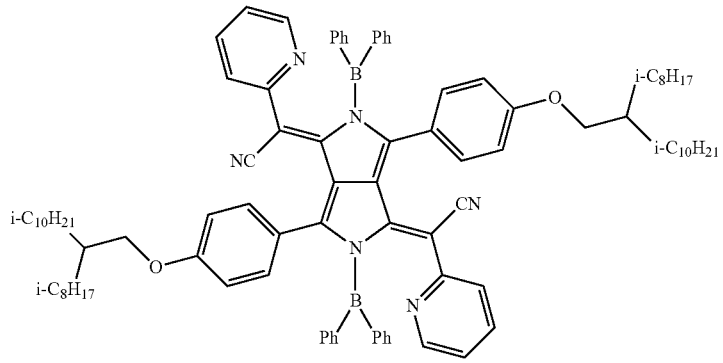
III-358
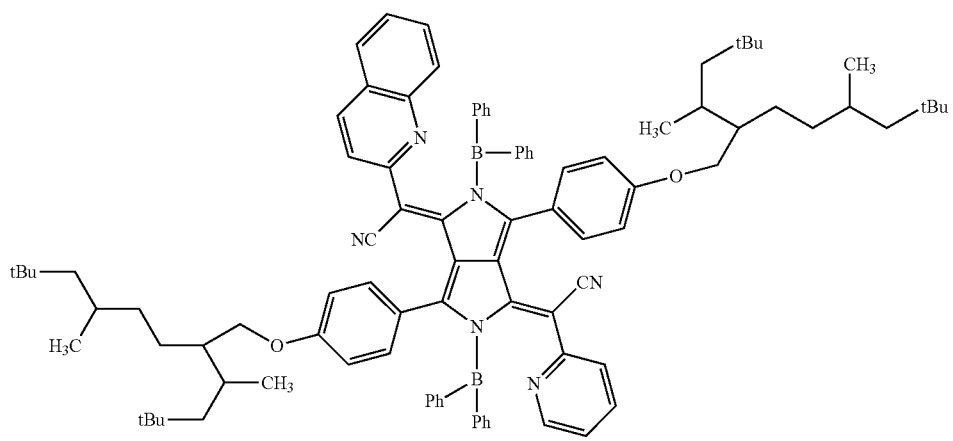

III-365
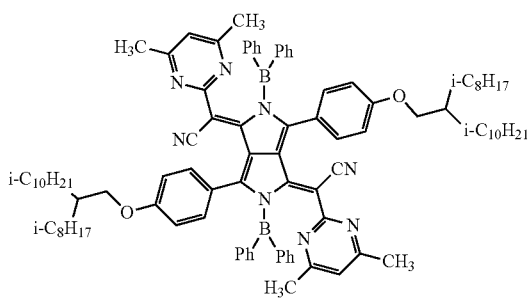
IV-7
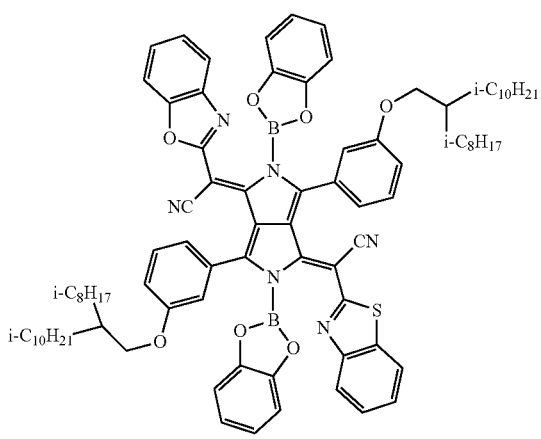
IV-91
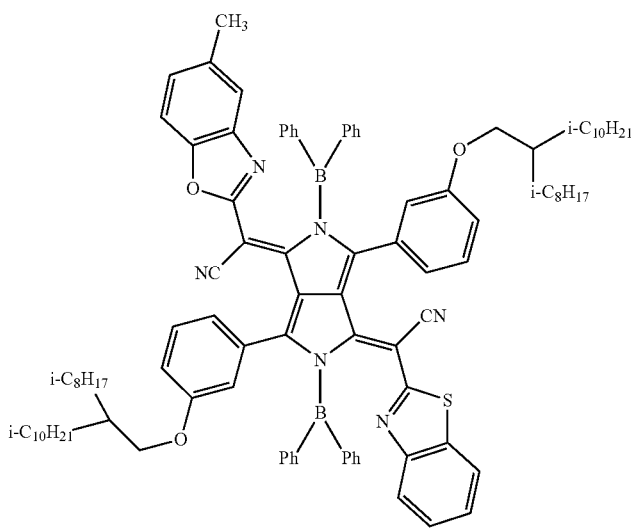
IV-92
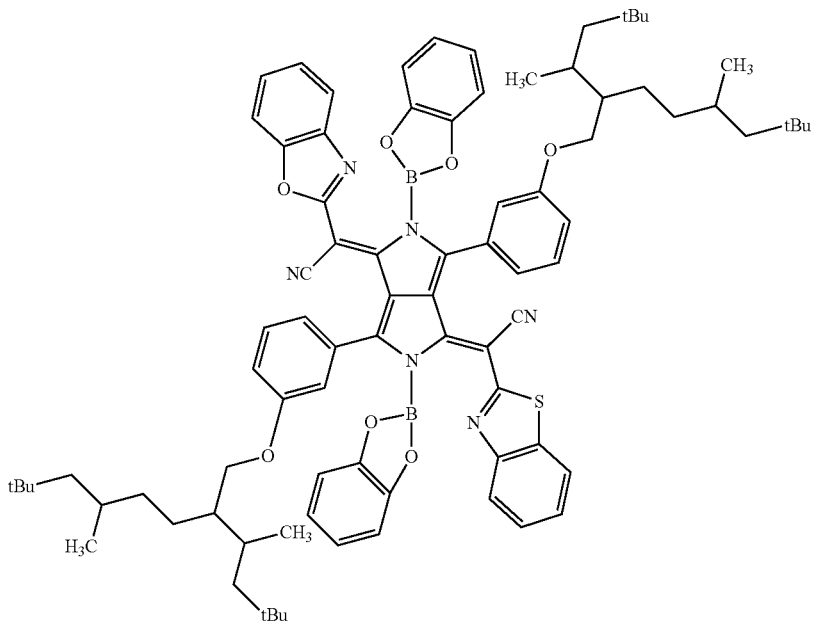

-continued
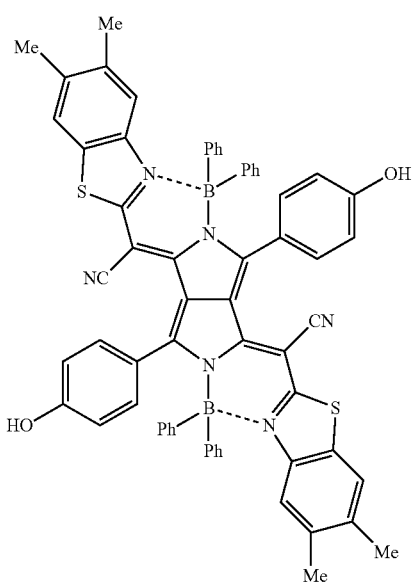
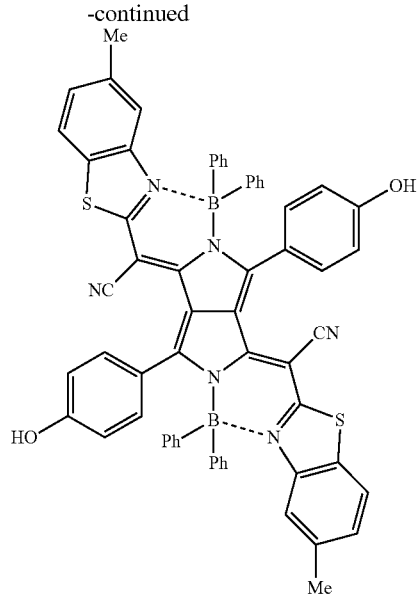
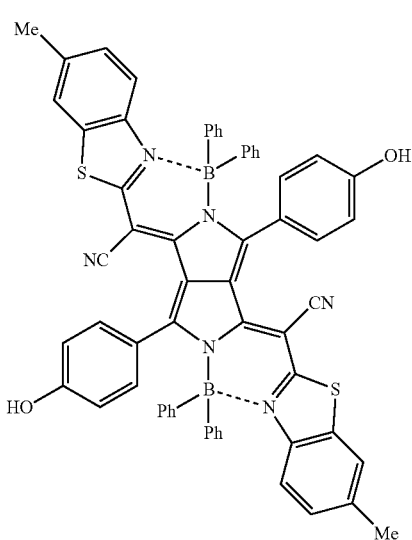
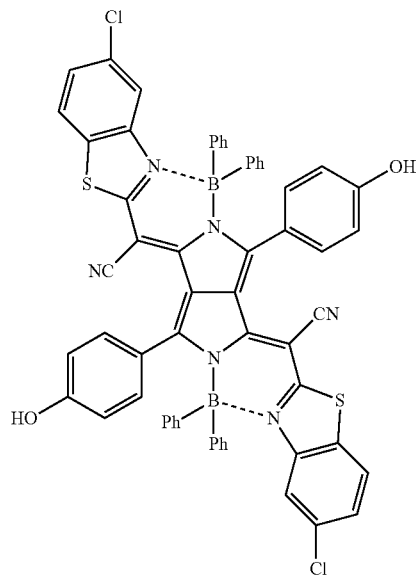
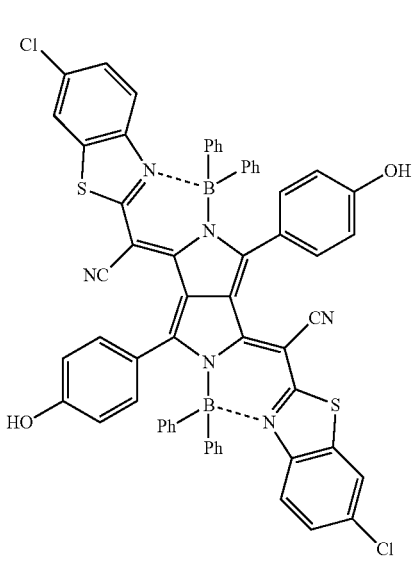
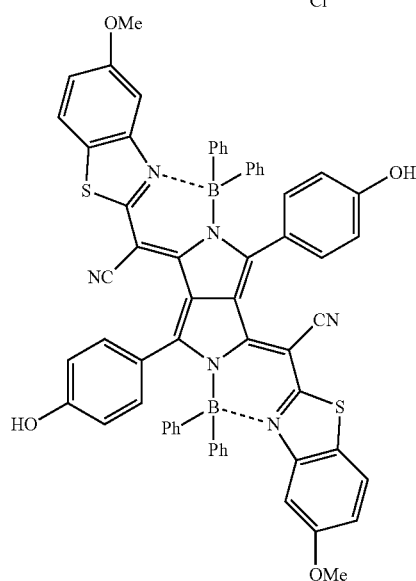

-continued

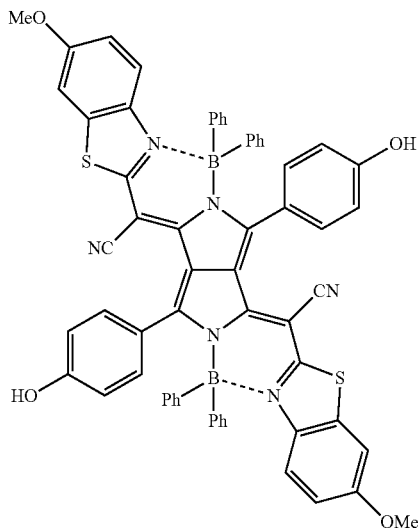

(Squarylium Compound)

In the present invention, it is preferable that the squarylium compound is a compound represented by the following Formula (1). It is preferable that the following compound is a compound having the above-described absorbance ratio.

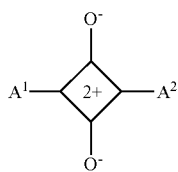

In Formula (1), $A^1$ and $A^2$ each independently represent an aryl group, a heteroaryl group, or a group represented by the following Formula (2).

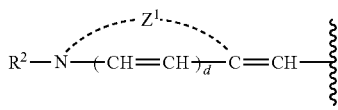

In Formula (2), $Z^1$ represents a non-metal atomic group for forming a nitrogen-containing heterocycle, $R^2$ represents an alkyl group, an alkenyl group, or an aralkyl group, d represents 0 or 1, and a wave line represents a direct bond to Formula (1).

In Formula (1), $A^1$ and $A^2$ each independently represent an aryl group, a heteroaryl group, or a group represented by the following Formula (2), and preferably a group represented by Formula (2).

The number of carbon atoms in the aryl group represented by $A^1$ and $A^2$ is preferably 6 to 48, more preferably 6 to 24, and still more preferably 6 to 12. Specific examples include a phenyl group and a naphthyl group.

It is preferable that the heteroaryl group represented by $A^1$ and $A^2$ is a 5-membered or 6-membered ring. In addition, the heteroaryl group is preferably a monocycle or a fused ring, more preferably a monocycle or a fused ring composed of 2 to 8 rings, still more preferably a monocycle or a fused ring composed of 2 to 4 rings, and even still more preferably a monocycle or a fused ring composed of 2 or 3 rings. Examples of a heteroatom included in the heterocyclic group include a nitrogen atom, an oxygen atom, and a sulfur atom. Among these, a nitrogen atom or a sulfur atom is preferable. The number of heteroatoms is preferably 1 to 3 and more preferably 1 or 2. Specific examples include a heteroaryl group derived from a monocycle or a polycyclic aromatic ring such as a 5-membered or 6-membered ring containing at least one of a nitrogen atom, an oxygen atom, or a sulfur atom.

The aryl group and the heteroaryl group may have a substituent. In a case where the aryl group and the heteroaryl group have two or more substituents, the substituents may be the same as or different from each other.

Examples of the substituent include a halogen atom, a cyano group, a nitro group, an alkyl group, an alkenyl group, an alkynyl group, an aryl group, a heteroaryl group, an aralkyl group, $-OR^{10}$, $-COR^{11}$, $-COOR^2$, $-OCOR^{13}$, $-NR^{14}R^{15}$, $-NHCOR^{16}$, $-CONR^{17}R^{18}$, $-NHCONR^{19}R^{20}$, $-NHCOOR^{21}$, $SR^{22}$, $-SO_2R^{23}$, $-SO_2OR^{24}$, $-NHSO_2R^{25}$, and $-SO_2NR^{26}R^{27}$. $R^{10}$ to $R^{27}$ each independently represent a hydrogen atom, an alkyl group, an alkenyl group, an alkynyl group, an aryl group, a heteroaryl group, or an aralkyl group. In a case where $R^{12}$ in $-COOR^{12}$ represents hydrogen atom (that is, a carboxyl group), the hydrogen atom may be dissociable or may be in the form of a salt. In a case where $R^{24}$ in $-SO_2OR^{24}$ represents a hydrogen atom (that is, a sulfo group), the hydrogen atom may be dissociable or may be in the form of a salt.

Examples of the halogen atom include a fluorine atom, a chlorine atom, a bromine atom, and an iodine atom.

The number of carbon atoms in the alkyl group is preferably 1 to 20, more preferably 1 to 15, and still more preferably 1 to 8. The alkyl group may be linear, branched, or cyclic and is preferably linear or branched.

The number of carbon atoms in the alkenyl group is preferably 2 to 20, more preferably 2 to 12, and still more preferably 2 to 8. The alkenyl group may be linear, branched, or cyclic and is preferably linear or branched.

The number of carbon atoms in the alkynyl group is preferably 2 to 40, more preferably 2 to 30, and still more preferably 2 to 25. The alkynyl group may be linear, branched, or cyclic and is preferably linear or branched.

The number of carbon atoms in the aryl group is preferably 6 to 30, more preferably 6 to 20, and still more preferably 6 to 12.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The heteroaryl group is preferably a monocycle or a fused ring, more preferably a monocycle or a fused ring composed of 2 to 8 rings, and still more preferably a monocycle or a fused ring composed of 2 to 4 rings. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. It is preferable that the heteroaryl group is a 5-membered or 6-membered ring. The number of carbon atoms constituting the ring of the heteroaryl group is preferably, 3 to 30, more preferably 3 to 18, and still more preferably 3 to 12.

The alkyl group, the alkenyl group, the alkynyl group, the aralkyl group, the aryl group, and the heteroaryl group may have a substituent or may be unsubstituted. Examples of the substituent include the above-described substituents.

Next, the group represented by Formula (2) which is represented by $A^1$ and $A^2$ will be described.

In Formula (2), $R^2$ represents an alkyl group, an alkenyl group, or an aralkyl group and preferably an alkyl group.

The number of carbon atoms in the alkyl group is preferably 1 to 30, more preferably 1 to 20, still more preferably 1 to 12, and even still more preferably 2 to 8.

The number of carbon atoms in the alkenyl group is preferably 2 to 30, more preferably 2 to 20, and still more preferably 2 to 12.

The alkyl group and the alkenyl group may be linear, branched, or cyclic and is preferably linear or branched.

The number of carbon atoms in the aralkyl group is preferably 7 to 30 and more preferably 7 to 20.

In Formula (2), the nitrogen-containing heterocycle formed by $Z^1$ is preferably a 5-membered or 6-membered ring. In addition, the nitrogen-containing heterocycle is preferably a monocycle or a fused ring, more preferably a monocycle or a fused ring composed of 2 to 8 rings, still more preferably a monocycle or a fused ring composed of 2 to 4 rings, and even still more preferably a fused ring composed of 2 or 3 rings. In addition to a nitrogen atom, the nitrogen-containing heterocycle may include a sulfur atom. In addition, the nitrogen-containing heterocycle may have a substituent. Examples of the substituent include the above-described substituents. For example, a halogen atom, an alkyl group, a hydroxyl group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

It is preferable that the group represented by Formula (2) is a group represented by the following Formula (3) or (4).

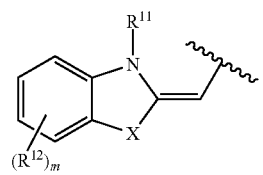

(3)

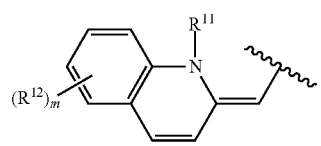

(4)

In Formulae (3) and (4), $R^{11}$ represents an alkyl group, an alkenyl group, or an aralkyl group, $R^{12}$ represents a substituent, in a case where m represents 2 or more, $R^{12}$'s may be linked to each other to form a ring, X represents a nitrogen atom or $CR^{13}R^{14}$, $R^{13}$ and $R^{14}$ each independently represent a hydrogen atom or a substituent, m represents an integer of 0 to 4, and a wave line represents a direct bond to Formula (1).

$R^{11}$ in Formulae (3) and (4) has the same definition and the same preferable range as $R^2$ in Formula (2).

$R^{12}$ in Formulae (3) and (4) represents a substituent. Examples of the substituent include the substituents described above regarding the Formula (1). For example, a halogen atom, an alkyl group, a hydroxyl group, an amino group, or an acylamino group is preferable, and a halogen atom or an alkyl group is more preferable. The halogen atom is preferably a chlorine atom. The number of carbon atoms in the alkyl group is preferably 1 to 30, more preferably 1 to 20, and still more preferably 1 to 12. The alkyl group is preferably linear or branched.

In a case where m represents 2 or more, $R^{12}$'s may be linked to each other to form a ring. Examples of the ring include an alicyclic ring (a nonaromatic hydrocarbon ring), an aromatic ring, and a heterocycle. The ring may be a monocycle or a polycycle. In a case where substituents are linked to each other to form a ring, examples of a linking group include a divalent linking group selected from the group consisting of —CO—, —O—, —NH—, a divalent aliphatic group, a divalent aromatic group, a divalent unsaturated chain hydrocarbon group, and a combination thereof. For example, it is preferable that $R^{12}$'s may be linked to each other to form a benzene ring.

In Formula (3), X represents a nitrogen atom or $CR^{13}R^{14}$, and $R^{13}$ and $R^{14}$ each independently represent a hydrogen atom or a substituent. Examples of the substituent include the substituents described above regarding the Formula (1). For example, the substituent is an alkyl group. The number of carbon atoms in the alkyl group is preferably 1 to 20, more preferably 1 to 10, still more preferably 1 to 5, even still more preferably 1 to 3, and most preferably 1. The alkyl group is preferably linear or branched and more preferably linear.

m represents an integer of 0 to 4 and preferably 0 to 2.

As shown below, cations in Formula (1) are present without localized.

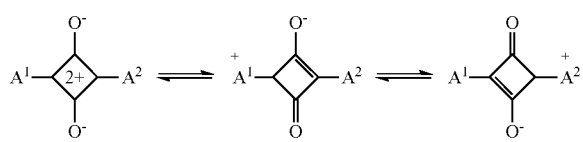

It is preferable that the squarylium dye is a compound represented by the following Formula (5).

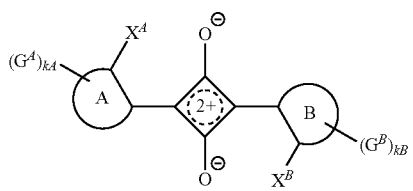

(5)

A ring A and a ring B each independently represent an aromatic ring or a heteroaromatic ring.

$X^A$ and $X^B$ each independently represent a substituent.

$G^A$ and $G^B$ each independently represent a substituent.

kA represents an integer of 0 to $n_A$, and kB represents an integer of 0 to $n_B$.

$n_A$ and $n_B$ represents integers representing the maximum numbers of $G^A$'s and GB's which may be substituted in the ring A and the ring B, respectively.

$X^A$ and $G^A$, or $X^B$ and $G^B$ may be bonded to each other, and in a case where a plurality of $G^A$'s and a plurality of $G^B$'s are present, $G^A$'s and $G^B$'s may be bonded to each other to form ring structures, respectively.

$G^A$ and $G^B$ each independently represent a substituent. Examples of the substituent include the substituents described above regarding the Formula (1).

$X^A$ and $X^B$ each independently represent a substituent. Examples of the substituent include the substituents described above regarding Formula (1). Among these, a group having active hydrogen is preferable, —OH, —SH, —COOH, —SO$_3$H, —NR$^{X1}$R$^{X2}$, —NHCOR$^{X1}$, —CONR$^{X1}$R$^{X2}$, —NHCONR$^{X1}$R$^{X2}$, —NHCOOR$^{X1}$, —NHSO$_2$R$^{X1}$, —B(OH)$_2$, or —PO(OH)$_2$ is more preferable, and —OH, —SH, or —NR$^{X1}$R$^{X2}$ is still more preferable.

$R^{X1}$ and $R^{X1}$ each independently represent a hydrogen atom or a substituent. Examples of the substituent include an alkyl group, an alkenyl group, an alkynyl group, an aryl group, and a heteroaryl group. Among these, an alkyl group is preferable. The alkyl group is preferably linear or branched. The details of the alkyl group, the alkenyl group, the alkynyl group, the aryl group, and the heteroaryl group are the same as the ranges described regarding the substituents.

The ring A and the ring B each independently represent an aromatic ring or a heteroaromatic ring.

The aromatic ring and the heteroaromatic ring may be a monocycle or a fused ring.

Specific examples of the aromatic ring and the heteroaromatic ring include a benzene ring, a naphthalene ring, a pentalene ring, an indene ring, an azulene ring, a heptalene ring, an indacene ring, a perylene ring, a pentacene ring, an acenaphthene ring, a phenanthrene ring, an anthracene ring, a naphthacene ring, a chrysene ring, a triphenylene ring, a fluorene ring, a biphenyl ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring. Among these, a benzene ring or a naphthalene ring is preferable.

The aromatic ring may be unsubstituted or may have a substituent. Examples of the substituent include the substituents described above regarding the Formula (1).

$X^A$ and $G^A$, or $X^B$ and $G^B$ may be bonded to each other to form a ring, and in a case where a plurality of $G^A$'s and a plurality of $G^B$'s are present, $G^A$'s or $G^B$'s may be bonded to each other to form a ring.

It is preferable that the ring is a 5-membered or 6-membered ring. The ring may be a monocycle or a polycycle.

In a case where $X^A$ and $G^A$, $X^B$ and $G^B$, $G^A$'s, or $G^B$'s are bonded to each other to form a ring, the groups may be directly bonded to each other to form a ring, or may be bonded to each other to form a ring through a divalent linking group selected from the group consisting of an alkylene group, —CO—, —O—, —NH—, —BR—, and a combination thereof to form a ring. It is preferable that $X^A$ and $G^A$, $X^B$ and $G^B$, $G^A$'s, or $G^B$'s are bonded to each other through —BR— to form a ring.

R represents a hydrogen atom or a substituent. Examples of the substituent include the substituents described above regarding Formula (1). Among these, an alkyl group or an aryl group is preferable.

kA represents an integer of 0 to nA, kB represents an integer of 0 to nB, nA represents an integer representing the maximum number of $G^A$'s which may be substituted in the ring A, and nB represents an integer representing the maximum number of $G^B$'s which may be substituted in the ring B.

kA and kB each independently represent preferably an integer of 0 to 4, more preferably 0 to 2, and still more preferably 0 or 1.

As an embodiment of the squarylium dye, a compound represented by the following Formula (6) is used. This compound has excellent heat resistance.

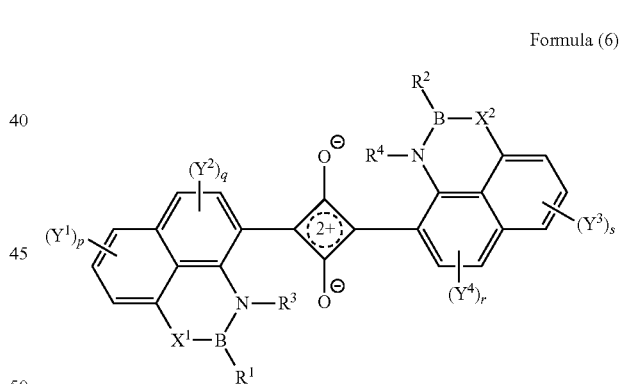

Formula (6)

In the formula, $R^1$ and $R^2$ each independently represent a substituent.

$R^3$ and $R^4$ each independently represent a hydrogen atom or an alkyl group.

$X^1$ and $X^2$ each independently —O— or —N(R$^5$)—.

$R^5$ represents a hydrogen atom, an alkyl group, an aryl group, or a heteroaryl group.

$Y^1$ to $Y^4$ each independently represent a substituent, and $Y^1$ and $Y^2$ or $Y^3$ and $Y^4$ may be bonded to each other to form a ring.

In a case where a plurality of $Y^1$'s, a plurality of $Y^2$'s, a plurality of $Y^3$'s, and a plurality of $Y^4$'s are present, $Y^1$'s, $Y^2$'s, $Y^3$'s, or $Y^4$'s may be bonded to each other to form a ring.

p and s each independently represent an integer of 0 to 3.

q and r each independently represent an integer of 0 to 2.

Examples of the substituent represented by $R^1$, $R^2$, and $Y^1$ to $Y^4$ include the substituents described above regarding Formula (1).

$R^3$ and $R^4$ each independently represent preferably a hydrogen atom, a methyl group, or an ethyl group, more preferably a hydrogen atom or a methyl group, and still more preferably a hydrogen atom.

$X^1$ and $X^2$ each independently —O— or —N($R^5$)—. $X^1$ and $X^2$ may be the same as or different from each other and is preferably the same as each other.

$R^5$ represents a hydrogen atom, an alkyl group, an aryl group, or a heteroaryl group.

$R^5$ represents preferably a hydrogen atom, an alkyl group, or an aryl group. The alkyl group, the aryl group, and the heteroaryl group represented by $R^5$ may be unsubstituted or may have a substituent. Examples of the substituent include the substituents described above regarding the Formula (1).

The number of carbon atoms in the alkyl group is preferably 1 to 20, more preferably 1 to 10, still more preferably 1 to 4, and even still more preferably 1 or 2. The alkyl group may be linear or branched.

The number of carbon atoms in the aryl group is preferably 6 to 20 and more preferably 6 to 12.

The heteroaryl group may be a monocycle or a polycycle. The number of heteroatoms constituting the ring of the heteroaryl group is preferably 1 to 3. It is preferable that the heteroatoms constituting the ring of the heteroaryl group are a nitrogen atom, an oxygen atom, or a sulfur atom. The number of carbon atoms constituting the ring of the heteroaryl group is preferably 3 to 30, more preferably 3 to 18, and still more preferably 3 to 12.

Specific examples of the squarylium compound include the following compounds. Other examples of the squarylium compound include a compound described in paragraphs "0044" to "0049" of JP2011-208101A, the content of which is incorporated herein by reference.

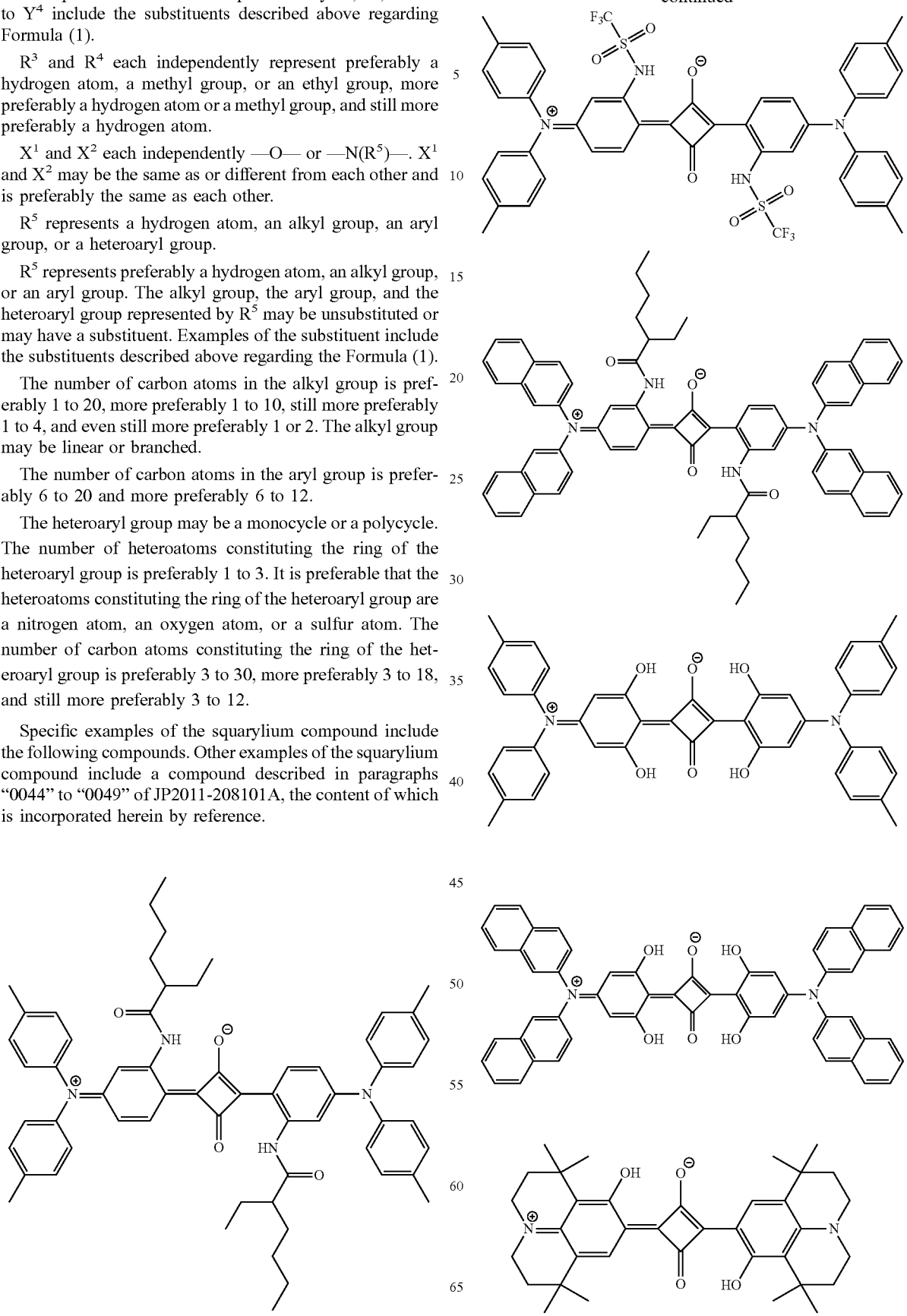

-continued
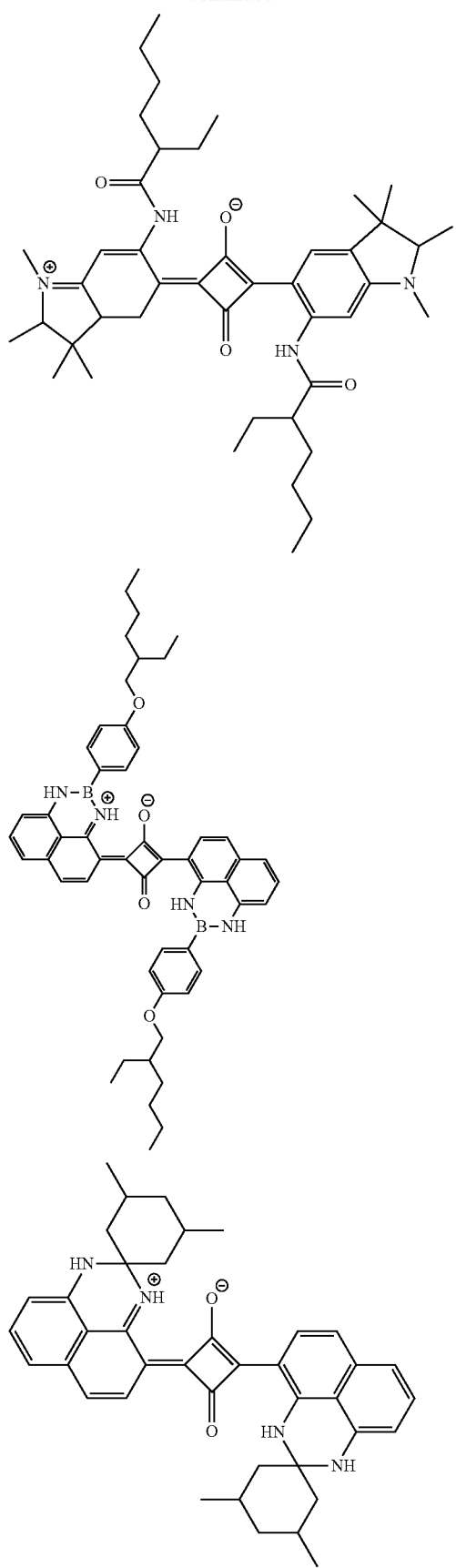
-continued
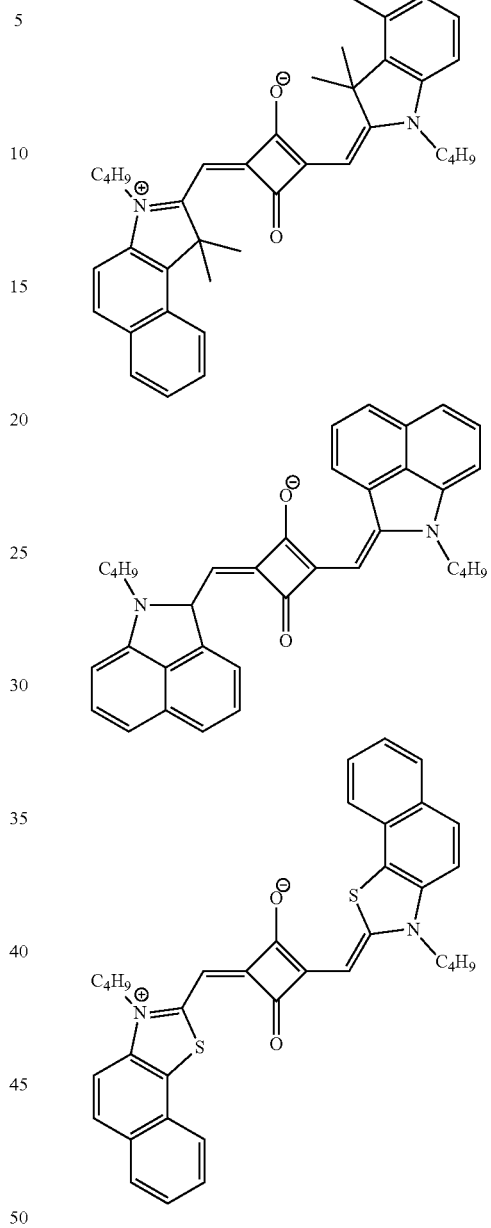
(Cyanine Compound)
In the present invention, it is preferable that the cyanine compound is a compound represented by the following Formula (C). It is preferable that the following compound is a compound having the above-described absorbance ratio.
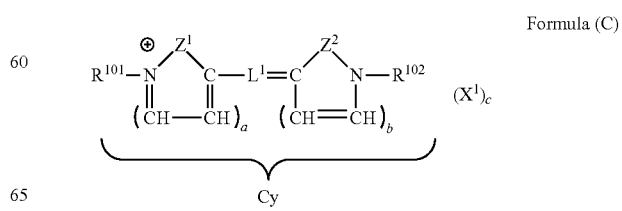

In Formula (C), $Z^1$ and $Z^2$ each independently represent a non-metal atomic group for forming a 5- or 6-membered nitrogen-containing heterocycle which may be fused.

$R^{101}$ and $R^{102}$ each independently represent an alkyl group, an alkenyl group, an alkynyl group, an aralkyl group, or an aryl group.

$L^1$ represents a methine chain including an odd number of methine groups.

a and b each independently represent 0 or 1.

In a case where a represents 0, a carbon atom and a nitrogen atom are bonded through a double bond. In a case where b represents 0, a carbon atom and a nitrogen atom are bonded through a single bond.

In a case where a site represented by Cy in the formula is a cation site, $X^1$ represents an anion, and c represents the number of $X^1$'s for balancing charge. In a case where a site represented by Cy in the formula is an anion site, $X^1$ represents a cation, and c represents the number of $X^1$'s for balancing charge. In a case where charge of a site represented by Cy in the formula is neutralized in a molecule, c represents 0.

In Formula (C), $Z^1$ and $Z^2$ each independently represent a non-metal atomic group for forming a 5- or 6-membered nitrogen-containing heterocycle which may be fused. Another heterocycle, an aromatic ring, or an aliphatic ring may be fused to the nitrogen-containing heterocycle. It is preferable that the nitrogen-containing heterocycle is a 5-membered ring. A structure in which a benzene ring or a naphthalene ring is fused to the 5-membered nitrogen-containing heterocycle is more preferable. Specific examples of the nitrogen-containing heterocycle include an oxazole ring, an isoxazole ring, a benzoxazole ring, a naphthoxazole ring, an oxazolocarbazole ring, an oxazolodibenzofuran ring, a thiazole ring, a benzothiazole ring, a naphthothiazole ring, an indolenine ring, a benzoindolenine ring, an imidazole ring, a benzimidazole ring, a naphthoimidazole ring, a quinoline ring, a pyridine ring, a pyrrolopyridine ring, a furopyrrole ring, an indolizine ring, an imidazoquinoxaline ring, and a quinoxaline ring. Among these, a quinoline ring, an indolenine ring, a benzoindolenine ring, a benzoxazole ring, a benzothiazole ring, or a benzimidazole ring is preferable, and an indolenine ring, a benzothiazole ring, or a benzimidazole ring is more preferable. The nitrogen-containing heterocycle and a ring fused thereto may have a substituent. Examples of the substituent include the substituents described above regarding Formula (1).

In Formula (C), $R^{101}$ and $R^{102}$ each independently represent an alkyl group, an alkenyl group, an alkynyl group, an aralkyl group, or an aryl group.

The number of carbon atoms in the alkyl group is preferably 1 to 20, more preferably 1 to 12, and still more preferably 1 to 8. The alkyl group may be linear, branched, or cyclic.

The number of carbon atoms in the alkenyl group is preferably 2 to 20, more preferably 2 to 12, and still more preferably 2 to 8. The alkenyl group may be linear, branched, or cyclic.

The number of carbon atoms in the alkynyl group is preferably 2 to 20, more preferably 2 to 12, and still more preferably 2 to 8. The alkynyl group may be linear, branched, or cyclic.

The number of carbon atoms in the aryl group is preferably 6 to 25, more preferably 6 to 15, and still more preferably 6 to 10. The aryl group may be unsubstituted or may have a substituent.

An alkyl portion of the aralkyl group is the same as the above-described alkyl group. An aryl portion of the aralkyl group is the same as the above-described aryl group. The number of carbon atoms in the aralkyl group is preferably 7 to 40, more preferably 7 to 30, and still more preferably 7 to 25.

The alkyl group, the alkenyl group, the alkynyl group, the aralkyl group, and the aryl group may have a substituent or may be unsubstituted. Examples of the substituent include a halogen atom, a hydroxyl group, a carboxyl group, a sulfo group, an alkoxy group, and an amino group. Among these, a carboxyl group or a sulfo group is preferable, and a sulfo group is more preferable. In the carboxyl group and the sulfo group, a hydrogen atom may be dissociable or may be in the form of a salt.

In Formula (C), $L^1$ represents a methine chain including an odd number of methine groups. It is preferable that $L^1$ represents a methine chain including 3, 5, or 7 methine groups.

The methine group may have a substituent. It is preferable that the methine group having a substituent is a methine group positioned at the center (meso position). Specific examples of the substituent include a substituent which may be included in the nitrogen-containing heterocycle represented by $Z^1$ and $Z^2$, and a group represented by the following Formula (a). In addition, two substituents in the methine chain may be bonded to each other to form a 5-membered or 6-membered ring.

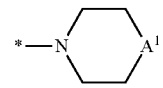

(a)

In Formula (a), * represents a linking portion to the methine chain, and $A^1$ represents —O—.

In Formula (C), a and b each independently represent 0 or 1. In a case where a represents 0, a carbon atom and a nitrogen atom are bonded through a double bond. In a case where b represents 0, a carbon atom and a nitrogen atom are bonded through a single bond. It is preferable that both a and b represent 0. In a case where both a and b represent 0, Formula (C) will be shown below.

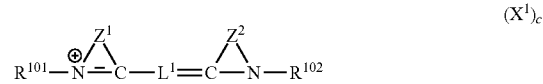

$(X^1)_c$

In a case where a site represented by Cy in Formula (C) is a cation site, $X^1$ represents an anion, and c represents the number of $X^1$'s for balancing charge. Examples of the anion include an halide ion ($Cl^-$, $Br^-$, or $I^-$), a p-toluenesulfonate ion, an ethyl sulfate ion, $PF_6^-$, $BF_4^-$ $ClO_4^-$, a tris(halogenoalkylsulfonyl)methide anion (for example, $(CF_3SO_2)_3C^-$), a di(halogenoalkylsulfonyl)imide anion (for example, $(CF_3SO_2)_2N^-$), and a tetracyano borate anion.

In a case where a site represented by Cy in Formula (C) is an anion site, $X^1$ represents a cation, and c represents the number of $X^1$'s for balancing charge. Examples of the cation include an alkali metal ion (for example, $Li^+$, $Na^+$, or $K^+$), an alkali earth metal ion ($Mg^{2+}$, $Ca^{2+}$, $Ba^{2+}$, or $Sr^{2+}$), a transition metal ion (for example, $Ag^+$, $Fe^{2+}$, $Co^{2+}$, $Ni^{2+}$, $Cu^{2+}$, or $Zn^{2+}$), other metal ions (for example, $Al^{3+}$), an ammonium ion, a triethylammonium ion, a tributylammonium ion, a pyridinium ion, a tetrabutylammonium ion, a guanidinium ion, a tetramethylguanidinium ion, and a diazabicycloundecenium ion. As the cation, $Na^+$, $K^+$, $Mg^{2+}$, $Ca^{2+}$, $Zn^{2+}$, or a diazabicycloundecenium ion is preferable.

In a case where charge of a site represented by Cy in Formula (C) is neutralized in a molecule, $X^1$ is not present. That is, c represents 0.

It is preferable that the cyanine compound is a compound represented by any one of the following Formulae (C-1) to (C-3).

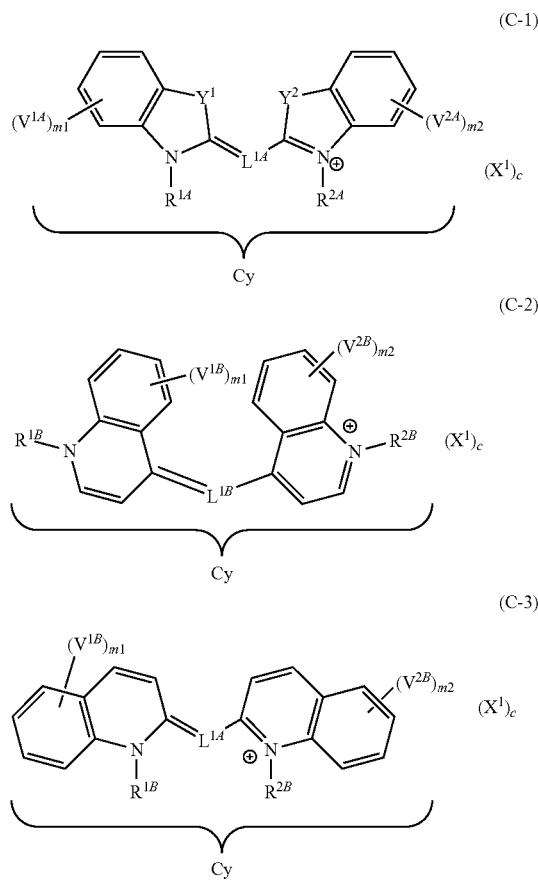

In the formulae, $R^{1A}$, $R^{2A}$, $R^{1B}$, and $R^{2B}$ each independently represent an alkyl group, an alkenyl group, an alkynyl group, an aralkyl group, or an aryl group.

$L^{1A}$ and $L^{1B}$ each independently represent a methine chain including an odd number of methine groups.

$Y^1$ and $Y^2$ each independently represent —S—, —O—, —$NR^{X1}$— or, —$CR^{X2}R^{X3}$—.

$R^{X1}$, $R^{X2}$, and $R^{X3}$ each independently represent a hydrogen atom or an alkyl group.

$V^{1A}$, $V^{2A}$, $V^{1B}$, and $V^{2B}$ each independently represent a substituent.

m1 and m2 each independently represent 0 to 4.

In a case where a site represented by Cy in the formula is a cation site, $X^1$ represents an anion, and c represents the number of $X^1$'s for balancing charge.

In a case where a site represented by Cy in the formula is an anion site, $X^1$ represents a cation, and c represents the number of $X^1$'s for balancing charge.

In a case where charge of a site represented by Cy is neutralized in a molecule, $X^1$ is not present.

The groups represented by $R^{1A}$, $R^{2A}$, $R^{1B}$, and $R^{2B}$ have the same definitions and the same preferable ranges as those of the alkyl group, the alkenyl group, the alkynyl group, the aralkyl group, and the aryl group described regarding $R^{101}$ and $R^{102}$ of Formula (C). These groups may be unsubstituted or may have a substituent. Examples of the substituent include a halogen atom, a hydroxyl group, a carboxyl group, a sulfo group, an alkoxy group, and an amino group. Among these, a carboxyl group or a sulfo group is preferable, and a sulfo group is more preferable. In the carboxyl group and the sulfo group, a hydrogen atom may be dissociable or may be in the form of a salt. In a case where $R^{1A}$, $R^{2A}$, $R^{1B}$, and $R^{2B}$ represent an alkyl group, it is more preferable that the alkyl group is linear.

$Y^1$ and $Y^2$ each independently represent —S—, —O—, —$NR^{X1}$— or, —$CR^{X2}R^{X3}$— and preferably —$NR^{X1}$—. $R^{X1}$, $R^{X2}$, and $R^{X3}$ each independently represent a hydrogen atom or an alkyl group and preferably an alkyl group. The number of carbon atoms in the alkyl group is preferably 1 to 10, more preferably 1 to 5, and still more preferably 1 to 3. The alkyl group may be linear, branched, or cyclic and is preferably linear or branched and more preferably linear. The alkyl group is still more preferably a methyl group or an ethyl group.

$L^{1A}$ and $L^{1B}$ have the same definitions and the same preferable ranges as those of $L^1$ in Formula (C).

Examples of the substituent represented by $V^{1A}$, $V^{2A}$, $V^{1B}$, and $V^{2B}$ include the substituents described regarding Formula (SQ), and preferable ranges thereof are also the same.

m1 and m2 each independently represent 0 to 4 and preferably 0 to 2.

The anion and the cation represented by X1 have the same range and definitions and the same preferable ranges as those described regarding $X^1$ in Formula (C).

Specific examples of the cyanine compound include the following compounds. Other examples of the cyanine compound include compound described in JP2015-172004A and JP2015-172102A.

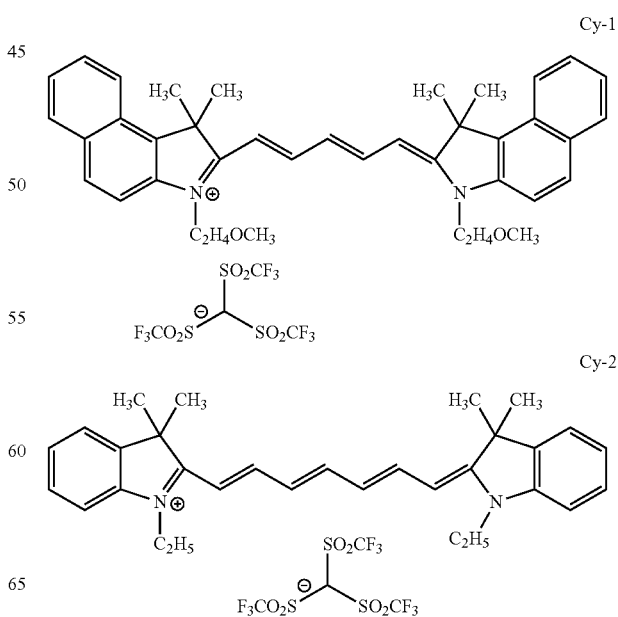

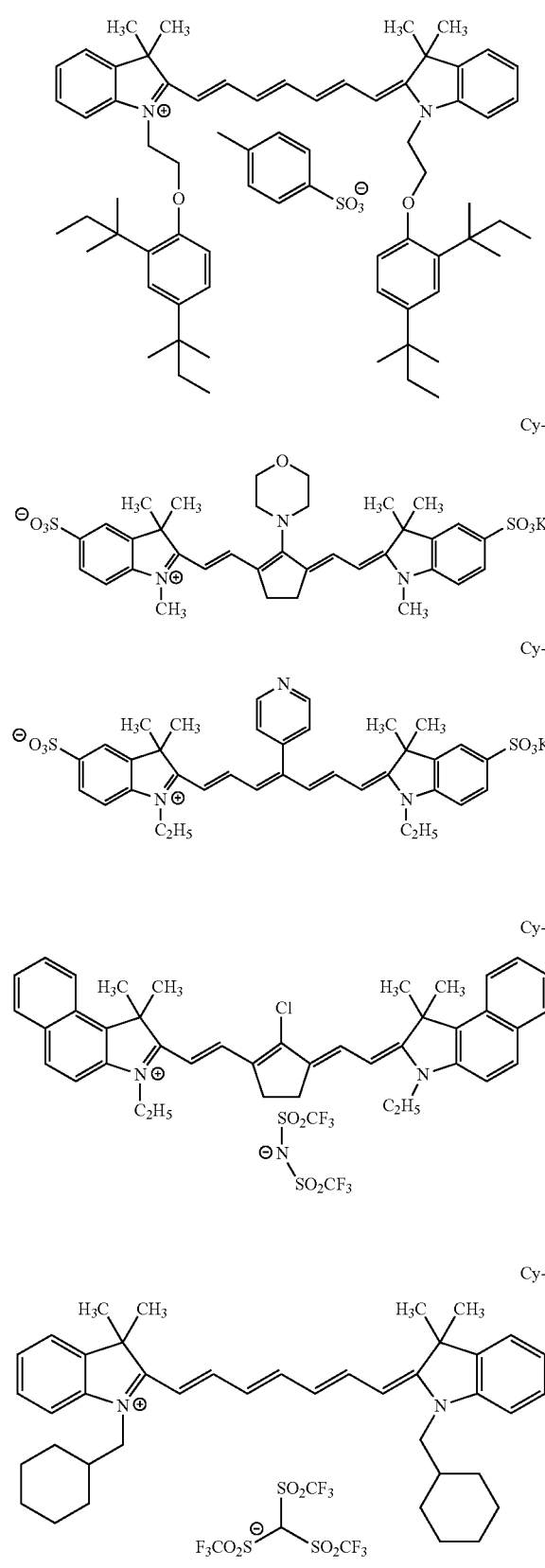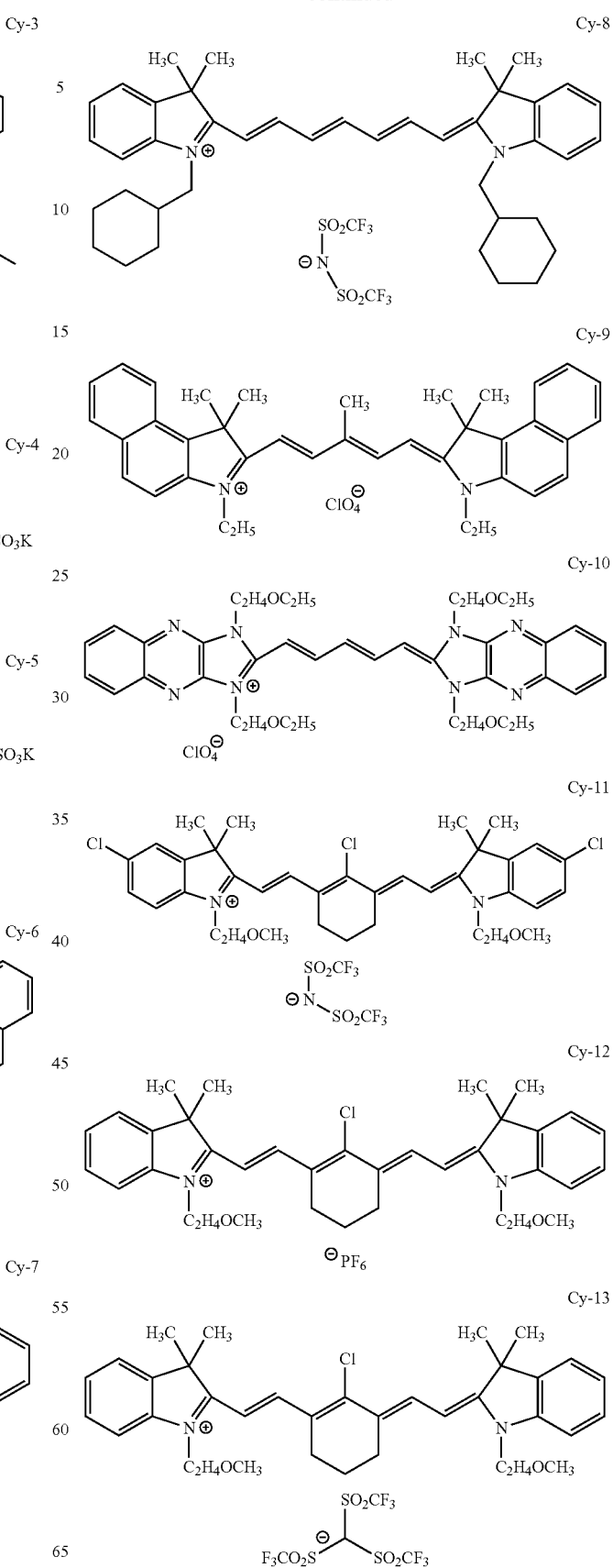

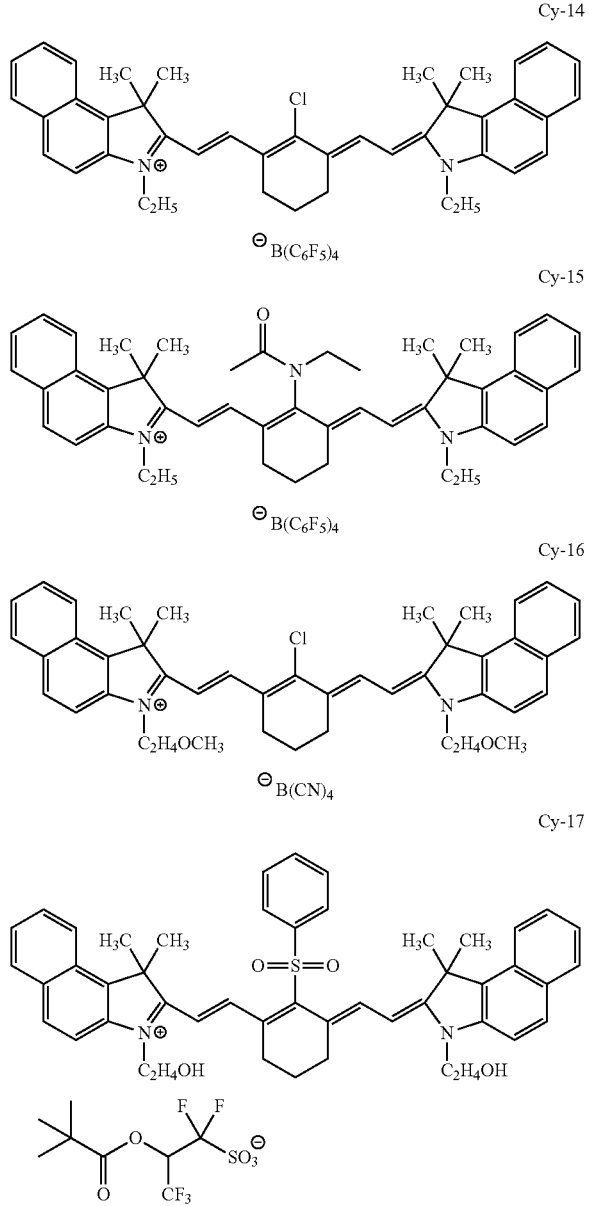

(Other Near Infrared Absorbing Compounds)

The near infrared absorber may further include near infrared absorbing compounds (also referred to as "other near infrared absorbing compounds) other than the near infrared absorbing compound A.

The other near infrared absorbing compound may be a pigment or a dye. It is preferable that the other near infrared absorbing compound is a pigment because a pattern having excellent rectangularity can be easily formed. In addition, the pigment may be an inorganic pigment or an organic pigment.

Examples of the other near infrared absorbing compounds include a phthalocyanine compound, a naphthalocyanine compound, a rylene compound, a merocyanine compound, a croconium compound, an oxonol compound, a diiminium compound, a dithiol compound, a triarylmethane compound, a pyrromethene compound, an azomethine compound, an anthraquinone compound, and a dibenzofuranone compound. Examples of the phthalocyanine compound include an oxytitaniumphthalocyanine pigment. As the phthalocyanine compound, the naphthalocyanine compound, the diiminium compound, or the croconium compound, for example, one of compounds described in paragraphs "0010" to "0081" of JP2010-111750A may be used, the content of which are incorporated in this specification. In addition, IRA868 (manufactured by Exiton, Inc.) or IRG-068 (manufactured by Nippon Kayaku Co., Ltd.) can also be used.

In addition, as the other near infrared absorbing compound, an inorganic pigment can also be used. As the inorganic pigment, metal oxide particles or metal particles are preferable from the viewpoint of further improving infrared shielding properties. Examples of the metal oxide particles include indium tin oxide (ITO) particles, antimony tin oxide (ATO) particles, zinc oxide (ZnO) particles, Al-doped zinc oxide (Al-doped ZnO) particles, fluorine-doped tin dioxide (F-doped $SnO_2$) particles, and niobium-doped titanium dioxide (Nb-doped $TiO_2$) particles. Examples of the metal particles include silver (Ag) particles, gold (Au) particles, copper (Cu) particles, and nickel (Ni) particles. The shape of the inorganic pigment is not particularly limited and may have a sheet shape, a wire shape, or a tube shape irrespective of whether or not the shape is spherical or non-spherical.

In addition, as the inorganic pigment, a tungsten oxide compound can also be used. Specifically, a tungsten oxide compound represented by the following Formula (W-1) is preferable.

$$M_xW_yO_z \quad \quad (W\text{-}1)$$

M represents metal, W represents tungsten, and O represents oxygen.

$$0.001 \leq x/y \leq 1.1$$

$$2.2 \leq z/y \leq 3.0$$

Examples of the metal represented by M include an alkali metal, an alkali earth metal, Zr, Cr, Mn, Fe, Ru, Co, Rh, Ir, Ni, Pd, Pt, Cu, Ag, Au, Zn, Cd, Al, Ga, In, Ti, Sn, Pb, Ti, Nb, V, Mo, Ta, Re, Be, Hf, Os, and Bi. Among these, an alkali metal is preferable, Rb or Cs is more preferable, and Cs is still more preferable. As the metal represented by M, one kind or two or more kinds may be used.

By adjusting x/y to be 0.001 or higher, infrared light can be sufficiently shielded.

By adjusting x/y to be 1.1 or lower, production of an impurity phase in the tungsten oxide compound can be reliably avoided.

By adjusting z/y to be 2.2 or higher, chemical stability as a material can be further improved. By adjusting z/y to be 3.0 or lower, infrared light can be sufficiently shielded.

Specific examples of the tungsten oxide compound include $Cs_{0.33}WO_3$, $Rb_{0.33}WO_3$, $K_{0.33}WO_3$, and $Ba_{0.33}WO_3$. Among these, $Cs_{0.33}WO_3$ or $Rb_{0.33}WO_3$ is preferable, and $Cs_{0.33}WO_3$ is more preferable.

The tungsten oxide compound is available in the form of, for example, a dispersion of tungsten particles such as YMF-02 or YMS-01A-2 (manufactured by Sumitomo Metal Mining Co., Ltd.).

The average particle size of the inorganic pigment is preferably 800 nm or less, more preferably 400 nm or less, and still more preferably 200 nm or less. By adjusting the average particle size of the inorganic pigment to be in the above-described range, transmittance in a visible range can be reliably improved. From the viewpoint of avoiding light scattering, the less the average particle size, the better.

However, due to the reason of handleability during manufacturing or the like, the lower limit of the average particle size of the inorganic pigment is typically 1 nm or more.

In a case where the near infrared absorber includes the other near infrared absorbing compounds, the content of the other near infrared absorbing compounds is preferably 0.1 to 80 parts by mass, 5 to 60 parts by mass, and still more preferably 10 to 40 parts by mass with respect to the 100 parts by mass of the near infrared absorbing compound A.

<<Chromatic Colorant>>

The composition according to the present invention may include a chromatic colorant. In the present invention, "chromatic colorant" denotes a colorant other than a white colorant and a black colorant. It is preferable that the chromatic colorant is a colorant having an absorption in a wavelength range of 400 nm or longer and shorter than 650 nm. In the present invention, the chromatic colorant may be a pigment or a dye.

The pigment is preferably an organic pigment, and examples thereof are as follows. However, the pigment used in the present invention is not limited to the examples:

Color Index (C.I.) Pigment Yellow 1, 2, 3, 4, 5, 6, 10, 11, 12, 13, 14, 15, 16, 17, 18, 20, 24, 31, 32, 34, 35, 35:1, 36, 36:1, 37, 37:1, 40, 42, 43, 53, 55, 60, 61, 62, 63, 65, 73, 74, 77, 81, 83, 86, 93, 94, 95, 97, 98, 100, 101, 104, 106, 108, 109, 110, 113, 114, 115, 116, 117, 118, 119, 120, 123, 125, 126, 127, 128, 129, 137, 138, 139, 147, 148, 150, 151, 152, 153, 154, 155, 156, 161, 162, 164, 166, 167, 168, 169, 170, 171, 172, 173, 174, 175, 176, 177, 179, 180, 181, 182, 185, 187, 188, 193, 194, 199, 213, and 214 (all of which are yellow pigments);

C.I. Pigment Orange 2, 5, 13, 16, 17:1, 31, 34, 36, 38, 43, 46, 48, 49, 51, 52, 55, 59, 60, 61, 62, 64, 71, and 73 (all of which are orange pigments);

C.I. Pigment Red 1, 2, 3, 4, 5, 6, 7, 9, 10, 14, 17, 22, 23, 31, 38, 41, 48:1, 48:2, 48:3, 48:4, 49, 49:1, 49:2, 52:1, 52:2, 53:1, 57:1, 60:1, 63:1, 66, 67, 81:1, 81:2, 81:3, 83, 88, 90, 105, 112, 119, 122, 123, 144, 146, 149, 150, 155, 166, 168, 169, 170, 171, 172, 175, 176, 177, 178, 179, 184, 185, 187, 188, 190, 200, 202, 206, 207, 208, 209, 210, 216, 220, 224, 226, 242, 246, 254, 255, 264, 270, 272, and 279 (all of which are red pigments);

C.I. Pigment Green 7, 10, 36, 37, 58, and 59 (all of which are green pigments);

C.I. Pigment Violet 1, 19, 23, 27, 32, 37, and 42 (all of which are violet pigments); and C.I. Pigment Blue 1, 2, 15, 15:1, 15:2, 15:3, 15:4, 15:6, 16, 22, 60, 64, 66, 79, and 80 (all of which are blue pigments).

Among these organic pigments, one kind may be used alone, or two or more kinds may be used in combination.

As the dye, well-known dyes can be used without any particular limitation. In terms of a chemical structure, a dye such as a pyrazole azo dye, an anilino azo dye, a triphenylmethane dye, an anthraquinone dye, an anthrapyridone dye, a benzylidene dye, an oxonol dye, a pyrazolotriazole azo dye, a pyridone azo dye, a cyanine dye, a phenothiazine dye, a pyrrolopyrazole azomethine dye, a xanthene dye, a phthalocyanine dye, a benzopyran dye, an indigo dye, or a pyrromethene dye can be used. In addition, a polymer of the above-described dyes may be used. In addition, dyes described in JP2015-028144A and JP2015-34966A can also be used.

<<Coloring Material that Allows Transmission of at Least Part of Light in Infrared Range and Shields Light in Visible Range (Coloring Material that Shields Visible Light)>>

The composition according to the present invention may also include a coloring material that allows transmission of at least a part of light in an infrared range and shields light in a visible range (hereinafter, also referred to as "coloring material that shields visible light").

It is preferable that the coloring material that shields visible light satisfies at least one of the following requirement (1) or (2), and it is more preferable that the coloring material that shields visible light satisfies the requirement (1).

(1): An aspect in which the coloring material that shields visible light includes two or more chromatic colorants (2): An aspect in which the coloring material that shields visible light includes an organic black colorant <<Pigment Derivative>>

In a case where the composition according to the present invention includes a pigment, the composition may further include a pigment derivative. As the pigment derivative, a compound having a structure in which a portion of a pigment is substituted with an acidic group, a basic group, or a phthalimidomethyl group is preferable, and a pigment derivative represented by the following Formula (B1) is more preferable.

$$P\text{—}(L\text{—}(X)_n)_m \tag{B1}$$

In Formula (B1), P represents a colorant structure, L represents a single bond or a linking group, X represents an acidic group, a basic group, a group having a salt structure, or a phthalimido group, m represents an integer of 1 or more, n represents an integer of 1 or more, in a case where m represents 2 or more, a plurality of L's and a plurality of X's may be the same as or different from each other, and in a case where n represents 2 or more, a plurality of X's may be the same as or different from each other.

In Formula (B1), P represents a colorant structure, preferably at least one selected from the group consisting of a pyrrolopyrrole colorant structure, a diketo pyrrolopyrrole colorant structure, a quinacridone colorant structure, an anthraquinone colorant structure, a dianthraquinone colorant structure, a benzoisoindole colorant structure, a thiazine indigo colorant structure, an azo colorant structure, a quinophthalone colorant structure, a phthalocyanine colorant structure, a naphthalocyanine colorant structure, a dioxazine colorant structure, a perylene colorant structure, a perinone colorant structure, a benzimidazolone colorant structure, a benzothiazole colorant structure, a benzimidazole colorant structure, and a benzoxazole colorant structure, more preferably at least one selected from the group consisting of a pyrrolopyrrole colorant structure, a diketo pyrrolopyrrole colorant structure, a quinacridone colorant structure, and a benzimidazolone colorant structure, and still more preferably a pyrrolopyrrole colorant structure.

In addition, it is preferable that the colorant structure represented by P is a colorant structure derived from the near infrared absorbing compound and is a colorant structure having a skeleton common to the near infrared absorbing compound included in the near infrared absorber. For example, in a case where the pyrrolopyrrole compound is used as the near infrared absorbing compound, it is preferable that the colorant structure represented by P is a pyrrolopyrrole colorant structure.

In Formula (B1), L represents a single bond or a linking group. The linking group is preferably a group composed of 1 to 100 carbon atoms, 0 to 10 nitrogen atoms, 0 to 50 oxygen atoms, 1 to 200 hydrogen atoms, and 0 to 20 sulfur atoms, and may be unsubstituted or may further have a substituent.

In Formula (B1), X represents an acidic group, a basic group, a group having a salt structure, or a phthalimido group.

Specific examples of the pigment derivative include the following compounds. In addition, for example, compounds described in JP1981-118462A (JP-S56-118462A), JP1988-264674A (JP-S63-264674A), JP1989-217077A (JP-H1-217077A), JP1991-9961A (JP-H3-9961A), JP1991-26767A (JP-H3-26767A), JP1991-153780A (JP-H3-153780A), JP1991-45662A (JP-H3-45662A), JP1992-285669A (JP-H4-285669A), JP1994-145546A (JP-H6-145546A), JP1994-212088A (JP-H6-212088A), JP1996-240158A (JP-H6-240158A), JP1998-30063A (JP-H10-30063A), JP1998-195326A (JP-H10-195326A), "0086" to "0098" of WO2011/024896A, and "0063" to "0094" of WO2012/102399A can be used, the contents of which are incorporated herein by reference.

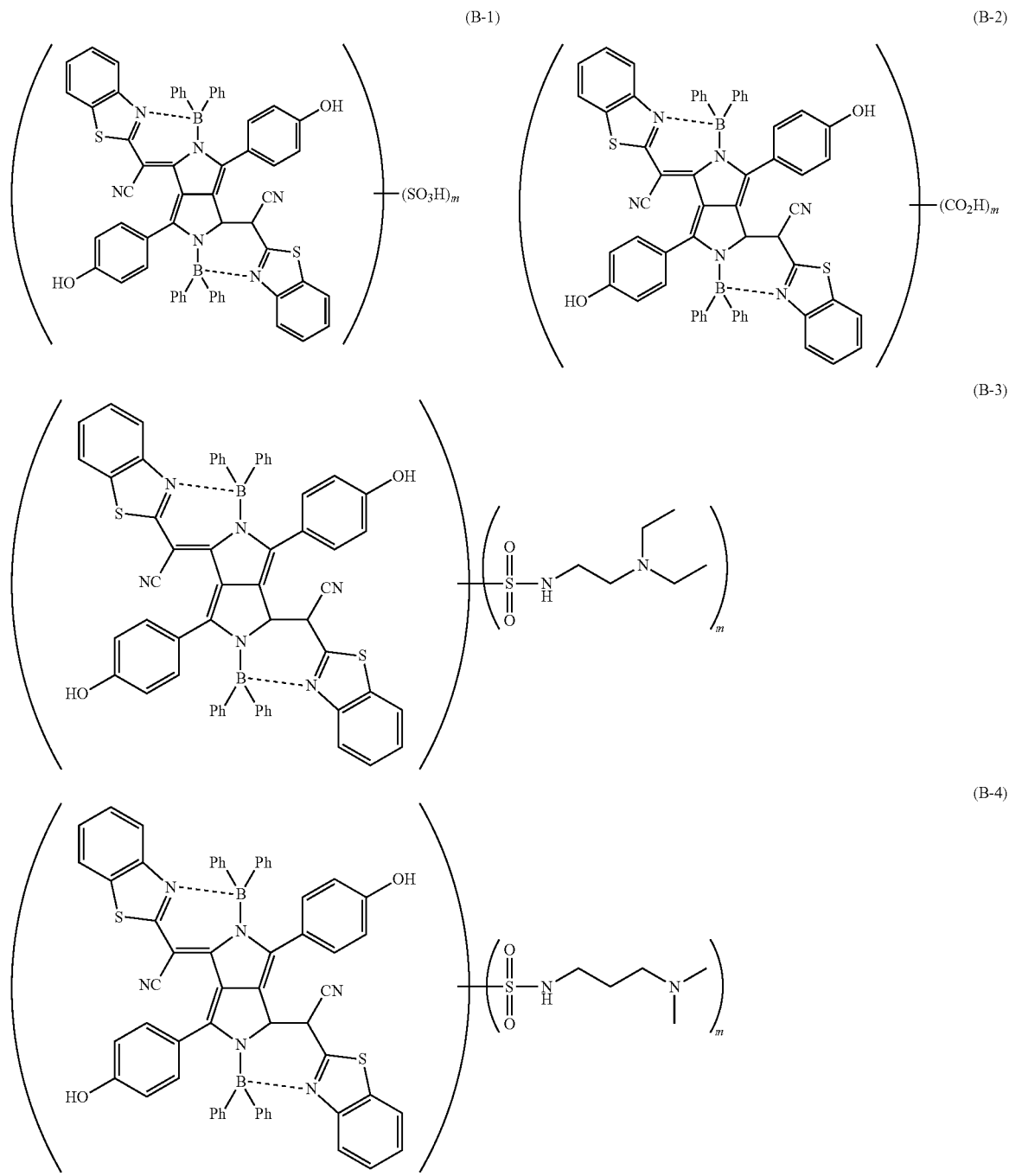

(B-5)
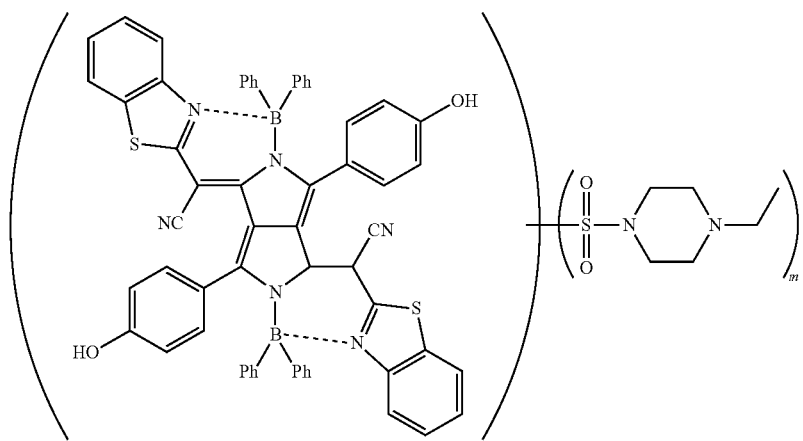
(B-6)
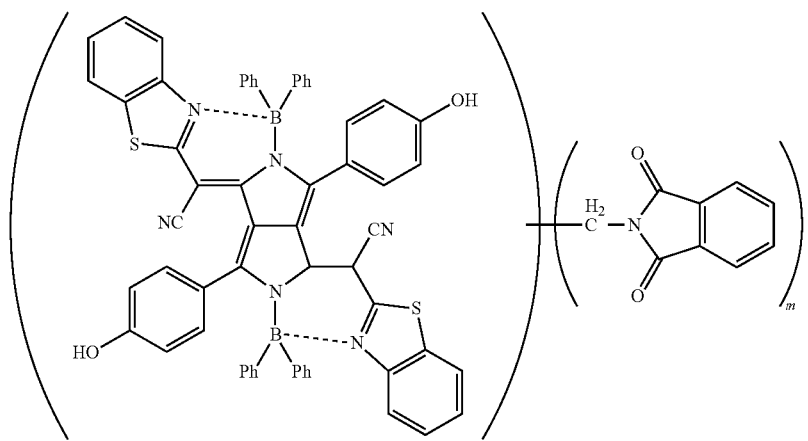
(B-7)
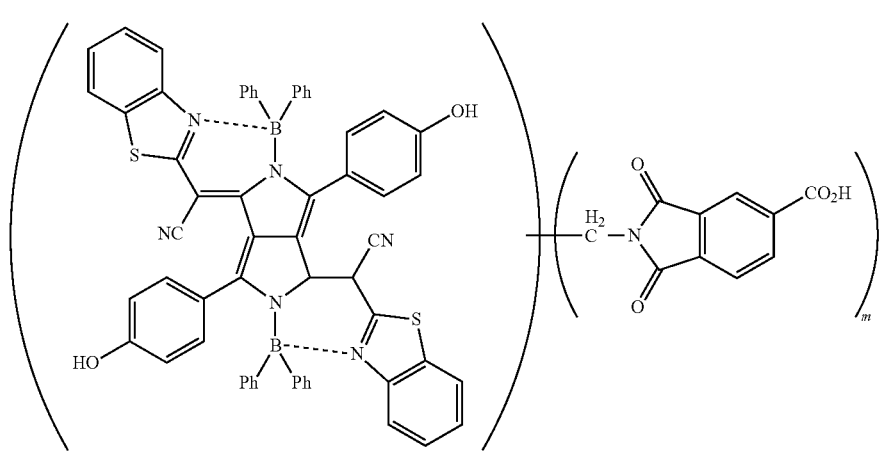

(B-8)
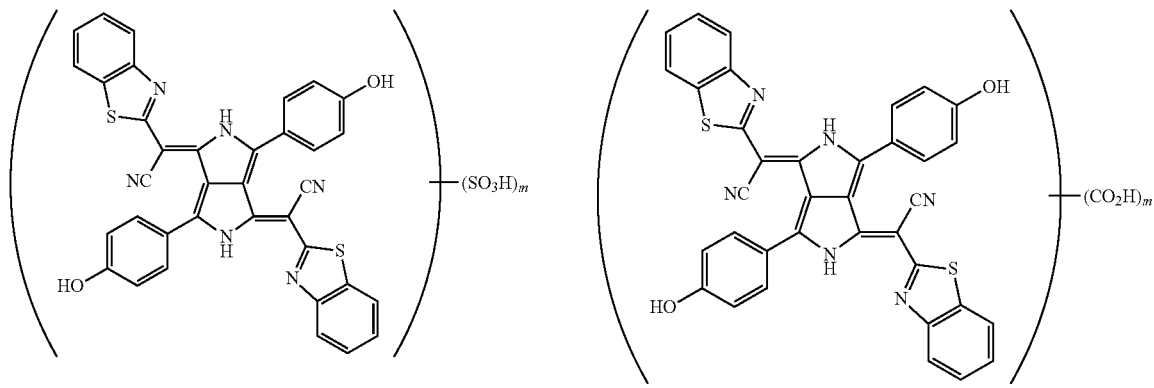
(B-9)
(B-10)
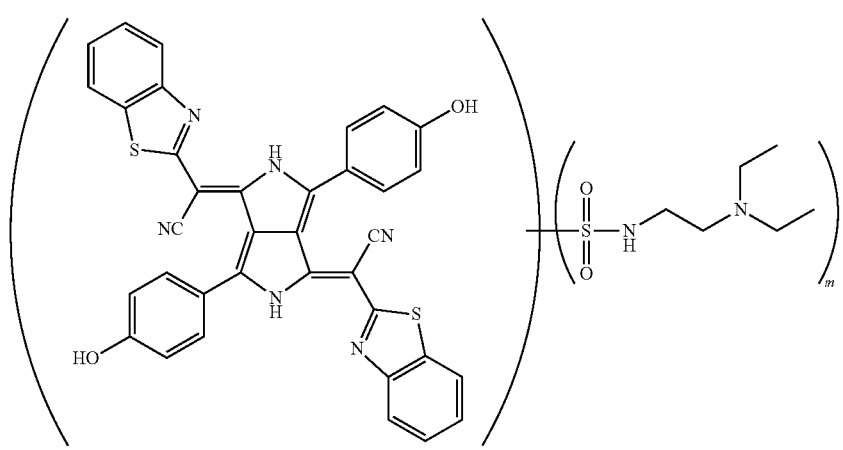
(B-11)
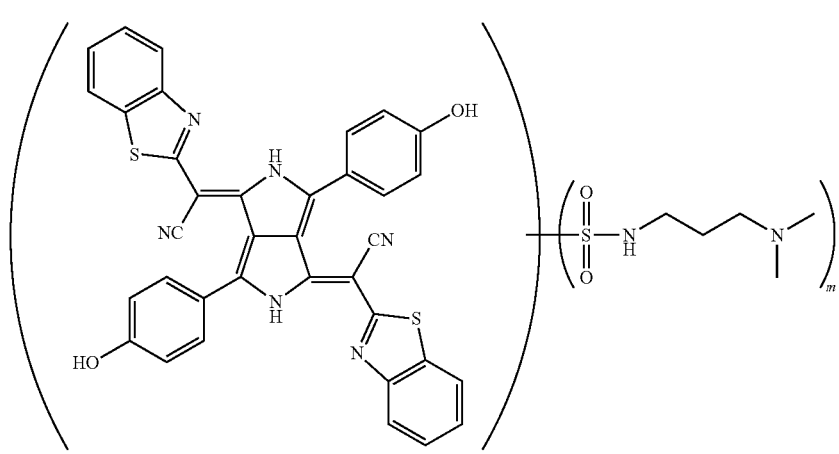

(B-12)
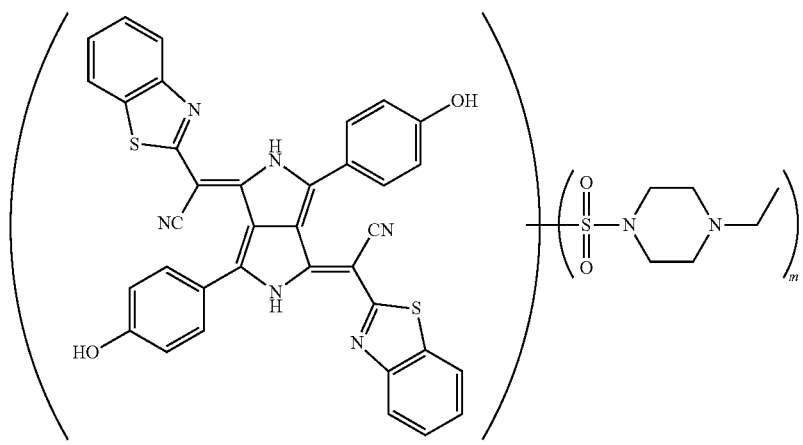
(B-13)
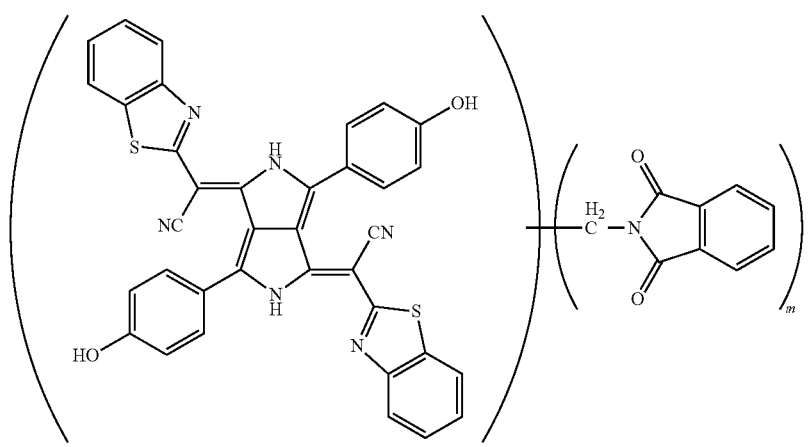
(B-14)
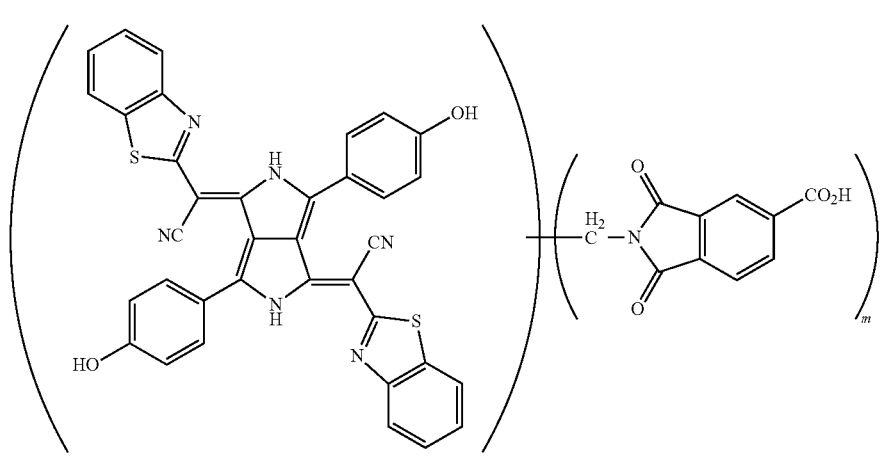

(B-15)
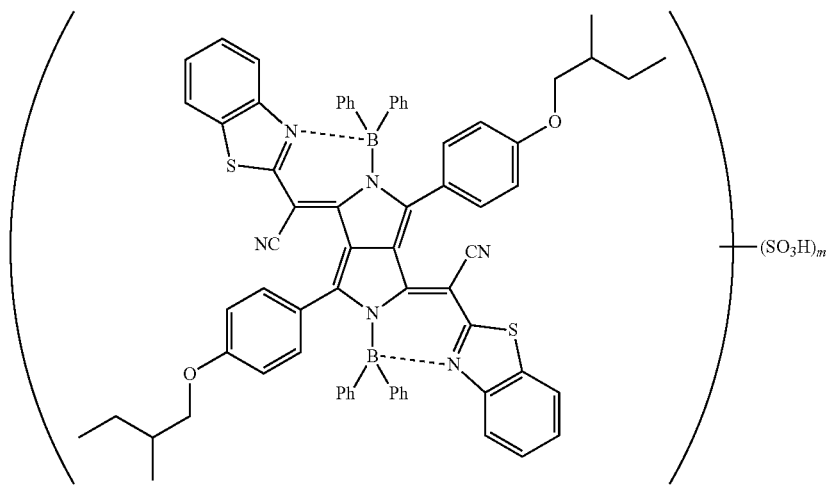
(B-16)
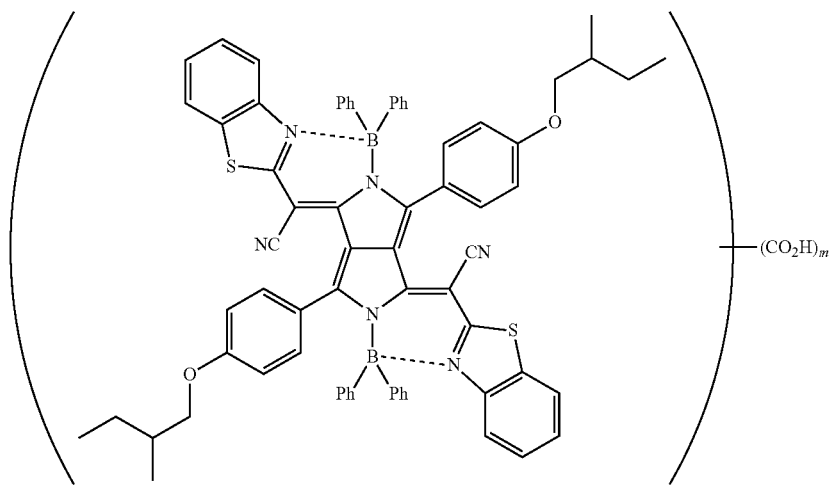
(B-17)
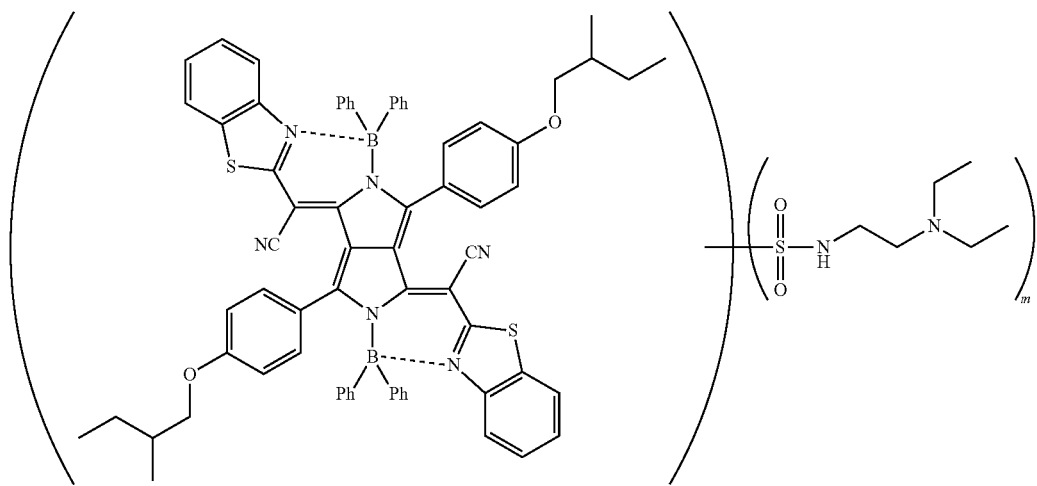

(B-18)
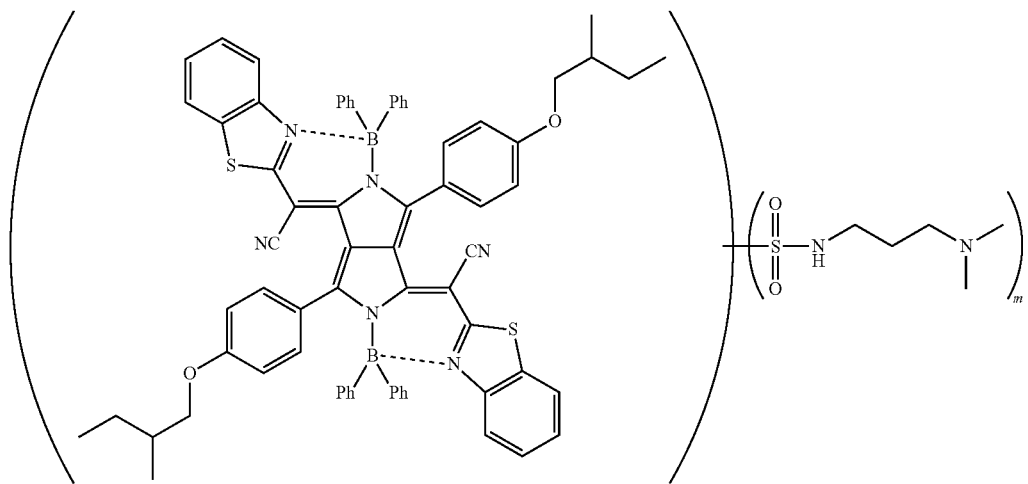
(B-19)
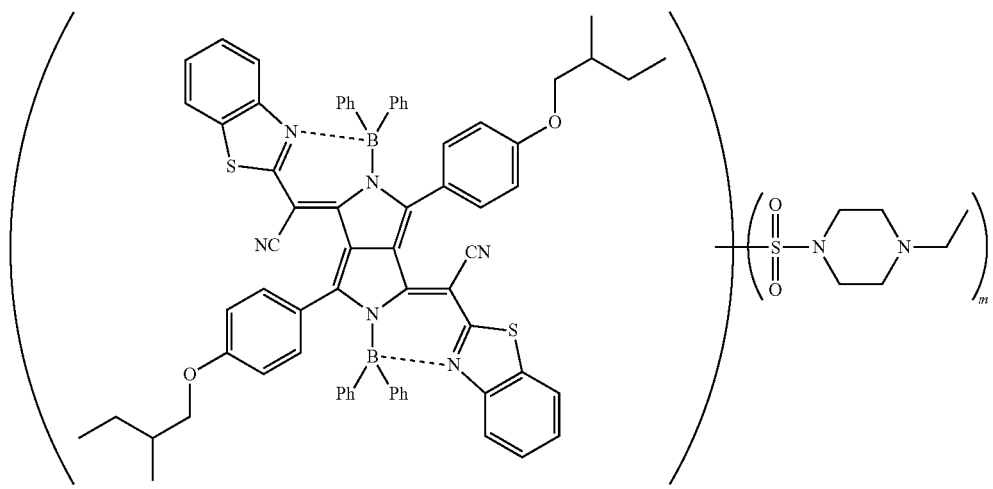
(B-20)
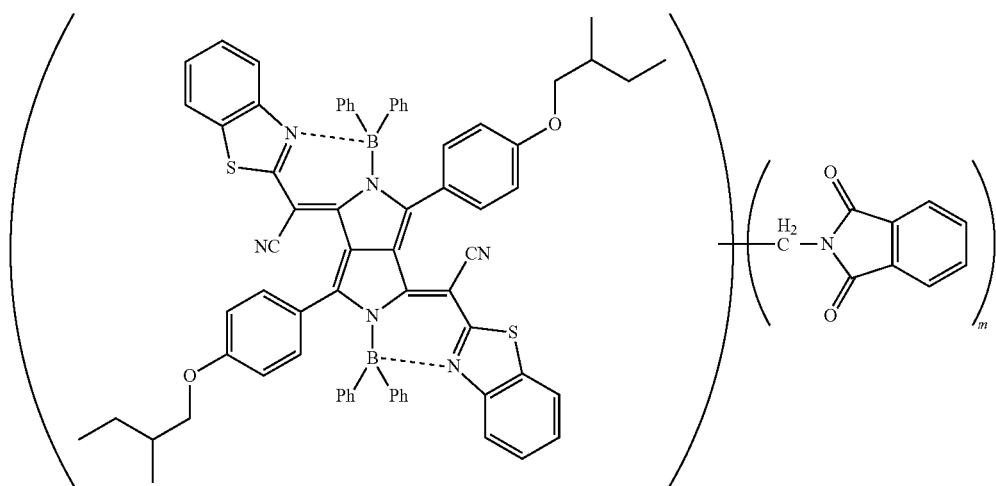

(B-21)
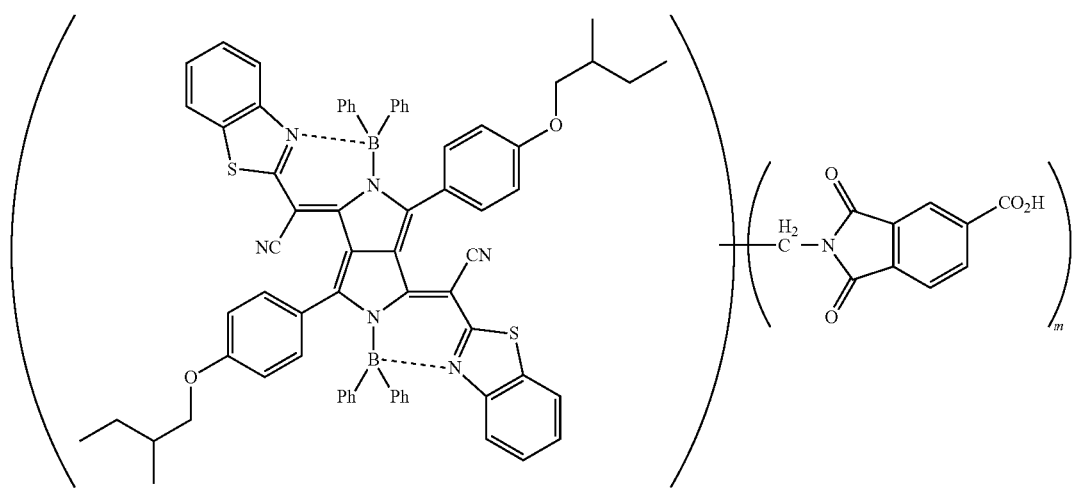
(B-30)
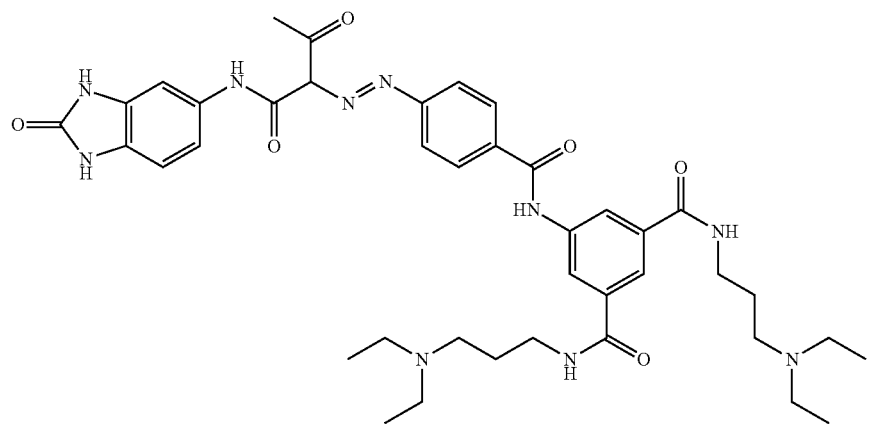
(B-35)
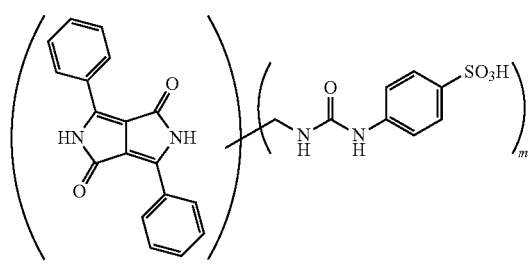
(B-36)
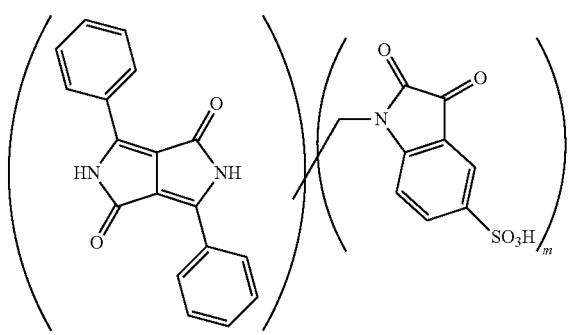
(B-37)
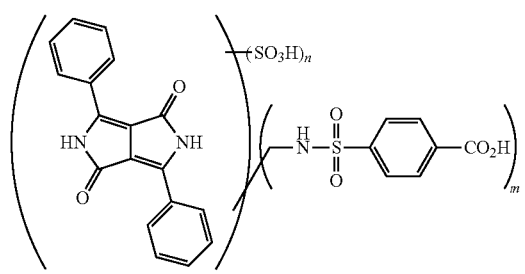
(B-38)
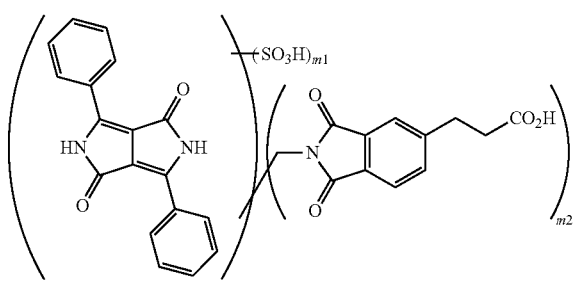

-continued
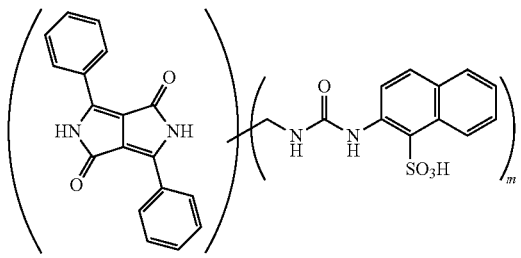
(B-39)
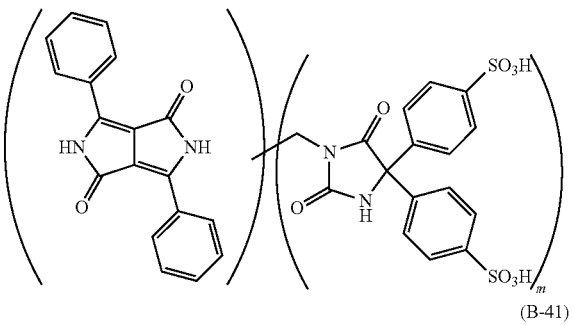
(B-40)
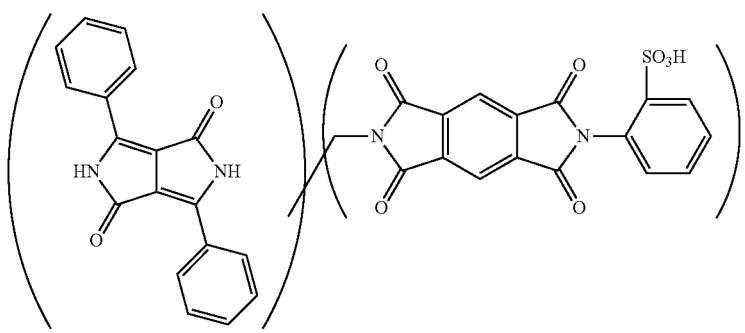
(B-41)
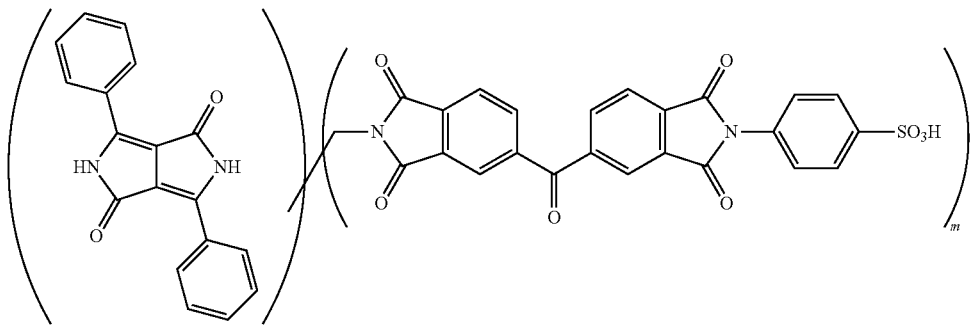
(B-42)
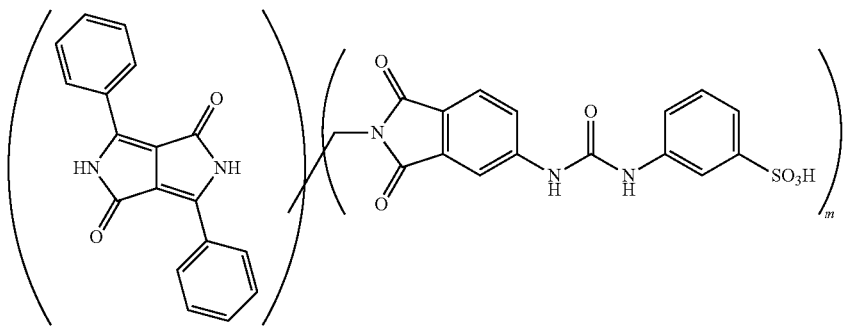
(B-43)
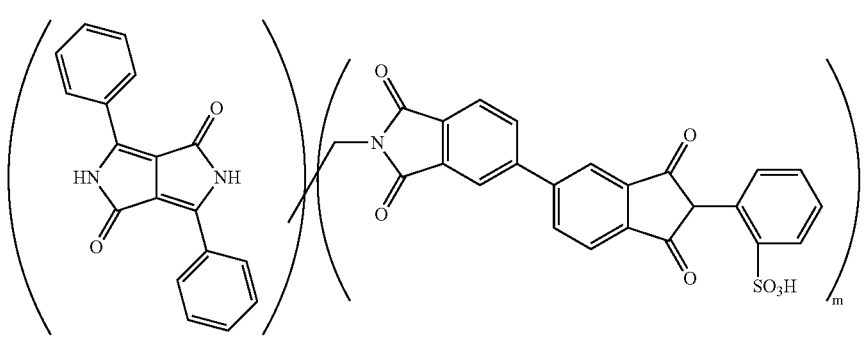
(B-44)

-continued
(B-45)
(B-46)
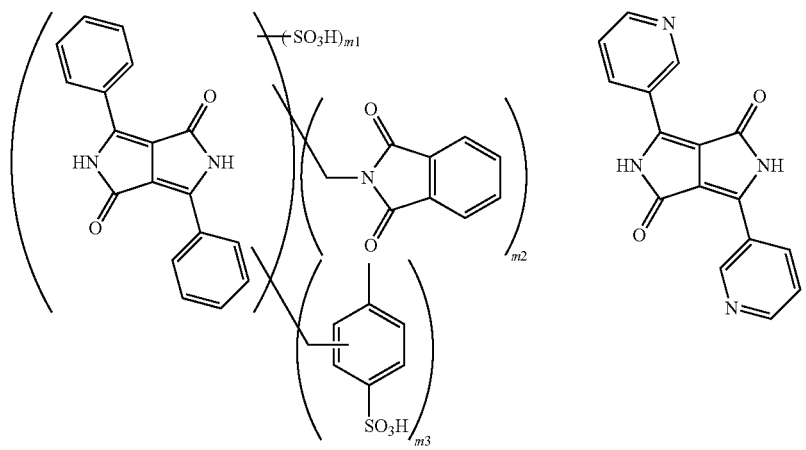
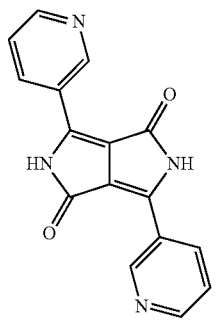
(B-47)
(B-48)
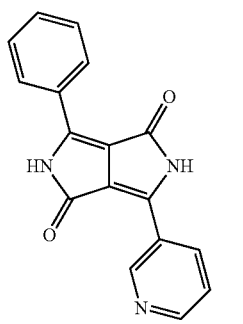
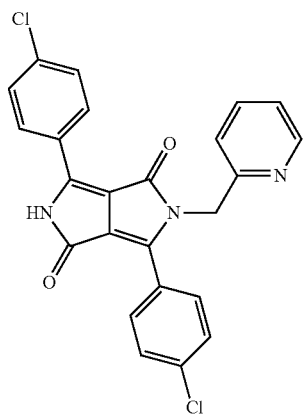
(B-61)
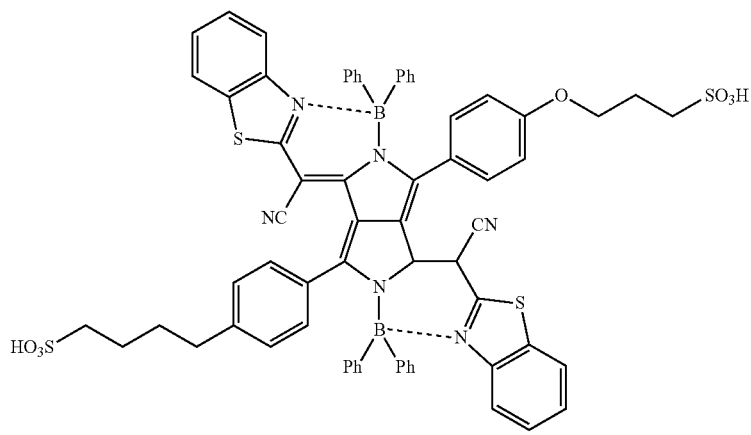

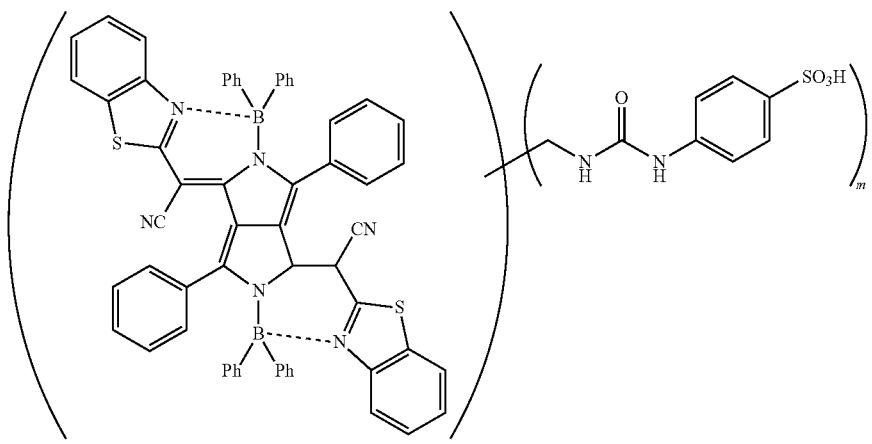

(B-62)

In a case where the composition according to the present invention includes the pigment derivative, the content of the pigment derivative is preferably 1 to 50 parts by mass with respect to 100 parts by mass of the pigment in the composition. The lower limit value is preferably 3 parts by mass or more and more preferably 5 parts by mass or more. The upper limit value is preferably 40 parts by mass or less and more preferably 30 parts by mass or less. In a case where the content of the pigment derivative is in the above-described range, the dispersibility of the pigment can be improved, and aggregation of particles can be effectively suppressed. As the pigment derivative, one kind or two or more kinds may be used. In a case where two or more pigment derivatives are used, it is preferable that the total content of the two or more pigment derivatives is in the above-described range.

<<Radically Polymerizable Compound>>>

The composition according to the present invention includes a radically polymerizable compound (hereinafter, also referred to as "polymerizable compound"). The polymerizable compound is not particularly limited as long as it is a compound that is polymerizable by the action of a radical. As the polymerizable compound, a compound having one or more radically polymerizable groups such as a group having an ethylenically unsaturated bond is preferable, a compound having two or more radically polymerizable groups is more preferable, and a compound having three or more radically polymerizable groups is still more preferable. The upper limit of the number of radically polymerizable groups is, for example, preferably 15 or less and more preferably 6 or less. Examples of the group having an ethylenically unsaturated bond include a vinyl group, a styryl group, a (meth)allyl group, and a (meth)acryloyl group. Among these, a (meth)acryloyl group is preferable.

The polymerizable compound may be in the form of a monomer or a polymer and is preferably a monomer. The molecular weight of the monomer type polymerizable compound is preferably 200 to 3000. The upper limit of the molecular weight is preferably 2500 or lower and more preferably 2000 or lower. The lower limit of the molecular weight is preferably 250 or higher and more preferably 300 or higher.

Examples of the polymerizable compound can be found in paragraphs "0033" and "0034" of JP2013-253224A, the content of which is incorporated herein by reference. As the compound, ethyleneoxy-modified pentaerythritol tetraacrylate (as a commercially available product, NK ESTER ATM-35E manufactured by Shin-Nakamura Chemical Co., Ltd.), dipentaerythritol triacrylate (as a commercially available product, KAYARAD D-330 manufactured by Nippon Kayaku Co., Ltd.), dipentaerythritol tetraacrylate (as a commercially available product, KAYARAD D-320 manufactured by Nippon Kayaku Co., Ltd.), dipentaerythritol penta (meth)acrylate (as a commercially available product, KAYARAD D-310 manufactured by Nippon Kayaku Co., Ltd.), dipentaerythritol hexa(meth)acrylate (as a commercially available product, KAYARAD DPHA manufactured by Nippon Kayaku Co., Ltd., A-DPH-12E, manufactured by Shin-Nakamura Chemical Co., Ltd.), or a structure in which the (meth)acryloyl group is bonded through an ethylene glycol or a propylene glycol residue is preferable. In addition, oligomers of the above-described examples can be used. In addition, the compound having an ethylenically unsaturated bond can be found in the description of a polymerizable compound in paragraphs "0034" to "0038" of JP2013-253224A, the content of which is incorporated herein by reference. Examples of the compound having an ethylenically unsaturated bond include a polymerizable monomer in paragraph "0477" of JP2012-208494A (corresponding to paragraph "0585" of US Patent App. No. 2012/0235099A), the content of which is incorporated herein by reference.

In addition, diglycerin ethylene oxide (EO)-modified (meth)acrylate (as a commercially available product, M-460 manufactured by Toagosei Co., Ltd.) is preferable. Pentaerythritol tetraacrylate (A-TMMT manufactured by Shin-Nakamura Chemical Co., Ltd.) or 1,6-hexanediol diacrylate (KAYARAD HDDA manufactured by Nippon Kayaku Co., Ltd.) is also preferable. Oligomers of the above-described examples can be used. For examples, RP-1040 (manufactured by Nippon Kayaku Co., Ltd.) is used.

The polymerizable compound may have an acid group such as a carboxyl group, a sulfonate group, or a phosphate group. For example, an ethylenically unsaturated compound having an acid group can be preferably used. The polymerizable compound having an acid group can be obtained, for example, using a method of (meth)acrylating some hydroxyl groups of a polyfunctional alcohol and adding an acid anhydride to the remaining hydroxyl group to obtain a carboxyl group. In addition, an acid group may be introduced into the polymerizable compound by causing a nonaromatic carboxylic anhydride or the like to react with the hydroxyl group. Specific examples of the nonaromatic carboxylic anhydride include tetrahydrophthalic anhydride, alkylated tetrahydrophthalic anhydride, hexahydrophthalic anhydride, alkylated hexahydrophthalic anhydride, succinic anhydride, and maleic anhydride.

As the polymerizable compound having an acid group, an ester of an aliphatic polyhydroxy compound and an unsaturated carboxylic acid is preferable, a polymerizable compound to which an acid group is added by causing a nonaromatic carboxylic anhydride to react with an unreacted hydroxyl group of an aliphatic polyhydroxy compound is more preferable, and a compound in which the aliphatic polyhydroxy compound in the above-described ester is at least one of pentaerythritol or dipentaerythritol is still more preferable. Examples of a commercially available product of the polymerizable compound having an acid group include: ARONIX M-510 and M-520 (manufactured by Toagosei Co., Ltd.); and CBX-0 and CBX-1 (manufactured by Shin-Nakamura Chemical Co., Ltd.). The acid value of the polymerizable compound having an acid group is preferably 0.1 to 40 mgKOH/g. The lower limit is preferably 5 mgKOH/g or higher. The upper limit is preferably 30 mgKOH/g or lower.

The polymerizable compound having an acid group is preferably a compound represented by the following Formula (1).

$$(A)_{n1}\text{-}L\text{-}(Ac)_{n2} \qquad \text{Formula (1)}$$

(In Formula (1), A represents a hydroxyl group, L represents a (n1+n2)-valent group at least including a carbon atom and a hydrogen atom, Ac represents a (meth)acryloyloxy group, n1 represents an integer of 1 or more, and n2 represents an integer of 1 or more.)

Examples of the acid group represented by A include a carboxyl group, a sulfo group, and a phosphate group. Among these, a carboxyl group is preferable.

L represents a (n1+n2)-valent group at least including a carbon atom and a hydrogen atom. Examples of the group represented by L include —CH$_2$—, —O—, —S—, —C(=O)—, —COO—, —NR—, —CONR—, —OCO—, —SO—, —SO$_2$—, and a group which is formed by two or more of the above-described groups being linked to each other. Here, R's each independently represents a hydrogen atom, an alkyl group, an aryl group, or a heteroaryl group. It is preferable that L includes a group including at least —CH$_2$—. The number of carbon atoms constituting L is preferably 3 to 100 and more preferably 6 to 50.

n1 represents preferably 1 or 2 and more preferably 1. n2 represents preferably 1 to 6 and more preferably 2 to 5.

The polymerizable compound having an acid group is preferably a compound represented by the following Formula (11) or (12).

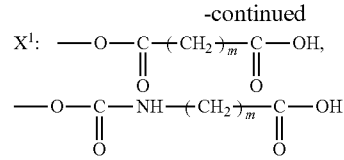

Formula (11)

In Formula (11), $R^1$, $T^1$, and $X^1$ each independently represent any one of the following groups represented by $R^1$, $T^1$, or $X^1$. n represents an integer of 0 to 14.

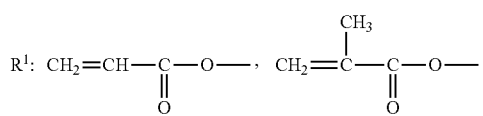

$R^1$:

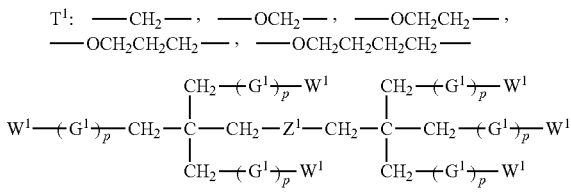

-continued $X^1$:

m represents an integer of 1 to 8

Formula (12)

$T^1$: —CH$_2$—, —OCH$_2$—, —OCH$_2$CH$_2$—, —OCH$_2$CH$_2$CH$_2$—, —OCH$_2$CH$_2$CH$_2$CH$_2$—

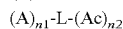

In Formula (12), $Z^1$ and $G^1$ each independently represent any one of the following groups represented by $Z^1$ or $G^1$. $W^1$ has the same definition as the group represented by $R^1$ or $X^1$ in Formula (11). Among six $W^1$'s, three or more $W^1$'s represent the same group as the group represented by $R^1$, and one or more $W^1$'s represent the same group as the group represented by $X^1$. p represents an integer of 0 to 14.

$Z^1$:

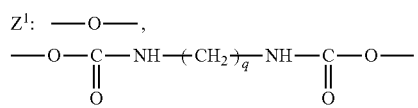

q represents an interger of 1 to 8

$G^1$: —CH$_2$—, —OCH$_2$—, —OCH$_2$CH$_2$—, —OCH$_2$CH$_2$CH$_2$—, —OCH$_2$CH$_2$CH$_2$CH$_2$—

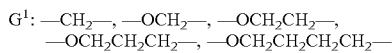

Among the compounds represented by Formula (11) or Formula (12), at least one of a pentaerythritol derivative or a dipentaerythritol derivative is more preferably used.

In addition, a compound having a caprolactone structure is also preferable as the polymerizable compound. The compound having a caprolactone structure is not particularly limited as long as it has a caprolactone structure in the molecule thereof, and examples thereof include ε-caprolactone-modified polyfunctional (meth)acrylate obtained by esterification of a polyhydric alcohol, (meth)acrylic acid, and s-caprolactone, the polyhydric alcohol being, for example, trimethylolethane, ditrimethylolethane, trimethylolpropane, ditrimethylolpropane, pentaerythritol, dipentaerythritol, tripentaerythritol, glycerin, diglycerol, or trimethylolmelamine. Examples of the compound having a caprolactone structure can be found in paragraphs "0042" to "0045" of JP2013-253224A, the content of which is incorporated herein by reference. Examples of the compound having a caprolactone structure include: DPCA-20, DPCA-30, DPCA-60, and DPCA-120 which are commercially available as KAYARADDPCA series manufactured by Nippon Kayaku Co., Ltd.; SR-494 (manufactured by Sartomer) which is a tetrafunctional acrylate having four ethyleneoxy chains; and TPA-330 which is a trifunctional acrylate having three isobutyleneoxy chains.

As the polymerizable compound, a urethane acrylate described in JP1973-41708B (JP-S48-41708B), JP1976-37193A (JP-S51-37193A), JP1990-32293B (JP-H2-

32293B), or JP1990-16765B (JP-H2-16765B), or a urethane compound having a ethylene oxide skeleton described in JP1983-49860B (JP-S58-49860B), JP1981-17654B (JP-S56-17654B), JP1987-39417B (JP-S62-39417B), or JP1987-39418B (JP-S62-39418B) is also preferable. In addition, the compound which has a group having an ethylenically unsaturated bond can be obtained by using an addition-polymerizable compound having an amino structure or a sulfide structure in the molecules described in JP1988-277653A (JP-S63-277653A), JP1988-260909A (JP-S63-260909A), or JP1989-105238A (JP-H1-105238A).

Examples of a commercially available product of the polymerizable compound include URETHANE OLIGOMER UAS-10 and UAB-140 (manufactured by Sanyo-Kokusaku Pulp Co., Ltd.), UA-7200 (manufactured by Shin-Nakamura Chemical Co., Ltd.), DPHA-40H (manufactured by Nippon Kayaku Co., Ltd.), and UA-306H, UA-306T, UA-3061, AH-600, T-600, AI-600, and LIGHT ACRYLATE DCP-A (manufactured by Kyoeisha Chemical Co., Ltd.).

In addition, as the polymerizable compound, an isocyanuric acid ethylene oxide (EO)-modified monomer such as ARONIX M-215, M-305, M-313, and M-315 (manufactured by Toagosei Co., Ltd.), SR-368 (manufactured by Sartomer), or A-9300 (manufactured by Shin-Nakamura Chemical Co., Ltd.) can be preferably used.

In the composition according to the present invention, the content of the polymerizable compound is preferably 10 to 35 mass % with respect to the total solid content of the composition. The lower limit is preferably 12 mass % or higher and more preferably 14 mass % or higher. The upper limit is preferably 33 mass % or lower and more preferably 30 mass % or lower.

<<Photoradical Polymerization Initiator>>

The composition according to the present invention includes a photoradical polymerization initiator (hereinafter, also referred to as "photopolymerization initiator"). The photopolymerization initiator is not particularly limited and can be appropriately selected from well-known photopolymerization initiators. For example, a photopolymerization initiator having photosensitivity to light in a range from the ultraviolet range to the visible range is preferable. It is preferable that the photopolymerization initiator is a photoradical polymerization initiator. In addition, it is preferable that the photopolymerization initiator is at least one compound having a molar absorption coefficient of at least 50 in a range of about 300 nm to 800 nm (preferably 330 nm to 500 nm).

Examples of the photopolymerization initiator include: a halogenated hydrocarbon derivative (having, for example, a triazine skeleton or an oxadiazole skeleton); an acylphosphine compound such as acylphosphine oxide; an oxime compound such as hexaarylbiimidazole or an oxime derivative; an organic peroxide, a thio compound, a ketone compound, an aromatic onium salt, keto oxime ether, an aminoacetophenone compound, and hydroxyacetophenone. Examples of the halogenated hydrocarbon compound having a triazine skeleton include a compound described in Bull. Chem. Soc. Japan, 42, 2924 (1969) by Wakabayshi et al., a compound described in Great Britain Patent No. 1388492, a compound described in JP1978-133428A (JP-S53-133428A), a compound described in Great German Patent No. 3337024, a compound described in J. Org. Chem.; 29, 1527 (1964) by F. C. Schaefer et al., a compound described in JP1987-58241A (JP-S62-58241A), a compound described in JP1993-281728A (JP-H5-281728A), a compound described in JP1993-34920A (JP-S5-34920A), and a compound described in U.S. Pat. No. 4,212,976A (for example, a compound having an oxadiazole skeleton).

In addition, from the viewpoint of exposure sensitivity, a compound selected from the group consisting of a trihalomethyltriazine compound, a benzyldimethylketanol compound, an α-hydroxy ketone compound, an α-amino ketone compound, an acylphosphine compound, a phosphine oxide compound, a metallocene compound, an oxime compound, a triarylimidazole dimer, an onium compound, a benzothiazole compound, a benzophenone compound, an acetophenone compound and a derivative thereof, a cyclopentadiene-benzene-iron complex and a salt thereof, and a halomethyl oxadiazole compound, a 3-aryl-substituted coumarin compound is preferable. In addition, for example, 2,2'-bis(2-chlorophenyl)-4,4',5,5'-tetraphenyl-1,2'-biimidazole (for example, as a commercially available product, B-CIM, manufactured by Hodogaya Chemical Co., Ltd.) can also be used.

Examples of the α-aminoketone compound include a compound represented by the following Formula (AK-1).

(AK-1)

In the formula, Ar represents a phenyl group which is substituted with $-SR^{13}$ or $-N(R^{7E})(R^{8E})$, and $R^{13}$ represents a hydrogen atom or an alkyl group.

$R^{1D}$ and $R^{2D}$ each independently represent an alkyl group having 1 to 8 carbon atoms. $R^{1D}$ and $R^{2D}$ are bonded to each other to form an alkylene group having 2 to 9 carbon atoms.

The alkyl group represented by $R^{1D}$ and $R^{2D}$ may be linear, branched, or cyclic and is preferably linear or branched.

The alkyl group represented by $R^{1D}$ and $R^{2D}$ may be unsubstituted or may have a substituent. Examples of the substituent include an aryl group, a heterocyclic group, a nitro group, a cyano group, a halogen atom, $-OR^{Y1}$, $-SR^{Y1}$, $-COR^{Y1}$, $-COOR^{Y1}$, $-OCOR^{Y1}$, $-NR^{Y1}R^{Y2}$, $-NHCOR^{Y1}$, $-CONR^{Y1}R^{Y2}$, $-NHCONR^{Y1}R^{Y2}$, $-NHCOOR^{Y1}$, $-SO_2R^{Y1}$, $-SO_2OR^{Y1}$, and $-NHSO_2R^{Y1}$. $R^{Y1}$ and $R^{Y2}$ each independently represent a hydrogen atom, an alkyl group, an aryl group, or a heterocyclic group. In particular, it is preferable that the substituent of the alkyl group represented by $R^{1D}$ and $R^{2D}$ is an aryl group. It is more preferable that one of $R^{1D}$ and $R^{2D}$ represents an unsubstituted alkyl group and the other one of $R^{1D}$ and $R^{2D}$ represents an alkyl group which is substituted with an aryl group.

Examples of the halogen atom include a fluorine atom, a chlorine atom, a bromine atom, and an iodine atom.

The number of carbon atoms in the alkyl group represented by $R^{Y1}$ and $R^{Y2}$ is preferably 1 to 20. The alkyl group may be linear, branched, or cyclic and is preferably linear or branched.

The number of carbon atoms in the aryl group as the substituent and the aryl group represented by $R^{Y1}$ and $R^{Y2}$ is preferably 6 to 20, more preferably 6 to 15, and still more preferably 6 to 10. The aryl group may be a monocycle or a fused ring.

It is preferable that the heterocyclic group represented by $R^{Y1}$ and $R^{Y2}$ is a 5-membered or 6-membered ring. The heterocyclic group may be a monocycle or a fused ring. The number of carbon atoms constituting the heterocyclic group is preferably 3 to 30, more preferably 3 to 18, and still more preferably 3 to 12. The number of heteroatoms constituting the heterocyclic group is preferably 1 to 3. It is preferable that the heteroatoms constituting the heterocyclic group are a nitrogen atom, an oxygen atom, or a sulfur atom.

$R^{3D}$ and $R^{4D}$ each independently represent a hydrogen atom, an alkyl group having 1 to 12 carbon atoms, an alkyl group having 2 to 4 carbon atoms which is substituted with an alkoxy group having 1 to 4 carbon atoms, or an alkenyl group having 3 to 5 carbon atoms. $R^{3D}$ and $R^{4D}$ may be bonded to each other to form a ring.

$R^{7E}$ and $R^{8E}$ each independently represent a hydrogen atom, an alkyl group having 1 to 12 carbon atoms, an alkyl group having 2 to 4 carbon atoms which is substituted with an alkoxy group having 1 to 4 carbon atoms, or an alkenyl group having 3 to 5 carbon atoms. $R^{7E}$ and $R^{8E}$ may be bonded to each other to form a ring.

Examples of the compound represented by Formula (AK-1) include 2-methyl-1-phenyl-2-morpholinopropan-1-one, 2-methyl-1-[4-(hexyl)phenyl]-2-morpholinopropan-1-one, 2-ethyl-2-dimethylamino-1-(4-morpholinophenyl)-butanone-1, 2-benzyl-2-dimethylamino-1-(4-morpholinophenyl)-butanone-1, and 2-(dimethylamino)-2-[(4-methylphenyl)methyl]-1-[4-(4-morpholinyl)phenyl]-1-butanone.

Examples of a commercially available product of the α-aminoketone compound include IRGACURE 907, IRGACURE 369, and IRGACURE 379 (trade name, all of which are manufactured by BASF SE).

As the photopolymerization initiator, an α-hydroxyketone compound or an acylphosphine compound can also be preferably used. As the α-hydroxyketone compound, for example, IRGACURE-184, DAROCUR-1173, IRGACURE-500, IRGACURE-2959, or IRGACURE-127 (trade name, all of which are manufactured by BASF SE) can be used. As the acylphosphine compound, IRGACURE 819, or IRGACURE TPO (trade name, all of which are manufactured by BASF SE) which is a commercially available product can be used.

As the photopolymerization initiator, an oxime compound can also be preferably used. Specific examples of the oxime compound include a compound described in JP2001-233842A, a compound described in JP2000-80068A, a compound described in JP2006-342166A, and a compound described in JP2016-21012A.

Examples of the oxime compound which can be preferably used in the present invention include 3-benzoyloxy-iminobutane-2-one, 3-acetoxyiminobutane-2-one, 3-propionyloxyiminobutane-2-one, 2-acetoxyiminopentane-3-one, 2-acetoxyimino-1-phenylpropane-1-one, 2-benzoyloxy-imino-1-phenylpropane-1-one, 3-(4-toluene sulfonyloxy) iminobutane-2-one, and 2-ethoxycarbonyloxyimino-1-phenylpropane-1-one. In addition, examples of the oxime compound include a compound described in J.C.S. Perkin II (1979), pp. 1653-1660, J.C.S. Perkin II (1979), pp. 156-162 and Journal of Photopolymer Science and Technology (1995), pp. 202-232, or JP2000-66385A; and a compound described in JP2000-80068A, JP2004-534797A, or JP2006-342166A. As a commercially available product of the oxime compound, IRGACURE-OXE01 (manufactured by BASF SE) and IRGACURE-OXE02 (manufactured by BASF SE) can also be preferably used. In addition, TR-PBG-304 (manufactured by Changzhou Tronly New Electronic Materials Co., Ltd.), and ADEKA ARKLS NCI-930 (manufactured by Adeka Corporation) can be used.

In addition, in addition to the above-described oxime compounds, for example, a compound described in JP2009-519904A in which oxime is linked to an N-position of a carbazole ring, a compound described in U.S. Pat. No. 7,626,957B in which a hetero substituent is introduced into the benzophenone site, a compound described in JP2010-15025A or US Patent App. No. 2009/292039A in which a nitro group is introduced into a colorant site, a ketoxime compound described in WO2009/131189A, a compound described in U.S. Pat. No. 7,556,910B having a triazine skeleton and an oxime skeleton in the same molecule, a compound described in JP2009-221114A having an absorption maximum at 405 nm and having excellent sensitivity to a light source of g-rays, or a compound described in paragraphs "0.076" to "0079" of JP2014-137466A may be used.

Other preferable examples of the oxime compound can be found in paragraphs "0274" to "0275" of JP2013-29760A, the content of which is incorporated herein by reference.

Specifically, as the oxime compound, a compound represented by the following Formula (OX-1) is preferable. In the oxime compound, an N—O bond of oxime may form an (E) isomer, a (Z) isomer, or a mixture of an (E) isomer and a (Z) isomer.

(OX-1)

In Formula (OX-1), R and B each independently represent a monovalent substituent, A represents a divalent organic group, and Ar represents an aryl group.

In Formula (OX-1), it is preferable that the monovalent substituent represented by R is a monovalent non-metal atomic group.

Examples of the monovalent non-metal atomic group include an alkyl group, an aryl group, an acyl group, an alkoxycarbonyl group, an aryloxycarbonyl group, a heterocyclic group, an alkylthiocarbonyl group, and an arylthiocarbonyl group. In addition, these groups may have one or more substituents. In addition, the above-described substituent may have another substituent.

Examples of the substituent include a halogen atom, an aryloxy group, an alkoxycarbonyl group or aryloxycarbonyl group, an acyloxy group, an acyl group, an alkyl group, and an aryl group.

In Formula (OX-1), as the monovalent substituent represented by B, an aryl group, a heterocyclic group, an arylcarbonyl group, or a heterocyclic carbonyl group is preferable.

These groups may have one or more substituents. Examples of the substituent are as described above.

In Formula (OX-1), as the divalent organic group represented by A, an alkylene group having 1 to 12 carbon atoms, a cycloalkylene group, or an alkynylene group is preferable. These groups may have one or more substituents. Examples of the substituent are as described above.

In the present invention, an oxime compound having a fluorene ring can also be used as the photopolymerization initiator. Specific examples of the oxime compound having a fluorene ring include a compound described in JP2014-137466A. The content is incorporated herein by reference.

In the present invention, an oxime compound having a fluorine atom can also be used as the photopolymerization initiator. Specific examples of the oxime compound having a fluorine atom include a compound described in JP2010-

262028A, Compound 24 and 36 to 40 described in JP2014-500852A, and Compound (C-3) described in JP2013-164471A. The content is incorporated herein by reference.

In the present invention, as the photopolymerization initiator, an oxime compound having a nitro group can be used. It is preferable that the oxime compound having a nitro group is a dimer. Specific examples of the oxime compound having a nitro group include compounds described in paragraphs "0031" to "0047" of JP2013-114249A and paragraphs "0008" to "0012" and "0070" to "0079" of JP2014-137466A, compounds described in paragraphs "0007" to 0025" of JP4223071B, and ADEKA ARKLS NCI-831 (manufactured by Adeka Corporation).

Hereinafter, specific examples of the oxime compound which are preferably used in the present invention are shown below, but the present invention is not limited thereto.

(C-1)

(C-2)

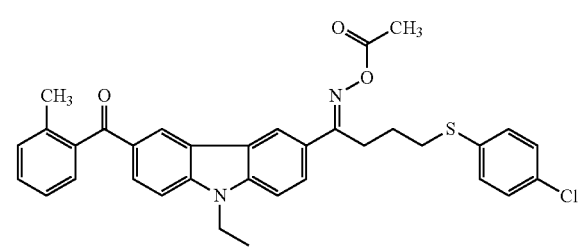

(C-3)

(C-4)

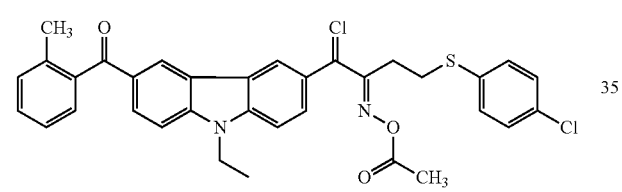

(C-5)

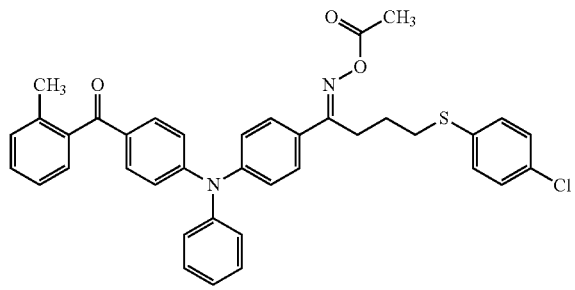

(C-6)

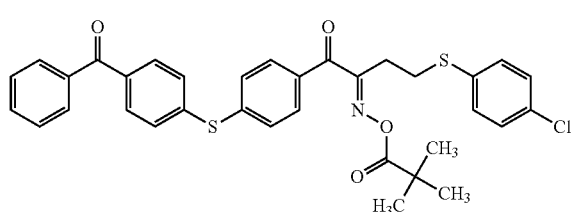

(C-7)

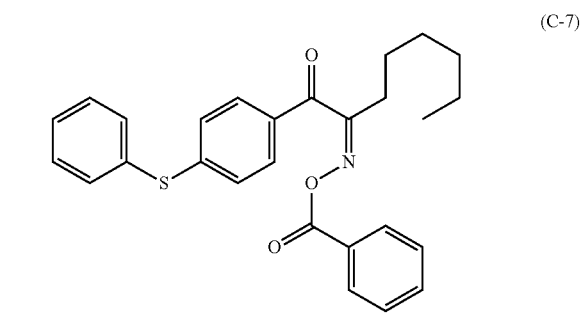

(C-8)

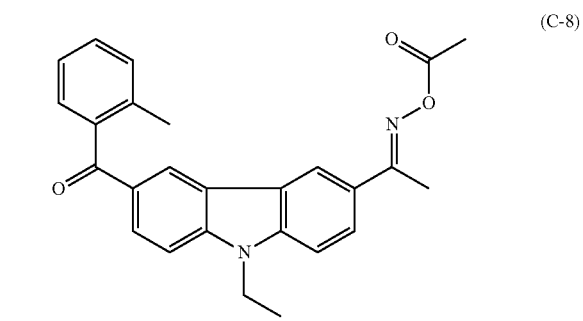

(C-9)

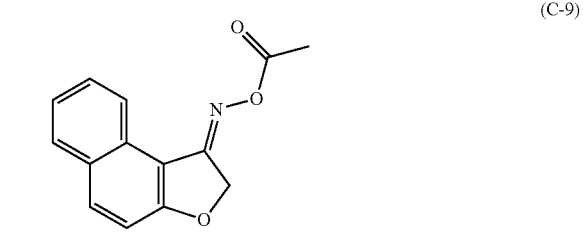

-continued

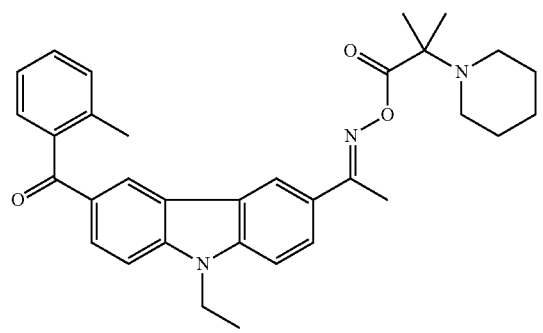
(C-10)

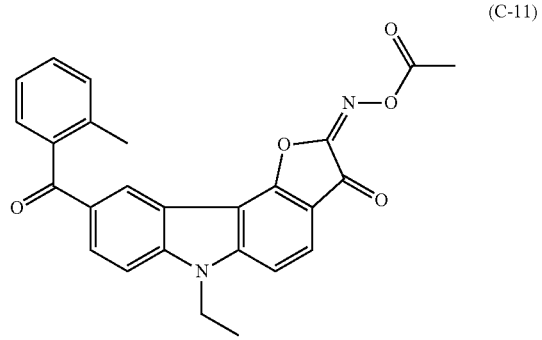
(C-11)

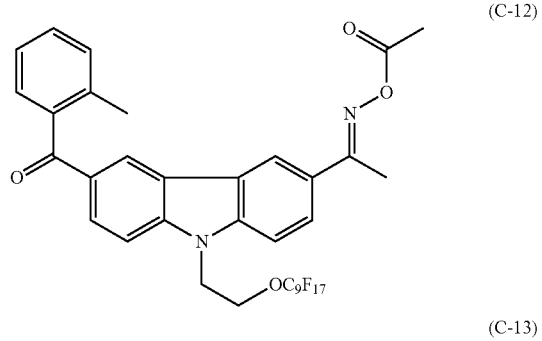
(C-12)

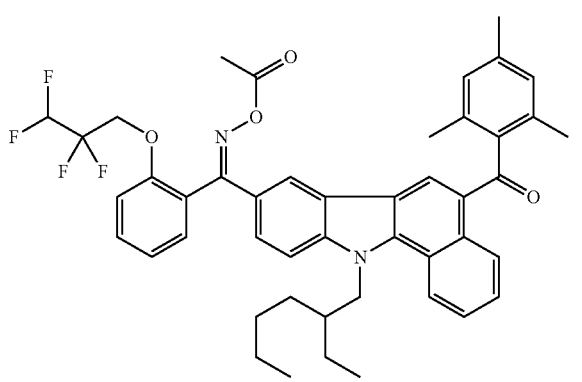
(C-13)

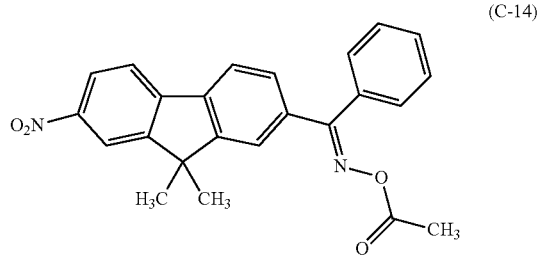
(C-14)

As the oxime compound, a compound having an absorption maximum in a wavelength range of 350 nm to 500 nm is preferable, a compound having an absorption maximum in a wavelength range of 360 nm to 480 nm is more preferable, and a compound having a high absorbance at 365 nm and 405 nm is still more preferable.

The molar absorption coefficient of the oxime compound at 365 nm or 405 nm is preferably 1000 to 300000, more preferably 2000 to 300000, and still more preferably 5000 to 200000 from the viewpoint of sensitivity. The molar absorption coefficient of the compound can be measured using a well-known method. Specifically, for example, it is preferable that the molar absorption coefficient of the compound is measured using an ultraviolet-visible spectrophotometer (Cary-5 spectrophotometer, manufactured by Varian Medical Systems, Inc.) and an ethyl acetate solvent at a concentration of 0.01 g/L.

It is preferable that the photopolymerization initiator includes an oxime compound and an α-aminoketone compound. By using the oxime compound and the α-aminoketone compound in combination, the developability is improved, and a pattern having excellent rectangularity is likely to be formed. In a case where the oxime compound and the α-aminoketone compound are used in combination, the content of the α-aminoketone compound is preferably 50 to 600 parts by mass and more preferably 150 to 400 parts by mass with respect to 100 parts by mass of the oxime compound.

The content of the photopolymerization initiator is preferably 0.1 to 50 mass %, more preferably 0.5 to 30 mass %, and still more preferably 1 to 20 mass % with respect to the total solid content of the composition according to the present invention. In the above-described range, excellent sensitivity and pattern formability can be obtained. The coloring composition according to the present invention may include one photopolymerization initiator or two or more photopolymerization initiators. In a case where the composition includes two or more photopolymerization initiators, it is preferable that the total content of the two or more photopolymerization initiators is in the above-described range.

<<Resin>>

In addition, the composition according to the present invention includes a resin. The resin is mixed, for example, in order to disperse the pigment and the like in the composition and to be added as a binder. The resin which is mainly used to disperse the pigments and the like will also be called a dispersant. However, the above-described uses of the resin are merely exemplary, and the resin can be used for purposes other than the uses.

In the present invention, the resin includes a resin having an acid group. Examples of the acid group include a carboxyl group, a phosphate group, a sulfonate group, and a phenolic hydroxyl group. Among these, a carboxyl group is preferable. The resin having an acid group can be used as, for example, an alkali-soluble resin described below or a dispersant.

The weight-average molecular weight (Mw) of the resin is preferably 2000 to 2000000. The upper limit is preferably 1000000 or lower and more preferably 500000 or lower. The lower limit is preferably 3000 or higher and more preferably 5000 or higher. In addition, in a case where the resin is an epoxy resin, the weight-average molecular weight (Mw) of the epoxy resin is preferably 100 or higher and more preferably 200 to 2000000. The upper limit is preferably 1000000 or lower and more preferably 500000 or lower. The lower limit is preferably 100 or higher and more preferably 200 or higher.

(Alkali-Soluble Resin)

It is preferable that the composition according to the present invention includes an alkali-soluble resin as a resin. By the composition according to the present invention including the alkali-soluble resin, developability and pattern formability is improved.

The alkali-soluble resin can be appropriately selected among resins having a group for accelerating alkali solubility.

The weight-average molecular weight (Mw) of the alkali-soluble resin is preferably 5000 to 100000. In addition, the number-average molecular weight (Mn) of the alkali-soluble resin is preferably 1000 to 20000. The acid value of the alkali-soluble resin is preferably 30 to 500 mgKOH/g. The lower limit is more preferably 50 mgKOH/g or higher and still more preferably 70 mgKOH/g or higher. The upper limit is more preferably 400 mgKOH/g or lower, still more preferably 200 mgKOH/g or lower, even still more preferably 150 mgKOH/g or lower, and most preferably 120 mgKOH/g or lower.

As the alkali-soluble resin, from the viewpoint of heat resistance, a polyhydroxystyrene resin, a polysiloxane resin, an acrylic resin, an acrylamide resin, or an acryl/acrylamide copolymer resin is preferable, and from the viewpoint of controlling developability, an acrylic resin, an acrylamide resin, or an acryl/acrylamide copolymer resin is preferable.

Examples of the group for promoting alkali solubility (hereinafter, also referred to as an acid group) include a carboxyl group, a phosphate group, a sulfonate group, and a phenolic hydroxyl group. A group that is soluble in an organic solvent and is developable with a weakly alkaline aqueous solution is preferable, and a carboxyl group is more preferable. Among these acid groups, one kind may be used alone, or two or more kinds may be used in combination.

As the alkali-soluble resin, a polymer having a carboxyl group at a side chain thereof is preferable, and examples thereof include a methacrylic acid copolymer, an acrylic acid copolymer, an itaconic acid copolymer, a crotonic acid copolymer, a maleic acid copolymer, a partially esterified maleic acid copolymer, a novolac type resin, an acidic cellulose derivative having a carboxyl group at a side chain thereof, and a polymer obtained by adding an acid anhydride to a polymer having a hydroxyl group. In particular, a copolymer of (meth)acrylic acid and another monomer which is copolymerizable with the (meth)acrylic acid is preferable as the alkali-soluble resin. Examples of the other monomer which is copolymerizable with the (meth)acrylic acid include an alkyl (meth)acrylate, an aryl (meth)acrylate, and a vinyl compound. Examples of the alkyl (meth)acrylate and the aryl (meth)acrylate include methyl (meth)acrylate, ethyl (meth)acrylate, propyl (meth)acrylate, butyl (meth)acrylate, isobutyl (meth)acrylate, pentyl (meth)acrylate, hexyl (meth)acrylate, octyl (meth)acrylate, phenyl (meth)acrylate, benzyl (meth)acrylate, tolyl (meth)acrylate, naphthyl (meth)acrylate, cyclohexyl (meth)acrylate, glycidyl methacrylate, and tetrahydrofurfuryl methacrylate. Examples of the vinyl compound include styrene, α-methylstyrene, vinyl toluene, acrylonitrile, vinyl acetate, N-vinylpyrrolidone, a polystyrene macromonomer, and a polymethyl methacrylate macromonomer. Examples of the N-position-substituted maleimide monomer copolymer described in JP1998-300922A (H10-300922) include N-phenylmaleimide and N-cyclohexylmaleimide. Among these monomers which are copolymerizable with the (meth) acrylic acid, one kind may be used alone, or two or more kinds may be used in combination.

As the alkali-soluble resin, a copolymer including benzyl (meth)acrylate and (meth)acrylic acid; a copolymer including benzyl (meth)acrylate, (meth)acrylic acid, and 2-hydroxyethyl (meth)acrylate; or a multi-component copolymer including benzyl (meth)acrylate, (meth)acrylic acid, and another monomer can be preferably used. In addition, copolymers described in JP1995-140654A (JP-H7-140654A) obtained by copolymerization of 2-hydroxyethyl (meth) acrylate can be preferably used, and examples thereof include: a copolymer including 2-hydroxypropyl (meth) acrylate, a polystyrene macromonomer, benzyl methacrylate, and methacrylic acid; a copolymer including 2-hydroxy-3-phenoxypropyl acrylate, a polymethyl methacrylate macromonomer, benzyl methacrylate, and methacrylic acid; a copolymer including 2-hydroxyethyl methacrylate, a polystyrene macromonomer, methyl methacrylate, and methacrylic acid; or a copolymer including 2-hydroxyethyl methacrylate, a polystyrene macromonomer, benzyl methacrylate, and methacrylic acid. In addition, as a commercially available product, for example, FF-426 (manufactured by Fujikura Kasei Co., Ltd.) can also be used.

As the alkali-soluble resin, a polymer obtained by polymerization of monomer components including at least one of a compound represented by the following Formula (ED 1), or a compound represented by the following Formula (ED2) (hereinafter, these compounds will also be referred to as "ether dimer") is also preferable.

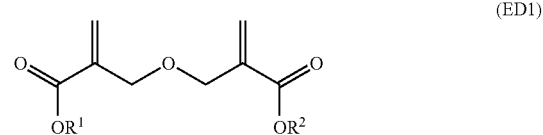

(ED1)

In Formula (ED1), $R^1$ and $R^2$ each independently represent a hydrogen atom or a hydrocarbon group having 1 to 25 carbon atoms which may have a substituent.

(ED2)

In Formula (ED2), R represents a hydrogen atom or an organic group having 1 to 30 carbon atoms. Specific examples of Formula (ED2) can be found in the description of JP2010-168539A.

The hydrocarbon group having 1 to 25 carbon atoms represented by $R^1$ and $R^2$ in Formula (ED 1) which may have a substituent is not particularly limited, and examples thereof include a linear or branched alkyl group such as methyl, ethyl, n-propyl, isopropyl, n-butyl, isobutyl, tert-butyl, tert-amyl, stearyl, lauryl, or 2-ethylhexyl; an aryl group such as phenyl; an alicyclic group such as cyclohexyl, tert-butylcyclohexyl, dicyclopentadienyl, tricyclodecanyl, isobornyl, adamantyl, or 2-methyl-2-adamantyl; an alkyl group substituted with alkoxy such as 1-methoxyethyl or 1-ethoxyethyl; and an alkyl group substituted with an aryl group such as benzyl. Among these, a primary or secondary carbon substituent which is not likely to leave due to an acid or heat, for example, methyl, ethyl, cyclohexyl, or benzyl is preferable from the viewpoint of heat resistance.

Specific examples of the ether dimer can be found in paragraph "0317" of JP2013-29760A, the content of which is incorporated herein by reference. Among these ether dimers, one kind may be used alone, or two or more kinds may be used in combination.

The alkali-soluble resin may include a repeating unit which is derived from a compound represented by the following Formula (X).

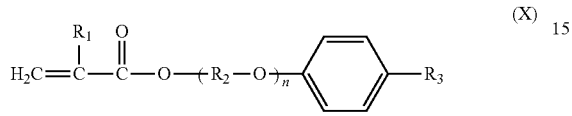

In Formula (X), $R_1$ represents a hydrogen atom or a methyl group, $R_2$ represents an alkylene group having 2 to 10 carbon atoms, and $R_3$ represents a hydrogen atom or an alkyl group having 1 to 20 carbon atoms which may have a benzene ring. n represents an integer of 1 to 15.

In Formula (X), the number of carbon atoms in the alkylene group of $R_2$ is preferably 2 to 3. In addition, the number of carbon atoms in the alkyl group of $R_3$ is preferably 1 to 20 and more preferably 1 to 10, and the alkyl group of $R_3$ may have a benzene ring. Examples of the alkyl group having a benzene ring represented by $R_3$ include a benzyl group and a 2-phenyl(iso)propyl group.

As the alkali-soluble resin, a graft copolymer can also be used. In the present invention, the graft copolymer refers to a resin having a graft chain. In addition, the graft chain refers to a portion ranging from a base of a main chain of a polymer to a terminal of a group branched from the main chain.

It is preferable that the graft copolymer is a resin having a graft chain in which the number of atoms excluding hydrogen atoms is in a range of 40 to 10000. In addition, the number of atoms excluding hydrogen atoms per graft chain is preferably 40 to 10000, more preferably 50 to 2000, and still more preferably 60 to 500.

Examples of a main chain structure of the graft copolymer include a (meth)acrylic resin, a polyester resin, a polyurethane resin, a polyurea resin, a polyamide resin, and a polyether resin. Among these, a (meth)acrylic resin is preferable. In order to improve the interaction between the graft site and the solvent to improve dispersibility, the graft chain of the graft copolymer is preferably a graft chain having poly(meth)acryl, polyester, or polyether and more preferably a graft chain having polyester or polyether.

It is preferable that the graft copolymer includes a repeating unit represented by any one of the following Formulae (1) to (4).

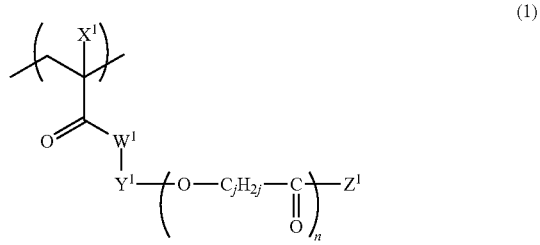

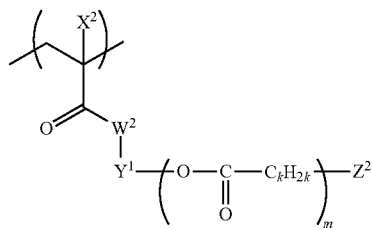

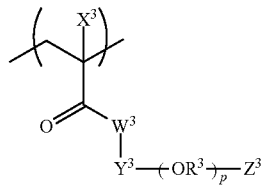

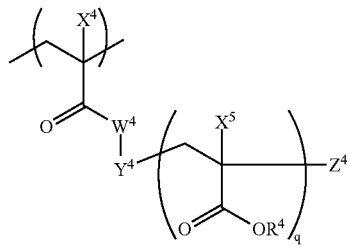

In Formulae (1) to (4), $W^1$, $W^2$, $W^3$, and $W^4$ each independently represent an oxygen atom or NH, $X^1$, $X^2$, $X^3$, $X^4$, and $X^5$ each independently represent a hydrogen atom or a monovalent group, $Y^1$, $Y^2$, $Y^3$, and $Y^4$ each independently represent a divalent linking group, $Z^1$, $Z^2$, $Z^3$, and $Z^4$ each independently represent a monovalent group, $R^3$ represents an alkylene group, $R^4$ represents a hydrogen atom or a monovalent group, n, m, p, and q each independently represent an integer of 1 to 500, and j and k each independently represent an integer of 2 to 8. In Formula (3), in a case where p represents 2 to 500, a plurality of $R^3$'s may be the same as or different from each other. In Formula (4), in a case where q represents 2 to 500, a plurality of $X^5$'s and a plurality of $R^4$'s may be the same as or different from each other.

It is preferable that $W^1$, $W^2$, W3, and $W^4$ represent an oxygen atom.

$X^1$, $X^2$, $X^3$, $X^4$, and $X^5$ each independently represent preferably a hydrogen atom or an alkyl group having 1 to 12 carbon atoms, more preferably a hydrogen atom or a methyl group, and still more preferably a methyl group.

$Y^1$, $Y^2$, $Y^3$, and $Y^4$ each independently represent a divalent linking group. Examples of the divalent linking group include —CO—, —O—, —NH—, an alkylene group, an arylene group, and a combination thereof.

A structure of the monovalent group represented by $Z^1$, $Z^2$, $Z^3$, and $Z^4$ is not particularly limited. Examples of the structure of the monovalent group include an alkyl group, a hydroxyl group, an alkoxy group, an aryloxy group, a heteroaryloxy group, an alkylthioether group, an arylthioether group, a heteroarylthioether group, and an amino group.

In Formulae (1) to (4), n, m, p, and q each independently represent an integer of 1 to 500. In addition, in Formulae (1) and (2), j and k each independently represent an integer of 2 to 8. In Formulae (1) and (2), j and k represent preferably an integer of 4 to 6 and most preferably 5 from the viewpoints of dispersion stability and developability.

In Formula (3), R3 represents an alkylene group, preferably an alkylene group having 1 to 10 carbon atoms, and more preferably an alkylene group having 2 or 3 carbon atoms. In a case where p represents 2 to 500, a plurality of $R^3$'s may be the same as or different from each other.

In Formula (4), $R^4$ represents a hydrogen atom or a monovalent group. $R^4$ represents preferably a hydrogen atom, an alkyl group, an aryl group, or a heteroaryl group and more preferably a hydrogen atom or an alkyl group. In Formula (4), in a case where q represents 2 to 500, a plurality of $X^5$'s and a plurality of $R^4$'s may be the same as or different from each other.

The details of the formula can be found in the description of paragraphs "0025" to "0069 of JP2012-255128A, the content of which is incorporated herein by reference.

Specific examples of the alkali-soluble resin are as follows.

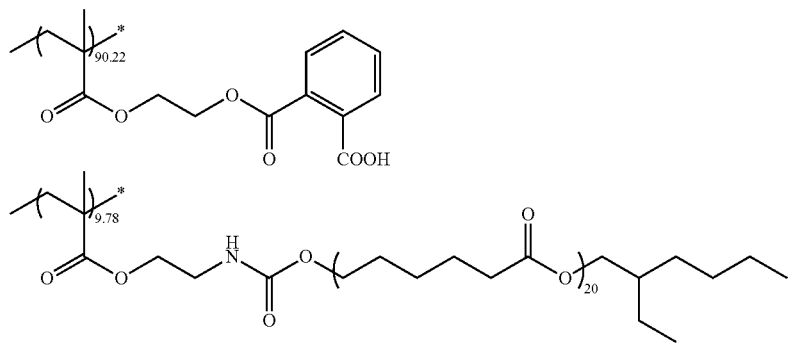

The details of the alkali-soluble resin can be found in paragraphs "0558" to "0571" of JP2012-208494A (corresponding to paragraphs "0685" to "0700" of US Patent App. No. 2012/0235099A), the content of which is incorporated herein by reference. In addition, a copolymer (B) described in paragraphs "0029" to "0063" and an alkali-soluble resin used in Examples of JP2012-32767A, a binder resin described in paragraphs "0088" to "0098" and a binder resin used in Examples of JP2012-208474A, a binder resin described in paragraphs "0022" to "0032 and a binder resin used in Examples of JP2012-137531A, a binder resin described in paragraphs "0132" to "0143" and a binder resin used in Examples of JP2013-024934A, a binder resin described in paragraphs "0092" to "0098" and a binder resin described in Examples of JP2011-242752A, or a binder resin described in paragraphs "0030" to "0072" of JP2012-032770A can also be used. The content of which is incorporated herein by reference.

As the alkali-soluble resin, an alkali-soluble resin having a polymerizable group may be used. Examples of the polymerizable group include a (meth)allyl group and a (meth)acryloyl group. As the alkali-soluble resin having a polymerizable group, an alkali-soluble resin having a polymerizable group at a side chain thereof is preferable. Examples of the alkali-soluble resin having a polymerizable group include DIANAL NR series (manufactured by Mitsubishi Rayon Co., Ltd.), PHOTOMER 6173 (a COOH-containing polyurethane acrylic oligomer; manufactured by Diamond Shamrock Co., Ltd.), BISCOAT R-264 and KS Resist 106 (both of which are manufactured by Osaka Organic Chemical Industry Ltd.), CYCLOMER-P series (for example, ACA230AA) and PLAKCEL CF200 series (both of which manufactured by Daicel Corporation), EBECRYL 3800 (manufactured by Daicel-UCB Co., Ltd.), and ACRYCURE RD-F8 (manufactured by Nippon Shokubai Co., Ltd.).

(Dispersant)

The composition according to the present invention may include a dispersant as a resin. In particular, in a case where a pigment is used, it is preferable that the composition includes a dispersant. Examples of the dispersant include an acidic dispersant (acidic resin) and a basic dispersant (basic resin). It is preferable that the dispersant includes at least an acidic dispersant, and it is more preferable that the dispersant consists of only an acidic dispersant. By the dispersant including at least an acidic dispersant, the dispersibility of the pigment is improved, and excellent developability can be obtained. Therefore, a pattern can be suitably formed by photolithography. In a case where the dispersant consists of only an acidic dispersant, for example, the content of the acidic dispersant is preferably 99 mass % or higher and more preferably 99.9 mass % or higher with respect to the total mass of the dispersant.

Here, the acidic dispersant (acidic resin) refers to a resin in which the amount of an acid group is more than the amount of a basic group. In a case where the sum of the amount of an acid group and the amount of a basic group in the acidic dispersant (acidic resin) is represented by 100 mol %, the amount of the acid group is preferably 70 mol % or higher and more preferably substantially 100 mol %. The acid group in the acidic dispersant (acidic resin) is preferably a carboxyl group.

In addition, the basic dispersant (basic resin) refers to a resin in which the amount of a basic group is more than the amount of an acid group. In a case where the sum of the amount of an acid group and the amount of a basic group in the basic dispersant (basic resin) is represented by 100 mol %, the amount of the basic group is preferably 50 mol % or higher. The basic group in the basic dispersant is preferably amine.

An acid value of the acidic dispersant (acidic resin) is preferably 40 to 105 mgKOH/g, more preferably 50 to 105 mgKOH/g, and still more preferably 60 to 105 mgKOH/g.

It is preferable that the resin A used as the dispersant further includes a repeating unit having an acid group. By the resin including the repeating unit having an acid group, in a case where a pattern is formed by photolithography, the amount of residues formed in an underlayer of a pixel can be reduced.

In addition, it is preferable that the resin used as the dispersant is a graft copolymer.

Since the graft copolymer has affinity to the solvent due to the graft chain, the dispersibility of the pigment and the dispersion stability over time are excellent. In addition, the composition has affinity to the polymerizable compound or the alkali-soluble resin due to the presence of the graft chain. Therefore, formation of residues during alkali development can be suppressed. Examples of the graft copolymer include a resin that includes a repeating unit represented by any one of Formulae (1) to (4) described above regarding the alkali-soluble resin. For example, the following resins can be used. In addition, the following resin can also be used as an alkali-soluble resin.

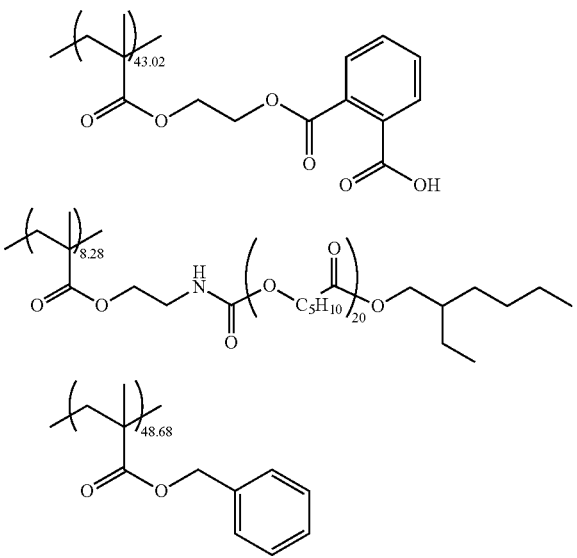

As the dispersant, an oligoimine resin having a nitrogen atom at at least either a main chain or a side chain can be used. As the oligoimine resin, a resin, which includes a repeating unit that includes a group X having a partial structure with a functional group (pKa: 14 or lower) and a side chain Y having 40 to 10000 atoms and has a basic nitrogen atom at at least either a main chain or a side chain, is preferable. The basic nitrogen atom is not particularly limited as long as it is a nitrogen atom exhibiting basicity.

Examples of the oligoimine resin include a resin including at least one of a repeating unit represented by the following Formula (I-1), a repeating unit represented by the following Formula (I-2), or a repeating unit represented by the following Formula (I-2a).

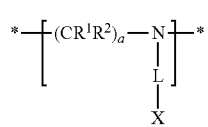
(I-1)

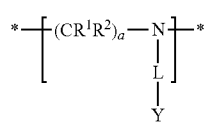
(I-2)

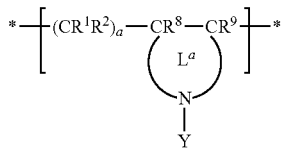
(I-2a)

$R^1$ and $R^2$ each independently represent a hydrogen atom, a halogen atom, or an alkyl group (having preferably 1 to 6 carbon atoms). a's each independently represent an integer of 1 to 5. * represents a linking portion between repeating units.

$R^8$ and $R^9$ represent the same group as that of $R^1$.

L represents a single bond, an alkylene group (having preferably 1 to 6 carbon atoms), an alkenylene group (having preferably 2 to 6 carbon atoms), an arylene group (having preferably 6 to 24 carbon atoms), an heteroarylene group (having preferably 1 to 6 carbon atoms), an imino group (having preferably 0 to 6 carbon atoms), an ether group, a thioether group, a carbonyl group, or a linking group of a combination of the above-described groups. Among these, a single bond or —$CR^5R^6$—$NR^7$— (an imino group is present at the X or Y site) is preferable. Here, $R^5$ and $R^6$ each independently represent a hydrogen atom, a halogen atom, or an alkyl group (having preferably 1 to 6 carbon atoms). $R^7$ represents a hydrogen atom or an alkyl group having 1 to 6 carbon atoms.

$L^a$ is a structural unit which forms a ring structure with $CR^8CR^9$ and N, preferably a structural unit which forms a nonaromatic heterocycle having 3 to 7 carbon atoms with $CR^8CR^9$ and a carbon atom, more preferably a structural unit which forms a nonaromatic 5- to 7-membered heterocycle with $CR_8CR^9$ and N (nitrogen atom), still more preferably a structural unit which forms a nonaromatic 5-membered heterocycle with $CR^8CR^9$ and N, and even still more preferably a structural unit which forms pyrrolidine with $CR^8CR^9$ and N. This structural unit may have a substituent such as an alkyl group.

X represents a group having a partial structure with a functional group having pKa of 14 or lower.

Y represents a side chain having 40 to 10000 atoms.

The resin (oligoimine resin) may further include one or more copolymerization components selected from the group consisting of the repeating units represented by Formulae (I-3), (I-4), and (I-5). By the resin containing the above-described repeating units, the dispersion performance of the pigment can be further improved.

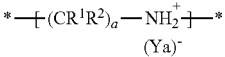
(I-3)

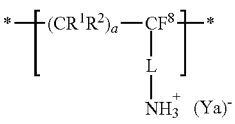
(I-4)

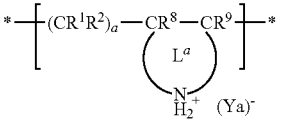
(I-5)

$R^1$, $R^2$, $R^8$, $R^9$, L, La, a, and * have the same definitions as those in Formulae (I-1), (I-2), and (I-2a).

Ya represents a side chain having 40 to 10000 atoms which has an anionic group. The repeating unit represented by Formula (I-3) can be formed by adding an oligomer or a polymer having a group, which reacts with amine to form a salt, to a resin having a primary or secondary amino group at a main chain such that they react with each other.

The oligoimine resin can be found in the description of paragraphs "0102" to "0166" of JP2012-255128A, the content of which is incorporated herein by reference. Specific examples of the oligoimine resin are as follows. In addition, a resin described in paragraphs "0168" to "0174" of JP2012-255128A can be used.

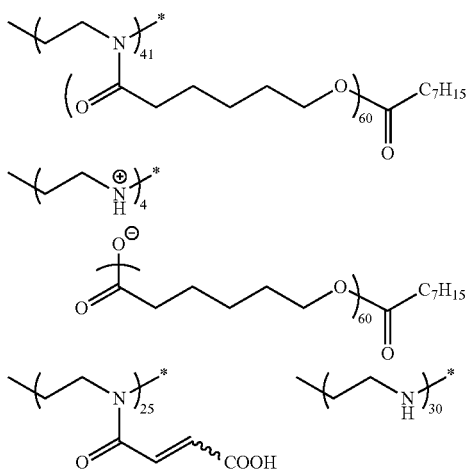

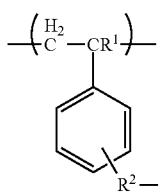

As the dispersant, a resin including a repeating unit represented by the following Formula (P1) can also be used.

(P1)

—(CH₂—CR¹)—
    |
    [phenyl]
    |
    R²—Z

In Formula (P1), $R^1$ represents hydrogen atom or a methyl group, $R^2$ represents an alkylene group, and Z represents a nitrogen-containing heterocyclic structure.

The alkylene group represented by $R^2$ is not particularly limited, and examples thereof include a methylene group, an ethylene group, a trimethylene group, a tetramethylene group, a hexamethylene group, a 2-hydroxypropylene group, a methyleneoxy group, an ethyleneoxy group, a methyleneoxycarbonyl group, and a methylenethio group. Among these, a methylene group, a methyleneoxy group, a methyleneoxycarbonyl group, or a methylenethio group is more preferable.

Examples of the nitrogen-containing heterocyclic structure represented by Z include a structure including a pyridine ring, a pyrazine ring, a pyrimidine ring, a pyrrole ring, an imidazole ring, a triazole ring, a tetrazole ring, an indole ring, a quinoline ring, an acridine ring, a phenothiazine ring, a phenoxazine ring, an acridone ring, an anthraquinone ring, a benzimidazole structure, a benzotriazole structure, a benzothiazole structure, a cyclic amide structure, a cyclic urea structure, or a cyclic imide structure. Among these, as the nitrogen-containing heterocyclic structure represented by Z, a structure represented by the following Formula (P2) or (P3) is preferable.

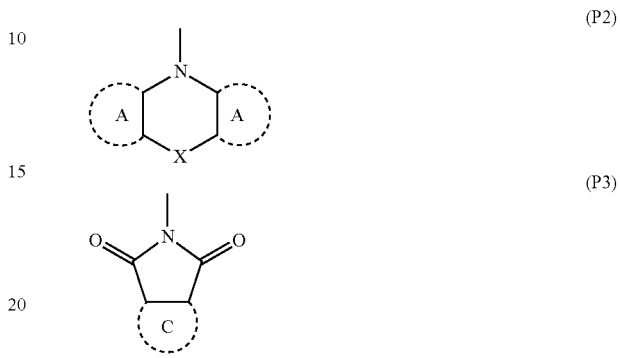

In the formula, X represents one selected from the group consisting of a single bond, an alkylene group (for example, a methylene group, an ethylene group, a propylene group, a trimethylene group, or a tetramethylene group), —O—, —S—, —NR—, and —C(=O)—. Here, R represents a hydrogen atom or an alkyl group. Among these, X represents preferably a single bond, a methylene group, —O—, or —C(=O)— and more preferably —C(=O)—.

In the formula, a ring A, a ring B, and a ring C each independently represent an aromatic ring. Examples of the aromatic ring include a benzene ring, a naphthalene ring, an indene ring, an azulene ring, a fluorene ring, an anthracene ring, a pyridine ring, a pyrazine ring, a pyrimidine ring, a pyrrole ring, an imidazole ring, an indole ring, a quinoline ring, an acridine ring, a phenothiazine ring, a phenoxazine ring, an acridone ring, and an anthraquinone ring. Among these, a benzene ring, a naphthalene ring, an anthracene ring, a pyridine ring, a phenoxazine ring, an acridine ring, a phenothiazine ring, a phenoxazine ring, an acridone ring, or an anthraquinone ring is preferable, and a benzene ring, a naphthalene ring, or a pyridine ring is more preferable.

Specific examples of the repeating unit represented by Formula (P1) are as follows. In addition, specific examples of the structural unit can be found in paragraph "0023" of JP2008-009426A, the content of which is incorporated herein by reference.

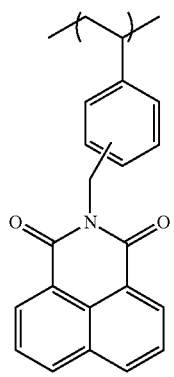

Specific examples of the resin including the repeating unit represented by Formula (P1) and other repeating units are as follows.

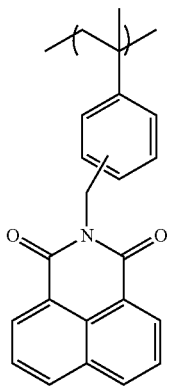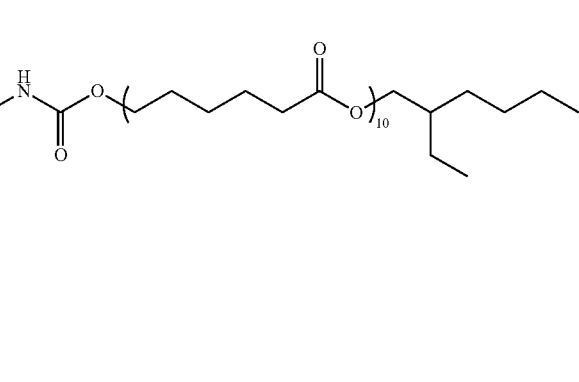

The dispersant is available as a commercially available product, and specific examples thereof include: "DA-7301" manufactured by Kusmotto Chemicals; "Disperbyk-101 (polyamideamine phosphate), 107 (carboxylate), 110, (copolymer containing an acid group), 111 (phosphate dispersant), 130 (polyamide), 161, 162, 163, 164, 165, 166, and 170 (high molecular weight copolymer)" and "BYK-P104, P105 (high molecular weight unsaturated polycarboxylic acid)" all of which are manufactured by BYK Chemie; "EFKA 4047, 4050 to 4165 (polyurethane compound), EFKA 4330 to 4340 (block copolymer), 4400 to 4402 (modified polyacrylate), 5010 (polyester amide), 5765 (high molecular weight polycarboxylate), 6220 (fatty acid polyester), 6745 (phthalocyanine derivative), and 6750 (azo pigment derivative)" all of which are manufactured by EFKA; "AJISPER PB821, PB822, PB880, and PB881" all of which are manufactured by Ajinomoto Fine Techno Co., Inc.; "FLOWLEN TG-710 (urethane oligomer)" and "POLYFLOW No. 50E and No. 300 (acrylate copolymer)" all of which are manufactured by Kyoeisha Chemical Co., Ltd.; "DISPARLON KS-860, 873SN, 874, #2150 (aliphatic polycarboxylic acid), #7004 (polyether ester), DA-703-50, DA-705, and DA-725" all of which are manufactured by Kusumoto Chemicals Ltd.; "DEMOL RN, N (naphthalene sulfonic acid formalin polycondensate), MS, C, and SN-B (aromatic sulfonic acid formalin polycondensate)" manufactured by Kao Corporation, "HOMOGENOL L-18 (high molecular polycarboxylic acid)" manufactured by Kao Corporation, "EMULGEN 920, 930, 935, and 985 (polyoxyethylene nonylphenyl ether)" manufactured by Kao Corporation, and "ACETAMIN 86 (stearylamine acetate)" manufactured by Kao Corporation; "SOLSPERSE 5000 (phthalocyanine derivative), 22000 (azo pigment derivative), 13240 (polyester amine), 3000, 12000, 17000, 20000, 27000 (polymer having a functional group at a terminal thereof), 24000, 28000, 32000, and 38500 (graft polymer)" all of which are manufactured by Lubrizol Corporation; "NIKKOL T106 (polyoxyethylene sorbitan monooleate) and MYS-IEX (polyoxyethylene monostearate)" all of which manufactured by Nikko Chemicals Co., Ltd.; HINOACT T-8000E manufactured by Kawaken Fine Chemicals Co., Ltd.; organosiloxane polymer KP341 manufactured by Shin-Etsu Chemical Co., Ltd.; "EFKA-46, EFKA-47, EFKA-47EA, EFKA POLYMER 100, EFKA POLYMER 400, EFKA POLYMER 401, and EFKA POLYMER 450" all of which are manufactured by Morishita Co., Ltd. and "DISPERSE AID 6, DISPERSE AID 8, DISPERSE AID 15, and DISPERSE AID 9100" all of which are manufactured by San Nopco Limited; "ADEKA PLURONIC L31, F38, L42, L44, L61, L64, F68, L72, P95, F77, P84, F87, P94, L101, P103, F108, L121, and P-123" all of which are manufactured by Adeka Corporation; and "IONET S-20" manufactured by Sanyo Chemical Industries Ltd.

In the composition according to the present invention, a mass ratio radically polymerizable compound/resin of the radically polymerizable compound to the resin is 0.3 to 0.7. The lower limit of the mass ratio is preferably 0.35 or higher and more preferably 0.4 or higher. The upper limit of the mass ratio is preferably 0.65 or lower and more preferably 0.6 or lower. In a case where the mass ratio is in the above-described range, a pattern having excellent rectangularity can be formed.

In the composition according to the present invention, it is preferable that a mass ratio radically polymerizable compound/resin having an acid group of the radically polymerizable compound to the resin having an acid group is 0.3 to 0.7. The lower limit of the mass ratio is preferably 0.35 or higher and more preferably 0.4 or higher. The upper limit of the mass ratio is preferably 0.65 or lower and more preferably 0.6 or lower. In a case where the mass ratio is in the above-described range, a pattern having excellent rectangularity can be formed.

In the composition according to the present invention, it is preferable that a mass ratio radically polymerizable compound/alkali-soluble resin of the radically polymerizable compound to the alkali-soluble resin is 0.3 to 0.7. The lower limit of the mass ratio is preferably 0.35 or higher and more preferably 0.4 or higher. The upper limit of the mass ratio is preferably 0.65 or lower and more preferably 0.6 or lower. In a case where the mass ratio is in the above-described range, a pattern having excellent rectangularity can be formed.

In the composition according to the present invention, the content of the resin is preferably 14 to 70 mass % with respect to the total solid content of the composition according to the present invention. The lower limit is preferably 17 mass % or higher and more preferably 20 mass % or higher. The upper limit is preferably 56 mass % or lower and more preferably 42 mass % or lower.

In the composition according to the present invention, the content of the resin having an acid group is preferably 14 to 70 mass % with respect to the total solid content of the composition according to the present invention. The lower limit is preferably 17 mass % or higher and more preferably 20 mass % or higher. The upper limit is preferably 56 mass % or lower and more preferably 42 mass % or lower.

In the composition according to the present invention, the content of the alkali-soluble resin is preferably 14 to 70 mass % with respect to the total solid content of the composition according to the present invention. The lower limit is preferably 17 mass % or higher and more preferably 20 mass % or higher. The upper limit is preferably 56 mass % or lower and more preferably 42 mass % or lower.

<<Chain Transfer Agent>>

It is preferable that the composition according to the present invention includes a chain transfer agent. According to this aspect, the curing of the film surface (pattern surface) can be promoted due to exposure during pattern formation. Therefore, for example, a decrease in film thickness during exposure can be suppressed, and a pattern having higher rectangularity can be easily formed.

Examples of the chain transfer agent include N,N-dialkylamino benzoic acid alkyl ester and a thiol compound. Among these, a thiol compound is preferable. As the thiol compound, a compound having 2 or more (preferably 2 to 8 and more preferably 3 to 6) thiol groups in a molecule is preferable. Specific examples of the thiol compound include: a thiol compound having a heterocycle such as 2-mercaptobenzothiazole, 2-mercaptobenzoxazole, 2-mercaptobenzimidazole, N-phenylmercaptobenzimidazole, or 1,3,5-tris(3-mercaptobutyloxyethyl]-1,3,5-triazine-2,4,6 (1H,3H,5H)-trione; and an aliphatic thiol compound such as pentaerythritol tetrakis(3-mercaptobutylate) or 1,4-bis(3-mercaptobutyryloxy)butane. In addition, it is preferable that the following compounds are used. In addition, examples of a commercially available product of the chain transfer agent include PEMP (a thiol compound, manufactured by Nagase Co., Ltd.), SANCELER M (a thiol compound, manufactured by Sanshin Chemical Industry Co., Ltd.), and KARENZ MT BD1 (a thiol compound, manufactured by Showa Denko K.K.).

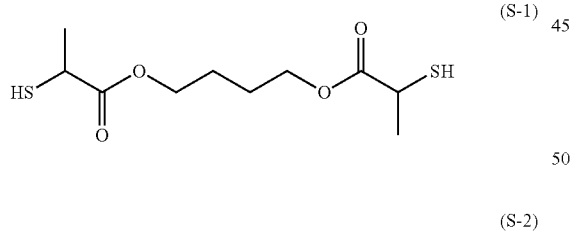

(S-1)

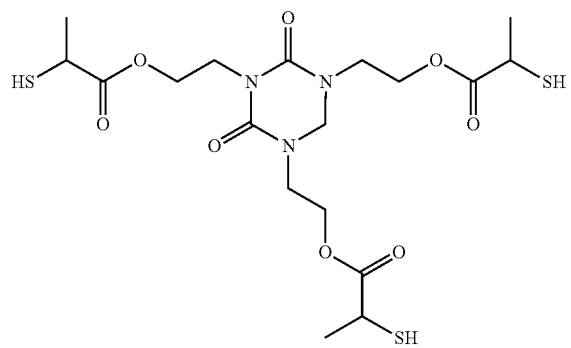

(S-2)

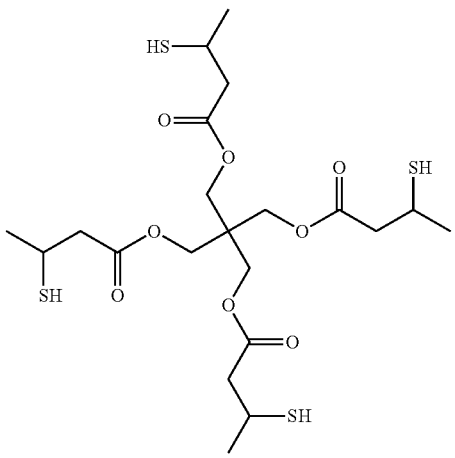

(S-3)

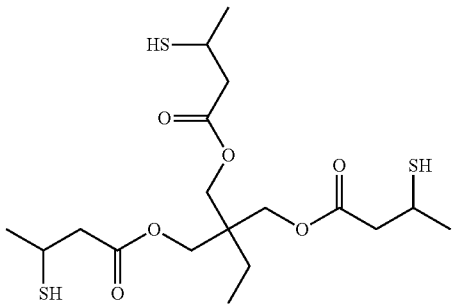

(S-4)

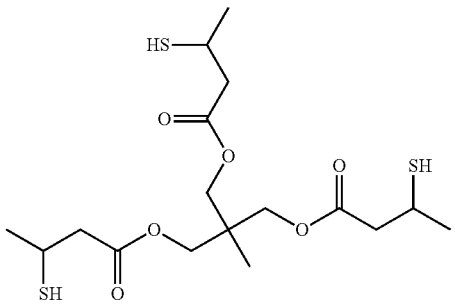

(S-5)

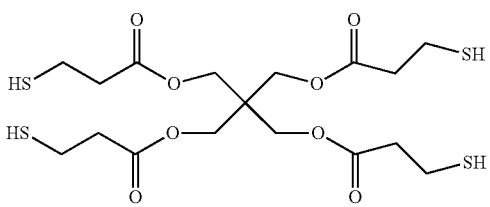

(S-6)

The content of the chain transfer agent is preferably 0.2 to 5.0 mass % and more preferably 0.4 to 3.0 mass % with respect to the total solid content of the composition.

The content of the chain transfer agent is preferably 1 to 40 parts by mass and more preferably 2 to 20 parts by mass with respect to 100 parts by mass of the radically polymerizable compound.

<<Compound Having Epoxy Group>>

The composition according to the present invention may also include a compound having an epoxy group. Examples of the compound having an epoxy group include a monofunctional or polyfunctional glycidyl ether compound, and a polyfunctional aliphatic glycidyl ether compound. In addition, a compound having an alicyclic epoxy group can also be used.

Examples of the compound having an epoxy group include a compound having one or more epoxy groups in one molecule. In particular, a compound having two or more epoxy groups in one molecule is preferable. The number of epoxy groups in one molecule is preferably 1 to 100. The upper limit of the number of epoxy groups is, for example, 10 or less or 5 or less. The lower limit of the number of epoxy groups is preferably 2 or less.

In the compound having an epoxy group, an epoxy equivalent (=the molecular weight of the compound having an epoxy group/the number of epoxy groups) is preferably 500 g/eq or lower, more preferably 100 to 400 g/eq, and still more preferably 100 to 300 g/eq.

The compound having an epoxy group may be a low molecular weight compound (for example, molecular weight: lower than 2000 or lower than 1000) or a high molecular weight compound (macromolecule; for example, molecular weight: 1000 or higher, and in the case of a polymer, weight-average molecular weight: 1000 or higher). The weight-average molecular weight of the compound having an epoxy group is preferably 200 to 100000 and more preferably 500 to 50000. The upper limit of the weight-average molecular weight is preferably 10000 or lower, more preferably 5000 or lower, and still more preferably 3000 or lower.

As the compound having an epoxy group, compounds described in paragraphs "0034" to "0036" of JP2013-011869A, paragraphs "0147" to "0156" of JP2014-043556A, and paragraphs "0085" to "0092" of JP2014-089408A can also be used. The contents of which are incorporated herein by reference. Regarding the commercially available product, examples of the bisphenol A epoxy resin include jER825, jER827, jER828, jER834, jER1001, jER1002, jER1003, jER1055, jER1007, jER1009, and jER1010 (all of which are manufactured by Mitsubishi Chemical Corporation) and EPICLON860, EPICLON1050, EPICLON1051, and EPICLON1055 (all of which are manufactured by DIC Corporation). Examples of the bisphenol F epoxy resin include jER806, jER807, jER4004, jER4005, jER4007, and jER4010 (all of which are manufactured by Mitsubishi Chemical Corporation), EPICLON830 and EPICLON835 (all of which are manufactured by DIC Corporation), and LCE-21 and RE-602S (all of which are manufactured by Nippon Kayaku Co., Ltd.). Examples of the phenol novolac epoxy resin include jER152, jER154, jER157S70, and jER157S65 (all of which are manufactured by Mitsubishi Chemical Corporation) and EPICLON N-740, EPICLON N-770, and EPICLON N-775 (all of which are manufactured by DIC Corporation). Examples of the cresol novolac epoxy resin include EPICLON N-660, EPICLON N-665, EPICLON N-670, EPICLON N-673, EPICLON N-680, EPICLON N-690, and EPICLON N-695 (all of which are manufactured by DIC Corporation) and EOCN-1020 (manufactured by Nippon Kayaku Co., Ltd.). Examples of the aliphatic epoxy resin include ADEKA RESIN EP-4080S, ADEKA RESIN EP-4085S, and ADEKA RESIN EP-4088S (all of which are manufactured by Adeka Corporation), CELLOXIDE 2021P, CELLOXIDE 2081, CELLOXIDE 2083, CELLOXIDE 2085, EHPE3150, EPOLEAD PB 3600, and EPOLEAD PB 4700 (all of which are manufactured by Daicel Corporation), and DENACOL EX-212L, DENACOL EX-214L, DENACOL EX-216L, DENACOL EX-321L, and DENACOL EX-850L (all of which are manufactured by Nagase ChemteX Corporation). Other examples of the commercially available product include ADEKA RESIN EP-4000S, ADEKA RESIN EP-4003S, ADEKA RESIN EP-4010S, and ADEKA RESIN EP-4011S (all of which are manufactured by Adeka Corporation), NC-2000, NC-3000, NC-7300, XD-1000, EPPN-501, and EPPN-502 (all of which are manufactured by Adeka Corporation), jERIO31S (manufactured by Mitsubishi Chemical Corporation), and OXT-221 (manufactured by Toagosei Co., Ltd.).

As the compound having an epoxy group, for example, a compound described in paragraph "0045" of JP2009-265518A can also be used.

The content of the compound having an epoxy group is preferably 0.5 to 20 mass % with respect to the total solid content of the composition. The lower limit is preferably 1 mass % or higher and more preferably 2 mass % or higher. The upper limit is preferably 15 mass % or lower and more preferably 10 mass % or lower.

<<Solvent>>

The composition according to the present invention may include a solvent. Examples of the solvent include an organic solvent. Basically, the solvent is not particularly limited as long as it satisfies the solubility of each component and the coating properties of the composition. However, it is preferable that the organic solvent is selected in consideration of the coating properties and safety of the composition.

Preferable examples of the organic solvent are as follows:

an ester, for example, ethyl acetate, n-butyl acetate, isobutyl acetate, cyclohexyl acetate, amyl formate, isoamyl acetate, butyl propionate, isopropyl butyrate, ethyl butyrate, butyl butyrate, methyl lactate, ethyl lactate, alkyl alkoxyacetate (for example, methyl alkoxyacetate, ethyl alkoxyacetate, or butyl alkoxyacetate (for example, methyl methoxyacetate, ethyl methoxyacetate, butyl methoxyacetate, methyl ethoxyacetate, or ethyl ethoxyacetate)), alkyl 3-alkoxypropionate (for example, methyl 3-alkoxypropionate or ethyl 3-alkoxypropionate (for example, 3-methyl methoxypropionate, 3-ethyl methoxypropionate, 3-methyl ethoxypropionate, or 3-ethyl ethoxypropionate)), alkyl 2-alkoxypropionate (for example, methyl 2-alkoxypropionate, ethyl 2-alkoxypropionate, or propyl 2-alkoxypropionate, (for example, methyl 2-methoxypropionate, ethyl 2-methoxypropionate, propyl 2-methoxypropionate, methyl 2-ethoxypropionate, or 2-ethyl ethoxypropionate)), methyl 2-alkoxy-2-methylpropionate, ethyl 2-alkoxy-2-methylpropionate (for example, methyl 2-methoxy-2-methylpropionate or ethyl 2-ethoxy-2-methylpropionate), methyl pyruvate, ethyl pyruvate, propyl pyruvate, methyl acetoacetate, ethyl acetoacetate, methyl 2-oxobutanoate, or ethyl 2-oxobutanoate;

an ether, for example, diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, diethylene glycol monobutyl ether acetate, propylene glycol monomethyl ether, propylene glycol monomethyl ether acetate, propylene glycol monoethyl ether acetate, or propylene glycol monopropyl ether acetate;

a ketone, for example, methyl ethyl ketone, cyclohexanone, cyclopentanone, 2-heptanone, or 3-heptanone; and an aromatic hydrocarbon, for example, toluene or xylene. In this case, it may be preferable that the content of the aromatic hydrocarbon (for example, benzene, toluene, xylene, or ethylbenzene) as the solvent is low (for example, 50 mass ppm or lower, 10 mass ppm or lower, or 1 mass ppm or lower with respect to the total mass of the organic solvent) in consideration of environmental aspects and the like.

Among these organic solvents, one kind may be used alone, or two or more kinds may be used in combination. In a case where two or more organic solvents are used in combination, a mixed solution is preferable, the mixed solution including two or more organic solvents selected from the group consisting of methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol methyl ether, and propylene glycol methyl ether acetate.

In the present invention, a solvent having a low metal content is preferable. For example, the metal content in the solvent is preferably 10 mass ppb or lower. Optionally, a solvent having a metal content at a mass ppt level may be used. For example, such a high-purity solvent is available from Toyo Gosei Co., Ltd. (The Chemical Daily, Nov. 13, 2015).

Examples of a method of removing impurities such as metal from the solvent include distillation (for example, molecular distillation or thin-film distillation) and filtering using a filter. During the filtering using a filter, the pore size of a filter is preferably 10 nm or less, more preferably 5 nm or less, and still more preferably 3 nm or less. As a material of the filter, polytetrafluoroethylene, polyethylene, or nylon is preferable.

The solvent may include an isomer (a compound having the same kind and number of atoms and a different structure). In addition, the organic solvent may include only one isomer or a plurality of isomers.

In the present invention, as the organic solvent, an organic solvent containing 0.8 mmol/L or lower of a peroxide is preferable, and an organic solvent containing substantially no peroxide is more preferable.

The content of the solvent is preferably 10 to 90 mass %, more preferably 20 to 80 mass %, and still more preferably 25 to 75 mass % with respect to the total mass of the composition.

<<Silane Coupling Agent>>

The composition according to the present invention may further include a silane coupling agent. In the present invention, the silane coupling agent is a different component from the polymerizable compound. In the present invention, the silane coupling agent refers to a silane compound having a functional group other than a hydrolyzable group. The hydrolyzable group refers to a substituent directly linked to a silicon atom and capable of forming a siloxane bond due to at least one of a hydrolysis reaction or a condensation reaction. Examples of the hydrolyzable group include a halogen atom, an alkoxy group, and an acyloxy group. Among these, an alkoxy group is preferable. That is, it is preferable that the silane coupling agent is a compound having an alkoxysilyl group. In addition, it is preferable that the functional group other than a hydrolyzable group is a group which interacts with the resin or forms a bond with the resin to exhibit affinity. Examples of the functional group other than a hydrolyzable group include a (meth)acryloyl group, a phenyl group, a mercapto group, an epoxy group, and an oxetanyl group. Among these, a (meth)acryloyl group or an epoxy group is preferable. That is, it is preferable that the silane coupling agent is a compound having an alkoxysilyl group and at least one of a (meth)acryloyl group or an epoxy group. Examples of the silane coupling agent include a compound described in paragraphs "0018" to "0036" of JP2009-288703A and a compound described in paragraphs "0056" to "0066" of JP2009-242604A, the content of which is incorporated herein by reference.

The content of the silane coupling agent is preferably 0.01 to 15.0 mass % and more preferably 0.05 to 10.0 mass % with respect to the total solid content of the composition. As the silane coupling agent, one kind may be used alone, or two or more kinds may be used. In a case where two or more antioxidants are used in combination, it is preferable that the total content of the two or more antioxidants is in the above-described range.

<<Surfactant>>

The composition according to the present invention may include various surfactants from the viewpoint of further improving coating properties. As the surfactants, various surfactants such as a fluorine surfactant, a nonionic surfactant, a cationic surfactant, an anionic surfactant, or a silicone surfactant can be used.

By the composition including a fluorine surfactant, liquid characteristics (for example, fluidity) of a coating solution prepared from the composition are further improved, and the uniformity in coating thickness and liquid saving properties can be further improved. That is, in a case where a film is formed using a coating solution prepared using the composition including a fluorine surfactant, the interfacial tension between a coated surface and the coating solution decreases, the wettability on the coated surface is improved, and the coating properties on the coated surface are improved. Therefore, a film having a uniform thickness with reduced unevenness in thickness can be formed more suitably.

The fluorine content in the fluorine surfactant is preferably 3 to 40 mass %, more preferably 5 to 30 mass %, and still more preferably 7 to 25 mass %. The fluorine surfactant in which the fluorine content is in the above-described range is effective from the viewpoints of the uniformity in the thickness of the coating film and liquid saving properties, and the solubility thereof in the composition is also excellent.

Specific examples of the fluorine surfactant include a surfactant described in paragraphs "0060" to "0064" of JP2014-41318A (paragraphs "0060" to "0064" of corresponding WO2014/17669A) and a surfactant described in paragraphs "0117" to "0132" of JP2011-132503A, the content of which is incorporated herein by reference. Examples of a commercially available product of the fluorine surfactant include: MEGAFACE F171, F172, F173, F176, F177, F141, F142, F143, F144, R30, F437, F475, F479, F482, F554, and F780 (all of which are manufactured by DIC Corporation); FLUORAD FC430, FC431, and FC171 (all of which are manufactured by Sumitomo 3M Ltd.); SURFLON S-382, SC-101, SC-103, SC-104, SC-105, SC1068, SC-381, SC-383, S393, and KH-40 (all of which are manufactured by Asahi Glass Co., Ltd.); and PolyFox PF636, PF656, PF6320, PF6520, and PF7002 (all of which are manufactured by OMNOVA Solutions Inc.).

As the fluorine surfactant, a block polymer can also be used. Examples of the block polymer include a compound described in JP2011-89090A. As the fluorine surfactant, a fluorine-containing polymer compound can be preferably used, the fluorine-containing polymer compound including: a repeating unit derived from a (meth)acrylate compound having a fluorine atom; and a repeating unit derived from a (meth)acrylate compound having 2 or more (preferably 5 or more) alkyleneoxy groups (preferably an ethyleneoxy group and a propyleneoxy group). For example, the following compound can also be used as the fluorine surfactant used in the present invention.

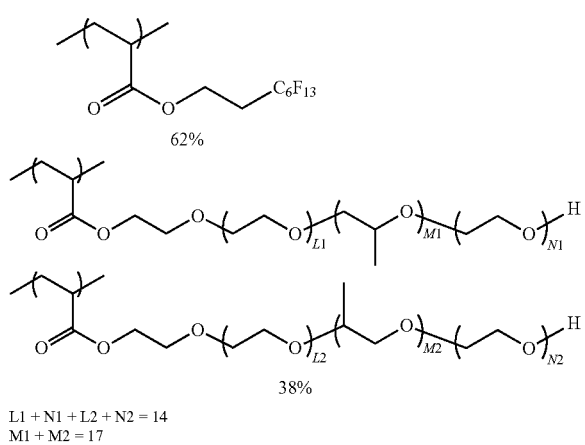

L1 + N1 + L2 + N2 = 14
M1 + M2 = 17

The weight-average molecular weight of the compound is preferably 3000 to 50000 and, for example, 14000. In the compound, "%" representing the proportion of a repeating unit is mass %.

In addition, as the fluorine surfactant, a fluorine-containing polymer having an ethylenically unsaturated group at a side chain can also be used. Specific examples include compounds described in paragraphs "0050" of "0090" and paragraphs "0289" to "0295" of JP2010-164965A, for example, MEGAFACE RS-101, RS-102, RS-718K, and RS-72-K manufactured by DIC Corporation. As the fluorine surfactant, a compound described in paragraphs "0015" to "0158" of JP2015-117327A can also be used.

Examples of the nonionic surfactant include glycerol, trimethylolpropane, trimethylolethane, an ethoxylate and a propoxylate thereof (for example, glycerol propoxylate or glycerol ethoxylate), polyoxyethylene lauryl ether, polyoxyethylene stearyl ether, polyoxyethylene oleyl ether, polyoxyethylene octylphenyl ether, polyoxyethylene nonylphenyl ether, polyethylene glycol dilaurate, polyethylene glycol distearate, and sorbitan fatty acid esters (PLURONIC L10, L31, L61, L62, 10R5, 17R2, and 25R2 (manufactured by BASF SE) and TETRONIC 304, 701, 704, 901, 904, and 150R1 (manufactured by BASF SE)); SOLSPERSE 20000 (manufactured by Lubrication Technology Inc.); NCW-101, NCW-1001, and NCW-1002 (all of which are manufactured by Wako Pure Chemical Industries, Ltd.); PIONIN D-6112, D-6112-W, and D-6315 (all of which are manufactured by Takemoto Oil&Fat Co., Ltd.); and OLFINE E1010, SURFYNOL 104, 400, and 440 (all of which are manufactured by Nissin Chemical Co., Ltd.).

Examples of the cationic surfactant include an organosiloxane polymer KP341 (manufactured by Shin-Etsu Chemical Co., Ltd.), a (meth)acrylic acid (co)polymer POLYFLOW No. 75, No. 90, or No. 95 (manufactured by Kyoeisha Chemical Co., Ltd.), and W001 (manufactured by Yusho Co., Ltd.).

Examples of the anionic surfactant include W004, W005, and W017 (manufactured by Yusho Co., Ltd.), and SANDET BL (manufactured by Sanyo Chemical Industries Ltd.).

Examples of the silicone surfactant include: TORAY SILICONE DC3PA, TORAY SILICONE SH7PA, TORAY SILICONE DC11PA, TORAY SILICONE SH21PA, TORAY SILICONE SH28PA, TORAY SILICONE SH29PA, TORAY SILICONE SH30PA, and TORAY SILICONE SH8400 (all of which are manufactured by Dow Corning Corporation); TSF-4440, TSF-4300, TSF-4445, TSF-4460, and TSF-4452 (all of which are manufactured by Momentive Performance Materials Inc.); KP341, KF6001, and KF6002 (all of which are manufactured by Shin-Etsu Chemical Co., Ltd.); and BYK307, BYK323, and BYK330 (all of which are manufactured by BYK-Chemie Japan K.K.).

Among these surfactants, one kind may be used alone, or two or more kinds may be used in combination.

The content of the surfactant is preferably 0.001 to 2.0 mass % and more preferably 0.005 to 1.0 mass % with respect to the total solid content of the composition.

<<Ultraviolet Absorber>>

It is preferable that the composition according to the present invention includes an ultraviolet absorber.

Examples of the ultraviolet absorber include conjugated diene compound and a diketone compound. Among these, a conjugated diene compound is preferable. As the conjugated diene compound, a compound represented by the following Formula (UV-1) is more preferable.

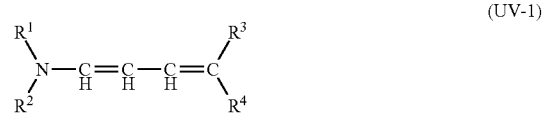

In Formula (UV-1), $R^1$ and $R^2$ each independently represent a hydrogen atom, an alkyl group having 1 to 20 carbon atoms, or an aryl group having 6 to 20 carbon atoms, and may be the same as or different from each other but does not represent a hydrogen atom at the same time.

$R^1$ and $R^2$ may form a cyclic amino group with a nitrogen atom bonded to $R^1$ and $R^2$. Examples of the cyclic amino group include a piperidino group, a morpholino group, a pyrrolidino group, a hexahydroazepino group, and a piperazino group.

$R^1$ and $R^2$ each independently represent preferably an alkyl group having 1 to 20 carbon atoms, more preferably an alkyl group having 1 to 10 carbon atoms, and still more preferably an alkyl group having 1 to 5 carbon atoms.

$R^3$ and $R^4$ represent an electron-withdrawing group. Here, the electron-withdrawing group is an electron-withdrawing group having a Hammett substituent constant $\sigma_p$ value (hereinafter, simply referred to as "$\sigma_p$ value") of 0.20 to 1.0. The $\sigma_p$ value in the electron-withdrawing group is preferably 0.30 to 0.8.

It is preferable that $R^3$ represent a group selected from a cyano group, —COOR$^5$, —CONHR$^5$, —COR$^5$, and —SO$_2$R$^5$. It is preferable that $R^4$ represent a group selected from a cyano group, —COOR$^6$, —CONHR$^6$, —COR$^6$, and —SO$_2$R$^6$. $R^5$ and $R^6$ each independently represent an alkyl group having 1 to 20 carbon atoms or an aryl group having 6 to 20 carbon atoms.

$R^3$ and $R^4$ represent preferably an acyl group, a carbamoyl group, an alkyloxycarbonyl group, an aryloxycarbonyl group, a cyano group, a nitro group, an alkylsulfonyl group, an arylsulfonyl group, a sulfonyloxy group, or a sulfamoyl group, and more preferably an acyl group, a carbamoyl group, an alkyloxycarbonyl group, an aryloxycarbonyl group, a cyano group, an alkylsulfonyl group, an arylsulfonyl group, a sulfonyloxy group, or a sulfamoyl group. In addition, $R^3$ and $R^4$ may be bonded to each other to form a cyclic electron-withdrawing group. Examples of the cyclic electron-withdrawing group which is formed by $R^3$ and $R^4$ being bonded to each other include a 6-membered ring having two carbonyl groups.

At least one of $R^1$, $R^2$, $R^3$, or $R^4$ may represent a polymer obtained from a monomer which is bonded to a vinyl group through a linking group. At least one of $R^1$, $R^2$, $R^3$, or $R^4$ may represent a copolymer obtained from the above polymer and another monomer.

Specific examples of the ultraviolet absorber represented by Formula (UV-1) include the following compounds. The description of a substituent of the ultraviolet absorber represented by Formula (UV-1) can be found in paragraphs "0024" to "0033" of WO2009/123109A (corresponding to paragraphs "0040" to "0059" of US Patent App. No. 2011/0039195A), the content of which is incorporated herein by reference. Specific preferable examples of the compound represented by Formula (UV-1) can be found in the description of Exemplary Compounds (1) to (14) in paragraphs "0034" to "0037" of WO2009/123109A (corresponding to paragraph "0060" of US Patent App. No. 2011/0039195A), the content of which is incorporated herein by reference. Examples of a commercially available product of the ultraviolet absorber represented by Formula (UV-1) include UV503 (manufactured by Daito Chemical Co., Ltd.).

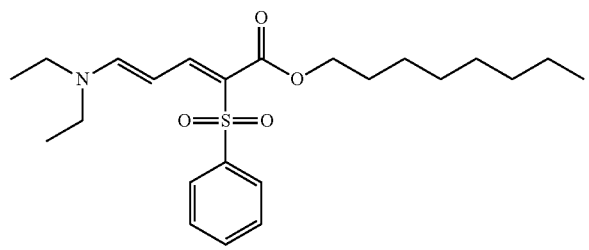 [SMILES: CCCCCCCCOC(=O)/C(=C/C=C/N(CC)CC)S(=O)(=O)c1ccccc1]

As the diketone compound used as the ultraviolet absorber, a compound represented by the following Formula (UV-2) is preferable.

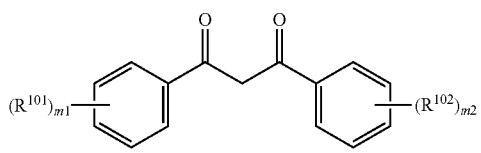

(UV-2)

In Formula (UV-2), $R^{101}$ and $R^{102}$ each independently represent a substituent, and m1 and m2 each independently represent 0 to 4. Examples of the substituent include an alkyl group, an alkenyl group, an aryl group, a heteroaryl group, an alkoxy group, an aryloxy group, a heteroaryloxy group, an acyl group, an alkoxycarbonyl group, an aryloxycarbonyl group, a heteroaryloxycarbonyl group, an acyloxy group, an amino group, an acylamino group, an alkoxycarbonylamino group, an aryloxycarbonylamino group, a heteroaryloxycarbonylamino group, a sulfonylamino group, a sulfamoyl group, a carbamoyl group, an alkylthio group, an arylthio group, a heteroarylthio group, an alkylsulfonyl group, an arylsulfonyl group, a heteroarylsulfonyl group, an alkylsulfinyl group, an arylsulfinyl group, a heteroarylsulfinyl group, an ureido group, a phosphoric amide group, a mercapto group, a sulfo group, a carboxyl group, a nitro group, a hydroxamic acid group, a sulfino group, a hydrazino group, an imino group, a silyl group, a hydroxyl group, a halogen atom, and a cyano group. Among these, an alkyl group or an alkoxy group is preferable.

The number of carbon atoms in the alkyl group is preferably 1 to 20. The alkyl group is, for example, linear, branched, or cyclic, and is preferably linear or branched and more preferably branched.

The number of carbon atoms in the alkoxy group is preferably 1 to 20. The alkoxy group is, for example, linear, branched, or cyclic, and is preferably linear or branched and more preferably branched.

It is preferable that one of $R^{101}$ and $R^{102}$ represent an alkyl group and the other one of $R^{101}$ and $R^{102}$ represent an alkoxy group.

m1 and m2 each independently represent 0 to 4. m1 and m2 each independently represent preferably an integer of 0 to 2, more preferably 0 or 1, and still more preferably 1.

Examples of the compound represented by Formula (UV-2) include the following compound.

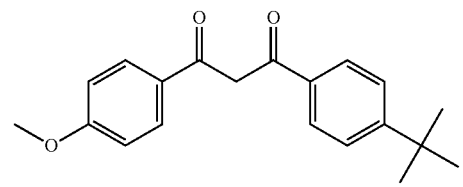 [SMILES: COc1ccc(C(=O)CC(=O)c2ccc(C(C)(C)C)cc2)cc1]

As the ultraviolet absorber, UVINUL A (manufactured by BASF SE) can also be used. In addition, as the ultraviolet absorber, an ultraviolet absorber such as an amino diene compound, a salicylate compound, a benzophenone compound, a benzotriazole compound, an acrylonitrile compound, or a triazine compound can be preferably used. Specifically, a compound described in JP2013-68814A can be used. As the benzotriazole compound, MYUA series (manufactured by Miyoshi Oil&Fat Co., Ltd.; (The Chemical Daily, Feb. 1, 2016) may be used.

The content of the ultraviolet absorber is preferably 0.01 to 10 mass % and more preferably 0.01 to 5 mass % with respect to the total solid content of the composition according to the present invention.

The content of the ultraviolet absorber is preferably 5 to 100 parts by mass with respect to 100 parts by mass of the polymerizable compound. The upper limit is preferably 80 parts by mass or less and more preferably 60 parts by mass or less. The lower limit is preferably 10 parts by mass or more and more preferably 20 parts by mass or more.

<<Polymerization Inhibitor>>

The composition according to the present invention may include a polymerization inhibitor in order to prevent unnecessary thermal polymerization of the polymerizable compound during the manufacturing or storage of the composition. Examples of the polymerization inhibitor include a phenol hydroxyl group-containing compound, an N-oxide compound, a piperidine 1-oxyl free-radical compound, a pyrrolidine 1-oxyl free-radical compound, an N-nitrosophenylhydroxyamine, a diazonium compound, a cationic dye, a sulfide group-containing compound, a nitro group-containing compound, a phosphorus compound, a lactone compound, and a transition metal compound (for example, $FeCl_3$ or $CuCl_2$). In addition, the compounds may be composite compounds in which a plurality of structures which exhibit a polymerization inhibition function such as a phenol skeleton or a phosphorus-containing skeleton are present in the same molecule. For example, a compound described in JP1998-46035A (JP-H10-46035A) is also preferably used. Specific examples of the polymerization inhibitor include hydroquinone, p-methoxyphenol, di-t-butyl-p-cresol, pyrogallol, t-butylcatechol, benzoquinone, 4,4'-thiobis(3-methyl-6-t-butylphenol), 2,2'-methylenebis(4-methyl-6-t-butylphenol), and N-nitrosophenylhydroxylamine salt (for example, an ammonium salt or a cerium (III) salt). Among these, p-methoxyphenol is preferable.

The content of the polymerization inhibitor is preferably 0.01 to 5 mass % with respect to the total solid content of the composition.

The content of the polymerization inhibitor is preferably 0.001 to 1 part by mass with respect to 100 parts by mass of the polymerizable compound. The upper limit is preferably 0.5 parts by mass or less and more preferably 0.2 parts by mass or less. The lower limit is preferably 0.01 parts by mass or more and more preferably 0.03 parts by mass or more.

<<Other Components>>

Optionally, the composition may further include a sensitizer, a curing accelerator, a filler, a thermal curing accelerator, a thermal polymerization inhibitor, a plasticizer, and other auxiliary agents (for example, conductive particles, a filler, an antifoaming agent, a flame retardant, a leveling agent, a peeling accelerator, an antioxidant, an aromatic chemical, a surface tension adjuster, or a chain transfer agent). By the near infrared absorbing composition appropriately including the components, desired stability, film properties, and the like of an optical filter such as a near infrared cut filter can be adjusted. The details of the components can be found in, for example, paragraph "0183" of JP2012-003225A (corresponding to paragraph "0237" of US Patent App. No. 2013/0034812A) and paragraphs "0101" to "0104" and "0107" to "0109" of JP2008-250074A, the content of which is incorporated herein by reference. In addition, examples of the antioxidant include a phenol compound, a phosphite compound, and a thioether compound. A phenol compound having a molecular weight of 500 or higher, a phosphite compound having a molecular weight of 500 or higher, or a thioether compound having a molecular weight of 500 or higher is more preferable.

Among these compounds, a mixture of two or more kinds may be used. As the phenol compound, any phenol compound which is known as a phenol antioxidant can be used. As the phenol compound, for example, a hindered phenol compound is preferable. In particular, a compound having a substituent at a position (ortho-position) adjacent to a phenolic hydroxyl group is preferable. As the substituent, a substituted or unsubstituted alkyl group having 1 to 22 carbon atoms is preferable, and a methyl group, an ethyl group, a propyl group, an isopropyl group, a butyl group, an isobutyl group, a t-butyl group, a pentyl group, an isopentyl group, a t-pentyl group, a hexyl group, an octyl group, an isooctyl group, or a 2-ethylhexyl group is more preferable. In addition, a compound (antioxidant) having a phenol group and a phosphite group in the same molecule is also preferable. In addition, as the antioxidant, a phosphorus antioxidant can also be preferably used. Examples of the phosphorus antioxidant include at least one compound selected from the group consisting of tris[2-[[2,4,8,10-tetrakis(1,1-dimethylethyl)dibenzo[d,f] [1,3,2]dioxaphosphepin-6-yl]oxy]ethyl]amine, tris[2-[(4,6,9,11-tetra-t-butyldibenzo[d,f][1,3,2]dioxaphosphepin-2-yl)oxy]ethyl] amine, and ethyl bis(2,4-di-t-butyl-6-methylphenyl) phosphite. The phosphorus antioxidant is easily commercially available, and examples of the commercially available product include ADEKA STAB AO-20, ADEKA STAB AO-30, ADEKA STAB AO-40, ADEKA STAB AO-50, ADEKA STAB AO-50F, ADEKA STAB AO-60, ADEKA STAB AO-60G, ADEKA STAB AO-80, and ADEKA STAB AO-330 (all of which are manufactured by Adeka Corporation).

The content of the antioxidant is preferably 0.01 to 20 mass % and more preferably 0.3 to 15 mass % with respect to the mass of the total solid content of the composition. As the antioxidant, one kind may be used alone, or two or more kinds may be used. In a case where two or more antioxidants are used in combination, it is preferable that the total content of the two or more antioxidants is in the above-described range.

(Method of Preparing Composition)

The composition according to the present invention can be prepared by mixing the above-described components with each other.

During the preparation of the composition, the respective components may be mixed with each other collectively, or may be mixed with each other sequentially after dissolved and dispersed in a solvent. In addition, during mixing, the order of addition or working conditions are not particularly limited. For example, all the components may be dissolved or dispersed in a solvent at the same time to prepare the composition. Optionally, two or more solutions or dispersions may be appropriately prepared using the respective components, and the solutions or dispersions may be mixed with each other during use (during application) to prepare the composition.

In addition, in a case where the near infrared absorber includes a pigment, it is preferable that a process of dispersing the pigment is provided. Examples of a mechanical force used for dispersing the pigment in the process of dispersing the pigment include compression, squeezing, impact, shearing, and cavitation.

Specific examples of the process include a beads mill, a sand mill, a roll mill, a ball mill, a paint shaker, a Microfluidizer, a high-speed impeller, a sand grinder, a project mixer, high-pressure wet atomization, and ultrasonic dispersion. During the pulverization of the pigment using a sand mill (beads mill), it is preferable that the process is performed under conditions for increasing the pulverization efficiency, for example, by using beads having a small size and increasing the filling rate of the beads. In addition, it is preferable that rough particles are removed by filtering, centrifugal separation, and the like. In addition, as the process and the disperser for dispersing the pigment, a process and a disperser described in "Complete Works of Dispersion Technology, Johokiko Co., Ltd., Jul. 15, 2005", "Dispersion Technique focusing on Suspension (Solid/Liquid Dispersion) and Practical Industrial Application, Comprehensive Reference List, Publishing Department of Management Development Center, Oct. 10, 1978", and paragraph "0022" JP2015-157893A can be suitably used. In addition, in the process of dispersing the pigment, the pigment may be refined in a salt milling step. A material, a device, process conditions, and the like used in the salt milling step can be found in, for example, JP2015-194521A and JP2012-046629A.

During the preparation of the composition, it is preferable that the composition is filtered through a filter, for example, in order to remove foreign matter or to reduce defects. As the filter, any filter which is used in the related art for filtering or the like can be used without any particular limitation. Examples of a material of the filter include: a fluororesin such as polytetrafluoroethylene (PTFE); a polyamide resin such as nylon (for example, nylon-6 or nylon-6,6); and a polyolefin resin (including a polyolefin resin having a high density and an ultrahigh molecular weight) such as polyethylene or polypropylene (PP). Among these materials, polypropylene (including high-density polypropylene) or nylon is preferable.

The pore size of the filter is suitably about 0.01 to 7.0 µm and is preferably about 0.01 to 3.0 µm and more preferably about 0.05 to 0.5 µm. In the above-described range, fine foreign matter can be reliably removed. In addition, it is preferable that a fibrous filter material is used. Examples of the fibrous filter material include polypropylene fiber, nylon fiber, and glass fiber. Specifically, a filter cartridge of SBP type series (manufactured by Roki Techno Co., Ltd.; for example, SBP008), TPR type series (for example, TPR002 or TPRO05), SHPX type series (for example, SHPX003), or the like can be used.

In a filter is used, a combination of different filters may be used. At this time, the filtering using a first filter may be performed once, or twice or more.

In addition, a combination of first filters having different pore sizes in the above-described range may be used. Here, the pore size of the filter can refer to a nominal value of a manufacturer of the filter. A commercially available filter can be selected from various filters manufactured by Pall Corporation (for example, DFA4201NXEY), Toyo Roshi Kaisha, Ltd., Entegris Japan Co., Ltd. (former Mykrolis Corporation), or Kits Microfilter Corporation.

A second filter may be formed of the same material as that of the first filter.

For example, the filtering using the first filter may be performed only on the dispersion, and the second filtering may be performed on a mixture of the dispersion and other components.

For example, in a case where a film is formed by coating, the viscosity (23° C.) of the composition according to the present invention is preferably in a range of 1 to 3000 mPa·s. The lower limit is preferably 3 mPa·s or higher and more preferably 5 mPa·s or higher. The upper limit is preferably 2000 mPa·s or lower and more preferably 1000 mPa-s or lower.

For example, the composition according to the present invention can also be used, for example, for a near infrared cut filter (for example, a near infrared cut filter for a wafer level lens) on a light receiving side of a solid image pickup element or as a near infrared cut filter on a back surface side (opposite to the light receiving side) of a solid image pickup element. In addition, the composition according to the present invention may be directly applied to an image sensor to form a coating film.

The composition according to the present invention can be supplied in an applicable state. Therefore, a near infrared cut filter can be easily formed on a desired member or position of a solid image pickup element.

In addition, the composition according to the present invention may be applied to a glass substrate or a layer containing copper.

It is preferable that the film obtained using the composition according to the present invention has an absorption maximum in a wavelength range of 700 to 1000 nm, and that a ratio Absorbance Amax/Absorbance A550 of an absorbance Amax at the absorption maximum to an absorbance A550 at a wavelength of 550 nm is 50 to 500, In addition, the absorption maximum of the film is more preferably in a range of 720 to 980 nm and more preferably in a range of 740 to 960 nm. In addition, the ratio absorbance Amax/absorbance A550 in the film is more preferably 70 to 450 and still more preferably 100 to 400.

In addition, the thickness of the film obtained using the composition according to the present invention is preferably 20 µm, more preferably 10 µm, and still more preferably 5 µm. For example, the lower limit of the thickness is preferably 0.1 µm or more, more preferably 0.2 m or more, and still more preferably 0.3 µm or more. In at least one of the thickness ranges, the ratio absorbance Amax/absorbance A550 is preferably 50 to 500.

It is preferable that the transmittance of the film and a near infrared cut filter described below obtained using the composition according to the present invention satisfy at least one of the following conditions (1) to (4), it is more preferable that the light transmittance of the film and the near infrared cut filter satisfy all the following conditions (1) to (4).

(1) A transmittance at a wavelength of 400 nm is preferably 70% or higher, more preferably 80% or higher, still more preferably 85% or higher, and even still more preferably 90% or higher (2) A transmittance at a wavelength of 500 nm is preferably 70% or higher, more preferably 80% or higher, still more preferably 90% or higher, and even still more preferably 95% or higher (3) A transmittance at a wavelength of 600 nm is preferably 70% or higher, more preferably 80% or higher, still more preferably 90% or higher, and even still more preferably 95% or higher (4) A transmittance at a wavelength of 650 nm is preferably 70% or higher, more preferably 80% or higher, still more preferably 90% or higher, and even still more preferably 95% or higher A transmittance of the film and the near infrared cut filter described below having a thickness of 20 µm or less obtained using the composition according to the present invention in the entire wavelength range of 400 to 650 nm is preferably 70% or higher, more preferably 80% or higher, and still more preferably 90% or higher. In addition, a transmittance at at least one point in a wavelength range of 700 to 1000 nm is preferably 20% or lower.

<Optical Filter>

Next, an optical filter according to the present invention will be described. The optical filter according to the present invention is formed using the above-described composition according to the present invention. The optical filter can be preferably used as a near infrared cut filter or an infrared transmitting filter. In addition, the optical filter can also be used as a heat ray shielding filter. In the present invention, "near infrared cut filter" refers to a filter that allows transmission of light (visible light) in the visible range and shields at least a part of light (near infrared light) in the near infrared range. In addition, in the present invention, "infrared transmitting filter" refers to a filter that shields light (visible light) in the visible range and allows transmission of at least a part of light (near infrared light) in a near infrared range.

In a case where the optical filter according to the present invention is used as an infrared transmitting filter, examples of the infrared transmitting filter include a filter that shields visible light and allows transmission of light in a wavelength range of 900 nm or longer. In a case where the optical filter according to the present invention is used as an infrared transmitting filter, it is preferable that the optical filter is a filter in which a layer including the coloring material that shields visible light is present separately from a layer which is formed using the composition according to the present invention.

In the optical filter, the thickness of the layer formed of the composition according to the present invention can be appropriately adjusted according to the purpose. The thickness is preferably 20 µm or less, more preferably 10 µm or less, and still more preferably 5 µm or less. For example, the lower limit of the thickness is preferably 0.1 µm or more, more preferably 0.2 µm or more, and still more preferably 0.3 µm or more.

In a case where the optical filter according to the present invention is used as a near infrared cut filter, the optical filter may further include, for example, an antireflection film or an ultraviolet absorbing film in addition to the layer formed of the composition according to the present invention. The details of the ultraviolet absorbing film can be found in the description of an absorbing layer described in paragraphs "0040" to "0070" and paragraphs "0119" of "0145" of WO2015/099060, the content of which is incorporated herein by reference. Examples of the antireflection film include a laminate (for example, a dielectric multi-layer film) in which a high refractive index layer and a low refractive index layer are alternately laminated. The spectral characteristics of the antireflection film can be appropriately selected depending on the wavelength of a light source, the spectral characteristics of the optical filter, and the like. By using the film formed of the composition according to the present invention and the antireflection layer in combination, a wide range of infrared light can also be shielded. The details of the antireflection film can be found in paragraphs "0255" to "0259" of JP2014-41318A, the content of which is incorporated herein by reference.

The optical filter according to the present invention can be used in various devices including a solid image pickup element such as a charge coupled device (CCD) or a complementary metal-oxide semiconductor (CMOS) device, an infrared sensor, or an image display device. In addition, the optical filter according to the present invention can be used, for example, as a lens that has a function to absorb or cut near infrared light (a camera lens for a digital camera, a mobile phone, or a vehicle-mounted camera, or an optical lens such as an a f-θ lens or a pickup lens), an optical filter for a semiconductor light-receiving element, a near infrared absorbing film or a near infrared absorbing plate that shields heat rays for energy saving, an agricultural coating film for selective use of sunlight, a recording medium using heat absorbed from near infrared light, a near infrared filter for an electronic apparatus or a picture, an eye protector, sunglasses, a heat ray shielding filter, a filter for reading and recording an optical character, a filter for preventing classified documents from being copied, or an electrophotographic photoreceptor. In addition, the near infrared cut filter according to the present invention is also useful as a noise cut filter for a CCD camera or a filter for a CMOS image sensor.

In addition, it is also preferable that the optical filter according to the present invention includes a pixel which is formed using the composition (preferably, a composition including a coloring material that shields visible light) according to the present invention and a pixel selected from the group consisting of a red pixel, a green pixel, a blue pixel, a magenta pixel, a yellow pixel, a cyan pixel, a black pixel, and an achromatic pixel <Laminate>

In addition, a laminate according to the present invention includes: a near infrared cut filter that is formed using the radiation-sensitive composition according to the present invention; and a color filter that includes a chromatic colorant. In the laminate according to the present invention, the near infrared cut filter and the color filter may be or may not be adjacent to the color filter in the thickness direction. In a case where the near infrared cut filter is not adjacent to the color filter in the thickness direction, the near infrared cut filter may be formed on another substrate other than a substrate on which the color filter is formed, or another member (for example, a microlens or a planarizing layer) constituting a solid image pickup element may be interposed between the near infrared cut filter and the color filter.

<Pattern Forming Method>

Next, a pattern forming method according to the present invention will be described. A pattern forming method according to the present invention includes: a step of forming a radiation-sensitive composition layer on a support using the radiation-sensitive composition according to the present invention; a step of exposing the radiation-sensitive composition layer in a pattern shape; and a step of forming a pattern by removing a non-exposed portion by development. Hereinafter, the respective steps will be described in detail.

<<Step of Forming Radiation-Sensitive Composition Layer>>

In the step of forming a radiation-sensitive composition layer, a radiation-sensitive composition layer is formed on a support using the radiation-sensitive composition according to the present invention.

Examples of the support include substrates formed of materials such as glass, silicon, polycarbonate, polyester, aromatic polyamide, polyamide imide, or polyimide. In addition, a support for a solid image pickup element in which a solid image pickup element (light-receiving element) such as CCD or CMOS is provided on a substrate can be used.

The pattern may be formed on a solid image pickup element-formed surface (front surface) of the substrate for a solid image pickup element, or may be formed on a solid image pickup element non-formed surface (back surface) thereof. Optionally, an undercoat layer may be provided on the support to improve adhesion with a layer above the support, to prevent diffusion of materials, or to make a surface of the substrate flat.

As a method of applying the radiation-sensitive composition according to the present invention to the support, a well-known method can be used. Examples of the well-known method include: a drop casting method; a slit coating method; a spray coating method; a roll coating method; a spin coating method; a cast coating method; a slit and spin method; a pre-wetting method (for example, a method described in JP2009-145395A); various printing methods including jet printing such as an ink jet method (for example, an on-demand method, a piezoelectric method, or a thermal method) or a nozzle jet method, flexographic printing, screen printing, gravure printing, reverse offset printing, and metal mask printing; a transfer method using metal or the like; and a nanoimprint lithography method. The application method using an ink jet method is not particularly limited, and examples thereof include a method (in particular, pp. 115 to 133) described in "Extension of Use of Ink Jet— Infinite Possibilities in Patent-" (February, 2005, S.B. Research Co., Ltd.) and methods described in JP2003-262716A, JP2003-185831A, JP2003-261827A, JP2012-126830A, and JP2006-169325A.

The radiation-sensitive composition layer formed on the support may be dried (pre-baked). In a case where a pattern is formed through a low-temperature process, pre-baking is not necessarily performed. In a case where pre-baking is performed, the pre-baking temperature is preferably 150° C. or lower, more preferably 120° C. or lower, and still more preferably 110° C. or lower. The lower limit is, for example, 50° C. or higher or 80° C. or higher. The pre-baking time is preferably 10 to 300 seconds, more preferably 40 to 250 seconds, and still more preferably 80 to 220 seconds. Drying can be performed using a hot plate, an oven, or the like.

<<Exposure Step>>

Next, the radiation-sensitive composition layer formed on the support is exposed in a pattern shape. For example, the radiation-sensitive composition layer is exposed in a pattern shape using an exposure device such as a stepper through a mask having a predetermined mask pattern, thereby exposing a pattern. As a result, an exposed portion can be cured.

As radiation (light) used during the exposure, ultraviolet rays such as g-rays or i-rays are preferably used (i-rays are more preferably used). The irradiation dose (exposure dose) is preferably 0.03 to 2.5 J/cm$^2$, and more preferably 0.05 to 1.0 J/cm$^2$.

The oxygen concentration during exposure can be appropriately selected. The exposure may be performed not only in air but also in a low-oxygen atmosphere having an oxygen concentration of 19 vol % or lower (for example, 15 vol %, 5 vol %, or substantially 0 vol %) or in a high-oxygen atmosphere having an oxygen concentration of higher than 21 vol % (for example, 22 vol %, 30 vol %, or 50 vol %). In addition, the exposure illuminance can be appropriately set and typically can be selected in a range of 1000 W/m$^2$ to 100000 W/m$^2$ (for example, 5000 W/m$^2$, 15000 W/m$^2$, or 35000 W/m$^2$). Conditions of the oxygen concentration and conditions of the exposure illuminance may be appropriately combined. For example, conditions are oxygen concentration: 10 vol % and illuminance: 10000 W/m², or oxygen concentration: 35 vol % and illuminance: 20000 W/m².

<<Development Step>>

Next, a pattern is formed by removing a non-exposed portion by development. The non-exposed portion can be removed by development using a developer. As a result, the radiation-sensitive composition of a non-exposed portion in the exposure step is eluted into the developer, and only the photocured portion remains.

As the developer, an organic alkali developer which does not cause damages to a solid image pickup element as an underlayer, a circuit or the like is desired.

For example, the temperature of the developer is preferably 20° C. to 30° C. The developing time is preferably 20 to 180 seconds. In addition, in order to further improve residue removing properties, a step of shaking the developer off per 60 seconds and supplying a new developer may be repeated multiple times.

Examples of the alkaline agent used as the developer include an organic alkaline agent such as ammonia water, ethylamine, diethylamine, dimethylethanolamine, diglycolamine, diethanolamine, hydroxyamine, ethylenediamine, tetramethylammonium hydroxide, tetraethylammonium hydroxide, tetrapropylammonium hydroxide, tetrabutylammonium hydroxide, benzyltrimethylammonium hydroxide, dimethyl bis(2-hydroxyethyl)ammonium hydroxide, choline, pyrrole, piperidine, or 1,8-diazabicyclo[5.4.0]-7-undecene. As the developer, an alkaline aqueous solution in which the above alkaline agent is diluted with pure water is preferably used. A concentration of the alkaline agent in the alkaline aqueous solution is preferably 0.001 to 10 mass % and more preferably 0.01 to 1 mass %.

In addition, an inorganic alkaline agent may be used as the developer. Preferable examples of the inorganic alkaline agent include sodium hydroxide, potassium hydroxide, sodium carbonate, sodium bicarbonate, sodium silicate, and sodium metasilicate.

In addition, a surfactant may be used as the developer. Examples of the surfactant include the surfactants described above regarding the composition according to the present invention. Among these, a nonionic surfactant is preferable.

In a case where a developer including the alkaline aqueous solution is used, it is preferable that the layer is rinsed with pure water after development.

After the development, it is preferable that the film is dried and then heated (post-baking). Post-baking is a heat treatment which is performed after development to completely cure the film. In a case where post-baking is performed, for example, the post-baking temperature is preferably 100° C. to 240° C. From the viewpoint of curing the film, the post-baking temperature is more preferably 200° C. to 230° C. In addition, in a case where an organic electroluminescence (organic EL) element is used as a light-emitting light source, or in a case where a photoelectric conversion film of an image sensor is formed of an organic material, the post-baking temperature is preferably 150° C. or lower, more preferably 120° C. or lower, still more preferably 100° C. or lower, and even still more preferably 90° C. or lower. The lower limit is, for example, 50° C. or higher. The film after the development is post-baked continuously or batchwise using heating means such as a hot plate, a convection oven (hot air circulation dryer), a high-frequency heater under the above-described conditions.

In addition, the pattern forming method according to the present invention may further include a step of exposing the radiation-sensitive composition layer after removing the non-exposed portion by development (after development) (hereinafter, the exposure after development will also be referred to as "post-exposure"). In a case where the radiation-sensitive composition including the oxime compound and the α-aminoketone compound is used as the photopolymerization initiator, it is preferable that the post-exposure is performed. By exposing the radiation-sensitive composition layer in two steps before and after the pattern formation, the radiation-sensitive composition can be appropriately cured in the initial exposure (exposure before the pattern formation), and substantially the entire area of the radiation-sensitive composition can be cured in the next exposure (the exposure after the pattern formation). As a result, even in a case where the post-baking temperature is 180° C. or lower, the curing properties of the radiation-sensitive composition can be improved.

Even in a case where the exposure is performed in two steps, post-baking may be further performed after the post-exposure. For example, the post-baking temperature is preferably 100° C. to 240° C.

<Solid Image Pickup Element>

A solid image pickup element according to the present invention includes the above-described optical filter according to the present invention. The solid image pickup element according to the present invention is configured to include the optical filter according to the present invention. The configuration of the solid image pickup element is not particularly limited as long as the solid image pickup element functions. For example, the following configuration can be adopted.

The solid image pickup element includes plural photodiodes and transfers electrodes on the support, the photodiodes constituting a light receiving area of the solid image pickup element, and the transfer electrode being formed of polysilicon or the like. In the solid image pickup element, a light shielding film formed of tungsten or the like which has openings through only light receiving sections of the photodiodes is provided on the photodiodes and the transfer electrodes, a device protective film formed of silicon nitride or the like is formed on the light shielding film so as to cover the entire surface of the light shielding film and the light receiving sections of the photodiodes, and the film according to the present invention is formed on the device protective film.

Further, a configuration in which light collecting means (for example, a microlens; hereinafter, the same shall be applied) is provided above the device protective film and below the near infrared cut filter (on a side thereof close the support), or a configuration in which light collecting means is provided on the near infrared cut filter may be adopted. In addition, in the solid image pickup element, the color filter may have a structure in which a cured film which forms each color pixel is embedded in a space which is partitioned in, for example, a lattice shape by a partition wall. In this case, it is preferable that the partition wall has a low refractive index with respect to each color pixel. Examples of an imaging device having such a structure include a device described in JP2012-227478A and JP2014-179577A.

<Image Display Device>

The optical filter according to the present invention can also be used in an image display device such as a liquid crystal display device or an organic electroluminescence (organic EL) display device. For example, by using the near infrared cut filter in combination with the respective colored pixels (for example, red, green, blue), the near infrared cut filter can be used for the purpose of shielding infrared light included in light emitted from a backlight (for example, a white light emitting diode (white LED)) of an image display device to prevent a malfunction of a peripheral device, or for the purpose of forming an infrared pixel in addition to the respective color display pixels.

The definition of the image display device and the details of each image display device can be found in, for example, "Electronic Display Device (by Akiya Sasaki, Kogyo Chosakai Publishing Co., Ltd., 1990)" or "Display Device (Sumiaki Ibuki, Sangyo Tosho Co., Ltd.). In addition, the details of a liquid crystal display device can be found in, for example, "Next-Generation Liquid Crystal Display Techniques (Edited by Tatsuo Uchida, Kogyo Chosakai Publishing Co., Ltd., 1994)". The liquid crystal display device to which the present invention is applicable is not particularly limited. For example, the present invention is applicable to various liquid crystal display devices described in "Next-Generation Liquid Crystal Display Techniques".

The image display device may include a white organic EL element. It is preferable that the white organic EL element has a tandem structure. The tandem structure of the organic EL element is described in, for example, JP2003-45676A, or pp. 326-328 of "Forefront of Organic EL Technology Development—Know-How Collection of High Brightness, High Accuracy, and Long Life" (Technical Information Institute, 2008). It is preferable that a spectrum of white light emitted from the organic EL element has high maximum emission peaks in a blue range (430 nm to 485 nm), a green range (530 nm to 580 nm), and a yellow range (580 nm to 620 nm). It is more preferable that the spectrum has a maximum emission peak in a red range (650 nm to 700 nm) in addition to the above-described emission peaks.

<Infrared Sensor>

An infrared sensor according to the present invention includes the above-described optical filter according to the present invention. The configuration of the infrared sensor is not particularly limited as long as it includes the optical filter according to the present invention and functions as an infrared sensor.

Hereinafter, an embodiment of the infrared sensor according to the present invention will be described using the drawings.

In FIG. 1, reference numeral 110 represents a solid image pickup element. In an imaging region provided on a solid image pickup element 110, near infrared cut filters 111 and infrared transmitting filters 114 are provided. In addition, color filters 112 are laminated on the near infrared cut filters 111. Microlenses 115 are disposed on an incidence ray hv side of the color filters 112 and the infrared transmitting filters 114. A planarizing layer 116 is formed so as to cover the microlenses 115. The near infrared cut filter 111 can be formed using the composition according to the present invention.

The color filters 112 is not particularly limited as long as pixels which allow transmission of light having a specific wavelength in the visible range and absorbs the light are formed therein, and well-known color filters of the related art for forming an image can be used. For example, pixels of red (R), green (G), and blue (B) are formed in the color filters. For example, the details of the color filters can be found in paragraphs "0214" to "0263" of JP2014-043556A, the content of which is incorporated herein by reference.

Characteristics of the infrared transmitting filters 114 can be selected depending on the emission wavelength of the infrared LED described below. For example, in a case where the emission wavelength of the infrared LED is 850 nm, a maximum value of a light transmittance of the infrared transmitting filter 114 in the thickness direction of the film in a wavelength range of 400 to 650 nm is preferably 30% or lower, more preferably 20% or lower, still more preferably 10% or lower and even still more preferably 0.1% or lower. It is preferable that the transmittance satisfies the above-described conditions in the entire wavelength range of 400 to 650 nm. The maximum value of the light transmittance in a wavelength range of 400 to 650 nm is typically 0.1% or higher.

A minimum value of a light transmittance of the infrared transmitting filter 114 in the thickness direction of the film in a wavelength range of 800 nm or longer (preferably 800 to 1300 nm) is preferably 70% or higher, more preferably 80% or higher, and still more preferably 90% or higher. It is preferable that the transmittance satisfies the above-described conditions in at least a part of a wavelength range of 800 nm or longer, and it is more preferable that the transmittance satisfies the above-described conditions at a wavelength corresponding to the emission wavelength of the infrared LED. The minimum value of the light transmittance in a wavelength range of 900 to 1300 nm is typically 99.9% or lower.

The thickness of the infrared transmitting filter 114 is preferably 100 μm or less, more preferably 15 μm or less, still more preferably 5 m or less, and even still more preferably 1 μm or less. The lower limit value is preferably 0.1 μm. In a case where the thickness is in the above-described range, the film can satisfy the above-described spectral characteristics.

A method of measuring the spectral characteristics, the thickness, and the like of the infrared transmitting filter 114 is as follows.

The thickness is obtained by measuring the thickness of the dried substrate including the film using a stylus surface profilometer (DEKTAK 150, manufactured by ULVAC Inc.).

The spectral characteristics of the film are values obtained by measuring the transmittance in a wavelength range of 300 to 1300 nm using an ultraviolet-visible-near infrared spectrophotometer (U-4100, manufactured by Hitachi High-Technologies Corporation).

The infrared transmitting filter 114 having the above-described spectral characteristics can be formed using a composition including the coloring material that shields visible light. The details of the coloring material that shields visible light are the same as the range described above regarding the composition according to the present invention.

In addition, for example, in a case where the emission wavelength of the infrared LED is 940 nm, it is preferable that a maximum value of a light transmittance of the infrared transmitting filter 114 in a thickness direction in a wavelength range of 450 to 650 nm is 20% or lower, that a light transmittance of the infrared transmitting filter 114 in the thickness direction at a wavelength of 835 nm is 20% or lower, and that a minimum value of a light transmittance of the infrared transmitting filter 114 in the thickness direction in a wavelength range of 1000 to 1300 nm is 70% or higher.

The infrared transmitting filter 114 having the above-described spectral characteristics can be manufactured using a composition including the coloring material that shields visible light and a near infrared absorbing compound having an absorption maximum in a wavelength range of 750 to 950 nm. The details of the coloring material that shields visible light are the same as the range described above regarding the composition according to the present invention. Examples of the near infrared absorbing compound include the near infrared absorbing compounds described above regarding the composition according to the present invention.

EXAMPLES

Hereinafter, the present invention will be described in detail using examples. Materials, used amounts, ratios, treatment details, treatment procedures, and the like shown in the following examples can be appropriately changed within a range not departing from the scope of the present invention. Accordingly, the scope of the present invention is not limited to the following specific examples. Unless specified otherwise, "%" and "part(s)" represent "mass %" and "part(s) by mass". In the following structural formulae, Me represents a methyl group, and Ph represents a phenyl group.

<Method of Measuring Acid Value>

A measurement sample was dissolved in a mixed solvent including tetrahydrofuran and water at a ratio (mass ratio; tetrahydrofuran/water) of 9/1, and the obtained solution was neutralized and titrated with a 0.1 mol/L sodium hydroxide aqueous solution at 25° C. using a potentiometric titrator (trade name: AT-510, manufactured by Kyoto Electronics Manufacturing Co., Ltd.). An inflection point of a titration pH curve was set as a titration end point, and the acid value was calculated from the following expression.

$$A = 56.11 \times Vs \times 0.5 \times f/w$$

A: the acid value (mgKOH/g)
Vs: the amount (mL) of the 0.1 mol/L sodium hydroxide aqueous solution used for the titration
f: the titer of the 0.1 mol/L sodium hydroxide aqueous solution
w: the mass (g) of the measurement sample (expressed in terms of solid contents)

<Measurement of Amine Value>

A measurement sample was dissolved in acetic acid, and the obtained solution was neutralized and titrated with a 0.1 mol/L perchloric acid/acetic acid solution at 25° C. using a potentiometric titrator (trade name: AT-510, manufactured by Kyoto Electronics Manufacturing Co., Ltd.). An inflection point of a titration pH curve was set as a titration end point, and the amine value was calculated from the following expression.

$$B = 56.11 \times Vs \times 0.1 \times f/w$$

B: amine value (mgKOH/g)
Vs: the amount (mL) of the 0.1 mol/L perchloric acid/acetic acid solution used for the titration
f: the titer of the 0.1 mol/L perchloric acid/acetic acid solution
w: the mass (g) of the measurement sample (expressed in terms of solid contents)

<Measurement of Weight-Average Molecular Weight>

In the measurement of the weight-average molecular weight of the resin, HPC-8220GPC (manufactured by Tosoh Corporation) was used as a measuring device, TSK guard column Super HZ-L was used as a guard column, a column in which Tsk gel Super HZM-M, TSK gel Super HZ4000, TSK gel Super HZ3000, and TSK gel Super HZ2000 were connected in series was used as a column, and the column temperature was set as 40° C. Under the above-described conditions, 10 μL of a tetrahydrofuran solution (sample concentration: 0.1 mass %) was injected, tetrahydrofuran as an elution solvent was caused to flow at a flow rate of 0.35 mL per minute, a sample peak was detected using a differential refractive index (RI) detector, and the weight-average molecular weight of the resin was calculated from a calibration curve prepared using standard polystyrene.

<Preparation of Dispersion>

(Dispersion 1)

7.8 parts by mass of a compound 1, 1.5 parts by mass of a pigment derivative 1, 5.6 parts by mass of a dispersant 1, 85 parts by mass of propylene glycol monomethyl ether acetate (PGMEA), and 200 parts by mass of zirconia beads having a diameter of 0.5 mm were dispersed using a paint shaker for 30 minutes and then were filtered through DFA4201NXEY (a 0.45 μm nylon filter, manufactured by Pall Corporation). Next, the zirconia beads were separated by filtration. As a result, a dispersion 1 was prepared.

Compound 1: the following compound

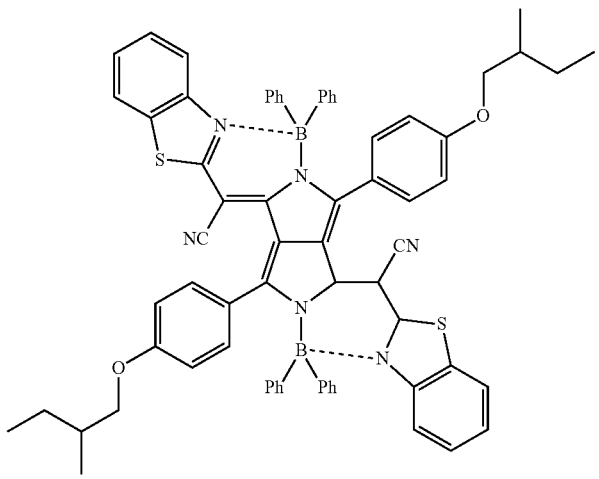

-continued

Pigment derivative 1: the following compound

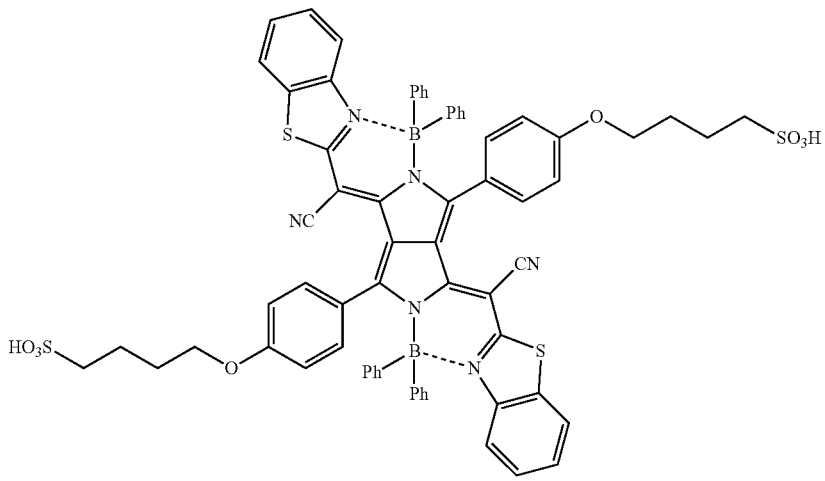

Dispersant 1: a resin having the following structure (acid value=32.3 mgKOH/g, amine value=45.0 mgKOH/g, weight-average molecular weight=21000), a numerical value added to a main chain represents a molar ratio of a repeating unit, a numerical value added to a side chain represents the number of repeating units, and the dispersant 1 is an alkali-soluble resin.

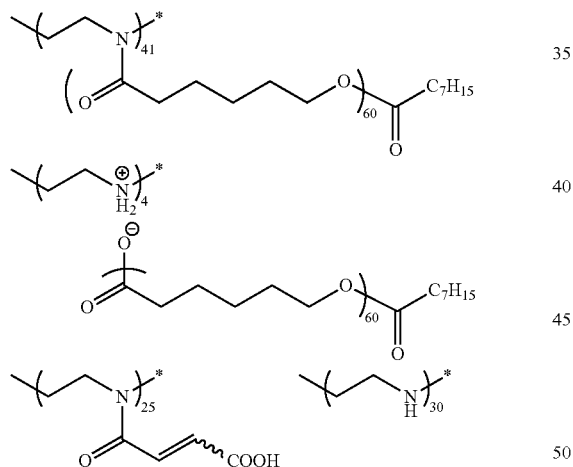

Compound 2: the following compound

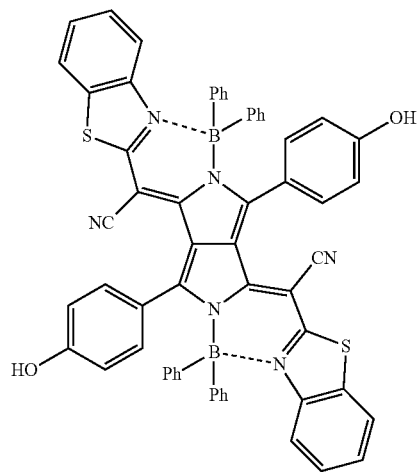

(Dispersion 2)

7.8 parts by mass of a compound 2, 1.5 parts by mass of the pigment derivative 1, 5.6 parts by mass of the dispersant 1, 85 parts by mass of propylene glycol monomethyl ether acetate (PGMEA), and 200 parts by mass of zirconia beads having a diameter of 0.5 mm were dispersed using a paint shaker for 30 minutes and then were filtered through DFA4201NXEY (a 0.45 μm nylon filter, manufactured by Pall Corporation). Next, the zirconia beads were separated by filtration. As a result, a dispersion 2 was prepared.

(Dispersion 3)

7.8 parts by mass of a compound 3, 1.5 parts by mass of the pigment derivative 1, 5.6 parts by mass of the dispersant 1, 85 parts by mass of propylene glycol monomethyl ether (PGME), and 200 parts by mass of zirconia beads having a diameter of 0.5 mm were dispersed using a paint shaker for 30 minutes and then were filtered through DFA4201NXEY (a 0.45 μm nylon filter, manufactured by Pall Corporation). Next, the zirconia beads were separated by filtration. As a result, a dispersion 3 was prepared.

Compound 3: the following compound

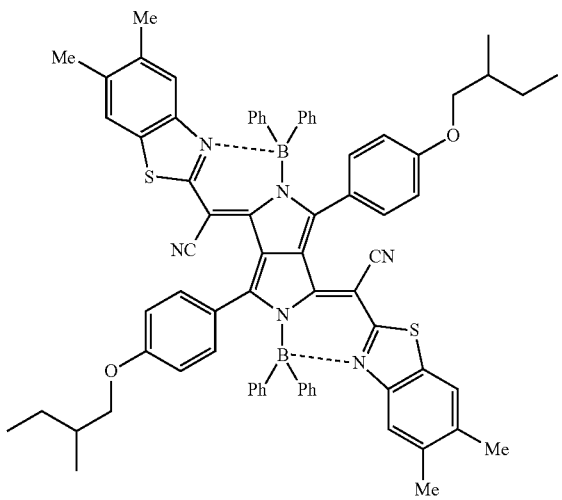

(Dispersion 4)

7.8 parts by mass of a compound 4 (IRA884, manufactured by Exiton, Inc.), 5.6 parts by mass of the dispersant 1, 85 parts by mass of PGMEA, and 200 parts by mass of zirconia beads having a diameter of 0.5 mm were dispersed using a paint shaker for 30 minutes and then were filtered through DFA4201NXEY (a 0.45 μm nylon filter, manufactured by Pall Corporation). Next, the zirconia beads were separated by filtration. As a result, a dispersion 4 was prepared.

(Dispersion 5)

7.8 parts by mass of a compound 5 (SDO-C33, manufactured by Arimoto Chemical Co., Ltd.), 5.6 parts by mass of the dispersant 1, 85 parts by mass of PGMEA, and 200 parts by mass of zirconia beads having a diameter of 0.5 mm were dispersed using a paint shaker for 30 minutes and then were filtered through DFA4201NXEY (a 0.45 μm nylon filter, manufactured by Pall Corporation). Next, the zirconia beads were separated by filtration. As a result, a dispersion 5 was prepared.

(Dispersion 6)

7.8 parts by mass of a compound 6 (SMP-388, manufactured by Hayashibara Co., Ltd.), 5.6 parts by mass of the dispersant 1, 85 parts by mass of PGMEA, and 200 parts by mass of zirconia beads having a diameter of 0.5 mm were dispersed using a paint shaker for 30 minutes and then were filtered through DFA4201NXEY (a 0.45 μm nylon filter, manufactured by Pall Corporation). Next, the zirconia beads were separated by filtration. As a result, a dispersion 6 was prepared.

(Dispersion 7)

7.8 parts by mass of a compound 7, 1.5 parts by mass of a pigment derivative 2, 5.6 parts by mass of a dispersant 2, 85 parts by mass of propylene glycol monomethyl ether acetate (PGMEA), and 200 parts by mass of zirconia beads having a diameter of 0.5 mm were dispersed using a paint shaker for 30 minutes and then were filtered through DFA4201NXEY (a 0.45 μm nylon filter, manufactured by Pall Corporation). Next, the zirconia beads were separated by filtration. As a result, a dispersion 7 was prepared.

Compound 7: the following compound

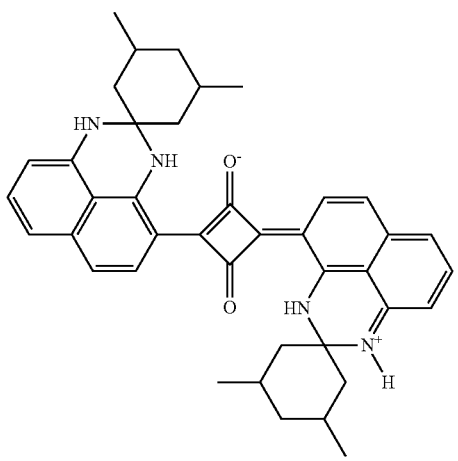

Pigment derivative 2: the following compound

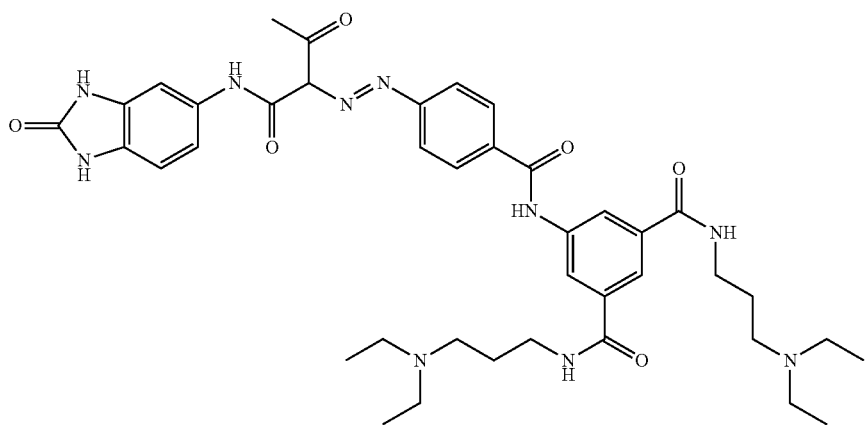

Dispersant 2: a resin having the following structure (acid value=57 mgKOH/g, weight-average molecular weight=33000), a numerical value added to a main chain represents a molar ratio of a repeating unit, a numerical value added to a side chain represents the number of repeating units, and the dispersant 2 is an alkali-soluble resin.

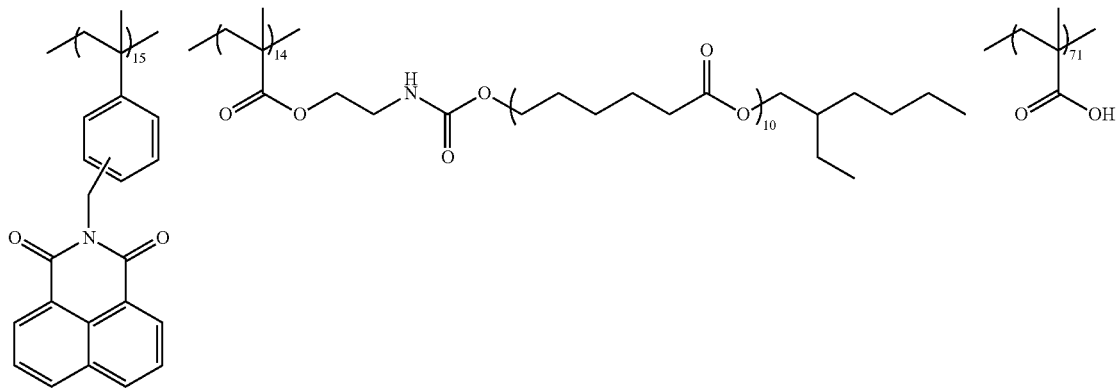

(Dispersion 8)

YMS-01A-2 (manufactured by Sumitomo Metal Mining Co., Ltd., a dispersion of tungsten particles) was used as a dispersion 8.

(Dispersion 9)

7.8 parts by mass of a compound 9 (IRG-068, manufactured by Nippon Kayaku Co., Ltd.), 5.6 parts by mass of the dispersant 1, 85 parts by mass of PGMEA, and 200 parts by mass of zirconia beads having a diameter of 0.5 mm were dispersed using a paint shaker for 30 minutes and then were filtered through DFA4201NXEY (a 0.45 m nylon filter, manufactured by Pall Corporation). Next, the zirconia beads were separated by filtration. As a result, a dispersion 10 was prepared.

(Dispersion 10)

7.8 parts by mass of a compound 10 (IRA868, manufactured by Exiton, Inc.), 5.6 parts by mass of the dispersant 1, 85 parts by mass of PGMEA, and 200 parts by mass of zirconia beads having a diameter of 0.5 mm were dispersed using a paint shaker for 30 minutes and then were filtered through DFA4201NXEY (a 0.45 μm nylon filter, manufactured by Pall Corporation). Next, the zirconia beads were separated by filtration. As a result, a dispersion 11 was prepared.

<Preparation of Radiation-Sensitive Composition>

The following materials shown in the following table were mixed and stirred at a ratio (part(s) by mass) shown below, and the mixture was filtered through a through a nylon filter (DFA4201NXEY, manufactured by Pall Corporation) having a pore size of 0.45 m. As a result, a radiation-sensitive composition was prepared. In the following table, "M/B ratio" represents a mass ratio (radically polymerizable compound/resin having an acid group) of a radically polymerizable compound to a resin having an acid group.

TABLE 1

| | Dispersion | | Radically Polymerizable Compound | | Alkali-Soluble Resin | | Photopolymerization Initiator | | Ultraviolet Absorber | |
|---|---|---|---|---|---|---|---|---|---|---|
| | Kind | Addition Amount | Kind | Addition Amount | Kind | Addition Amount | Kind | Addition Amount | Kind | Addition Amount |
| Example 1 | Dispersion 1 | 58.1 | M-510 | 4.3 | Resin A | 5.4 | C-1 | 1 | D-1 | 1.5 |
| Example 2 | Dispersion 2 | 58.1 | M-510 | 4.3 | Resin A | 5.4 | C-1 | 1 | D-1 | 1.5 |
| Example 3 | Dispersion 3 | 58.1 | M-510 | 4.3 | Resin A | 5.4 | C-1 | 1 | D-1 | 1.5 |
| Example 4 | Dispersion 1 | 58.1 | M-510 | 3 | Resin A | 6.7 | C-1 | 1 | D-1 | 1.5 |
| Example 5 | Dispersion 1 | 58.1 | M-510 | 5.3 | Resin A | 4.4 | C-1 | 1 | D-1 | 1.5 |
| Example 6 | Dispersion 1 | 58.1 | M-510 | 5.3 | Resin A | 4.4 | C-1 | 1 | D-1 | 1.5 |

TABLE 1-continued

| | | | | | | | | | | |
|---|---|---|---|---|---|---|---|---|---|---|
| Example 7 | Dispersion 1 | 58.1 | M-510 | 5.3 | Resin A | 4.4 | C-1 | 1 | D-1 | 1.5 |
| Example 8 | Dispersion 1 | 58.1 | M-510 | 5.3 | Resin A | 4.4 | C-1 | 1 | D-1 | 1.5 |
| Example 9 | Dispersion 1 | 58.1 | M-510 | 5.3 | Resin A | 4.4 | C-2/C-3 | 0.7/0.3 | D-1 | 1.5 |
| Example 10 | Dispersion 1 | 58.1 | M-510 | 5.3 | Resin A | 4.4 | C-2/C-3 | 0.7/0.3 | D-1 | 1.5 |
| Example 11 | Dispersion 1 | 58.1 | M-510 | 5.3 | Resin A | 4.4 | C-2 | 1 | D-1 | 1.5 |
| Example 12 | Dispersion 1 | 58.1 | M-510 | 5.3 | Resin A | 4.4 | C-4/C-3 | 2/0.3 | D-1 | 1.5 |
| Example 13 | Dispersion 1 | 58.1 | M-510 | 5.3 | Resin A | 4.4 | C-4/C-2 | 2/0.3 | D-1 | 1.5 |
| Example 14 | Dispersion 1 | 58.1 | M-510 | 4.3 | Resin A | 5.4 | C-1 | 1 | — | |
| Example 15 | Dispersion 1 | 58.1 | M-305 | 4.3 | Resin A | 5.4 | C-1 | 1 | D-1 | 1.5 |
| Example 16 | Dispersion 4 | 58.1 | M-510 | 4.3 | Resin A | 5.4 | C-1 | 1 | D-1 | 1.5 |
| Example 17 | Dispersion 5 | 58.1 | M-510 | 4.3 | Resin A | 5.4 | C-1 | 1 | D-1 | 1.5 |
| Example 18 | Dispersion 6 | 58.1 | M-510 | 4.3 | Resin A | 5.4 | C-1 | 1 | D-1 | 1.5 |
| Example 19 | Dispersion 7 | 58.1 | M-510 | 4.3 | Resin A | 5.4 | C-1 | 1 | D-1 | 1.5 |
| Example 20 | Dispersion 1/Dispersion 8 | 29/10.9 | M-510 | 4.3 | Resin A | 5.4 | C-1 | 1 | D-1 | 1.5 |
| Example 21 | Dispersion 1 | 58.1 | M-510 | 4.3 | Resin A | 5.4 | C-1 | 1 | D-1 | 1.5 |
| Example 22 | Dispersion 1 | 58.1 | M-510 | 4.3 | Resin A | 5.4 | C-1 | 1 | D-2 | 1.5 |
| Example 23 | Dispersion 1 | 58.1 | M-510 | 4.3 | Resin A | 5.4 | C-1 | 1 | D-3 | 1.5 |
| Example 24 | Dispersion 1 | 58.1 | M-510 | 4.3 | Resin A | 5.4 | C-5 | 1 | D-1 | 1.5 |
| Example 25 | Dispersion 1 | 58.1 | M-510 | 4.3 | Resin B | 5.4 | C-1 | 1 | D-1 | 1.5 |
| Comparative Example 1 | Dispersion 7 | 58.1 | M-510 | 2.2 | Resin A | 7.5 | C-1 | 1 | D-1 | 1.5 |
| Comparative Example 2 | Dispersion 7 | 58.1 | M-510 | 2.6 | Resin A | 7.1 | C-1 | 1 | D-1 | 1.5 |
| Comparative Example 3 | Dispersion 7 | 58.1 | M-510 | 5.8 | Resin A | 3.9 | C-1 | 1 | D-1 | 1.5 |
| Comparative Example 4 | Dispersion 7 | 58.1 | M-510 | 5.5 | Resin A | 4.1 | C-1 | 1 | D-1 | 1.5 |
| Comparative Example 6 | Dispersion 9 | 58.1 | M-510 | 5.3 | Resin A | 4.4 | C-1 | 1 | D-1 | 1.5 |
| Comparative Example 7 | Dispersion 10 | 58.1 | M-510 | 5.3 | Resin A | 4.4 | C-1 | 1 | D-1 | 1.5 |

| | Chain Transfer Agent | | Surfactant | | Polymerization Inhibitor | | Solvent | | M/B Ratio | Pigment Concentration (mass %) |
|---|---|---|---|---|---|---|---|---|---|---|
| | Kind | Addition Amount | Kind | Addition Amount | Kind | Addition Amount | Kind | Addition Amount | | |
| Example 1 | — | — | F-1 | 0.03 | G-1 | 0.002 | PGMEA | 29.67 | 0.5 | 26 |
| Example 2 | — | — | F-1 | 0.03 | G-1 | 0.002 | PGMEA | 29.67 | 0.5 | 26 |
| Example 3 | — | — | F-1 | 0.03 | G-1 | 0.002 | PGME | 29.67 | 0.5 | 26 |
| Example 4 | — | — | F-1 | 0.03 | G-1 | 0.002 | PGMEA | 29.67 | 0.3 | 26 |
| Example 5 | — | — | F-1 | 0.03 | G-1 | 0.002 | PGMEA | 29.67 | 0.7 | 26 |
| Example 6 | E-1 | 0.2 | F-1 | 0.03 | G-1 | 0.002 | PGMEA | 29.47 | 0.7 | 26 |
| Example 7 | E-2 | 0.2 | F-1 | 0.03 | G-1 | 0.002 | PGMEA | 29.47 | 0.7 | 26 |
| Example 8 | E-3 | 0.2 | F-1 | 0.03 | G-1 | 0.002 | PGMEA | 29.47 | 0.7 | 26 |
| Example 9 | — | — | F-1 | 0.03 | G-1 | 0.002 | PGMEA | 29.67 | 0.7 | 26 |
| Example 10 | E-1 | 0.1 | F-1 | 0.03 | G-1 | 0.002 | PGMEA | 29.57 | 0.5 | 26 |
| Example 11 | — | — | F-1 | 0.03 | G-1 | 0.002 | PGMEA | 29.67 | 0.7 | 26 |
| Example 12 | — | — | F-1 | 0.03 | G-1 | 0.002 | PGMEA | 28.37 | 0.7 | 26 |
| Example 13 | — | — | F-1 | 0.03 | G-1 | 0.002 | PGMEA | 28.37 | 0.7 | 26 |
| Example 14 | — | — | F-1 | 0.03 | G-1 | 0.002 | PGMEA | 31.17 | 0.5 | 26 |
| Example 15 | — | — | F-1 | 0.03 | G-1 | 0.002 | PGMEA | 29.67 | 0.5 | 26 |
| Example 16 | — | — | F-1 | 0.03 | G-1 | 0.002 | PGMEA | 29.67 | 0.5 | 26 |
| Example 17 | — | — | F-1 | 0.03 | G-1 | 0.002 | PGMEA | 29.67 | 0.5 | 26 |
| Example 18 | — | — | F-1 | 0.03 | G-1 | 0.002 | PGMEA | 29.67 | 0.5 | 26 |
| Example 19 | — | — | F-1 | 0.03 | G-1 | 0.002 | PGMEA | 29.67 | 0.5 | 26 |
| Example 20 | — | — | F-1 | 0.03 | G-1 | 0.002 | PGMEA | 47.87 | 0.5 | 26 |
| Example 21 | — | — | F-1 | 0.03 | G-1 | 0.002 | BDGAC | 29.67 | 0.5 | 26 |
| Example 22 | — | — | F-1 | 0.03 | G-1 | 0.002 | PGMEA | 29.67 | 0.5 | 26 |
| Example 23 | — | — | F-1 | 0.03 | G-1 | 0.002 | PGMEA | 29.67 | 0.5 | 26 |
| Example 24 | — | — | F-1 | 0.03 | G-1 | 0.002 | PGMEA | 29.67 | 0.5 | 26 |
| Example 25 | — | — | F-1 | 0.03 | G-1 | 0.002 | PGMEA | 29.67 | 0.5 | 26 |
| Comparative Example 1 | — | — | F-1 | 0.03 | G-1 | 0.002 | PGMEA | 29.67 | 0.2 | 26 |
| Comparative Example 2 | — | — | F-1 | 0.03 | G-1 | 0.002 | PGMEA | 29.67 | 0.25 | 26 |
| Comparative Example 3 | — | — | F-1 | 0.03 | G-1 | 0.002 | PGMEA | 29.67 | 1.5 | 26 |
| Comparative Example 4 | — | — | F-1 | 0.03 | G-1 | 0.002 | PGMEA | 29.67 | 0.75 | 26 |

TABLE 1-continued

| | | | | | | | | | |
|---|---|---|---|---|---|---|---|---|---|
| Comparative Example 6 | — | — | F-1 | 0.03 | G-1 | 0.002 | PGMEA | 29.67 | 0.7 | 26 |
| Comparative Example 7 | — | — | F-1 | 0.03 | G-1 | 0.002 | PGMEA | 29.67 | 0.7 | 26 |

The materials shown above in the table are as follows.
(Radically Polymerizable Compound)
M-510: ARONIX M-510 (manufactured by Toagosei Co., Ltd., a polybasic acid group-modified acrylic oligomer)
M-305: ARONIX M-305 (manufactured by Toagosei Co., Ltd., a mixture of pentaerythritol triacrylate and pentaerythritol tetraacrylate, containing 55 to 63 mass % of pentaerythritol triacrylate)
(Alkali-Soluble Resin)
Resin A: a resin having the following structure (acid value=101 mgKOH/g, weight-average molecular weight=38900), a numerical value added to a main chain represents a mass ratio of a repeating unit, a numerical value added to a side chain represents the number of repeating units.

D-1: the following compound

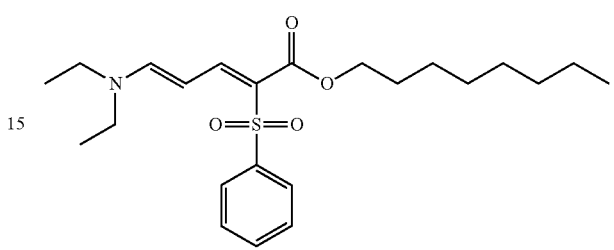

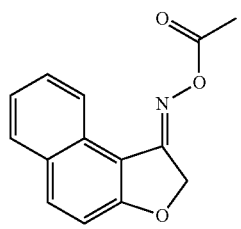 [SMILES: CC(=O)O/N=C1\COc2ccc3ccccc3c21]

Resin B: ACRYCURE RD-F8 (manufactured by Nippon Shokubai Co., Ltd.)
(Photoradical Polymerization Initiator)
C-1: IRGACURE OXE 02 (manufactured by BASF SE)
C-2: IRGACURE 369 (manufactured by BASF SE)
C-3: the following compound -continued
D-2: the following compound

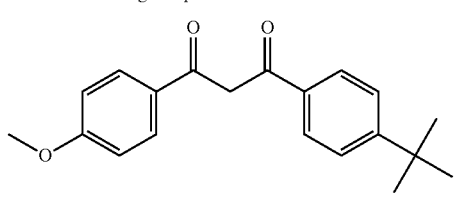

D-3: UVINULA (manufactured by BASF SE)
(Chain Transfer Agent)
E-1: the following compound

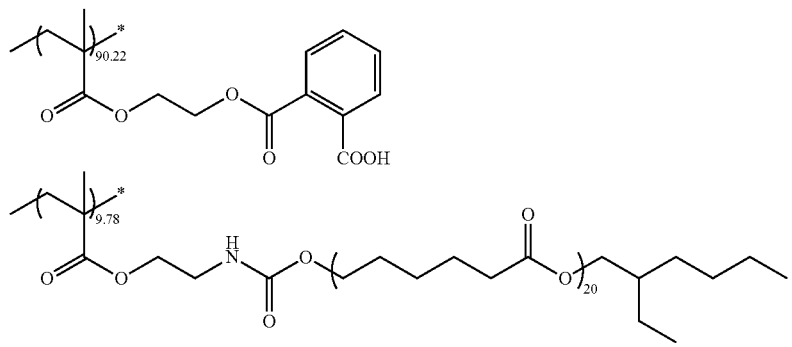

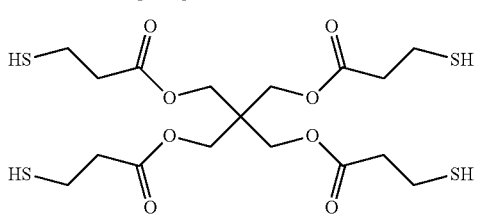

C-4: B-CIM (manufactured by Hodogaya Chemical Co., Ltd., 2,2'-bis(2-chlorophenyl)-4,4',5,5'-tetraphenyl-1,2'-biimidazole)
C-5: IRGACURE OXEO 1 (manufactured by BASF SE)
(Ultraviolet Absorber)

E-2: SANCELER M (manufactured by Sanshin Chemical Industry Co., Ltd., 2-mercaptobenzothiazole)
E-3: KARENZ MTBD1 (manufactured by Showa Denko K.K., 1,4-bis(3-mercaptobutyryloxy)butane)

(Surfactant)

F-1: the following mixture (weight-average molecular weight=14000, "%" representing the proportion of a repeating unit is mass %)

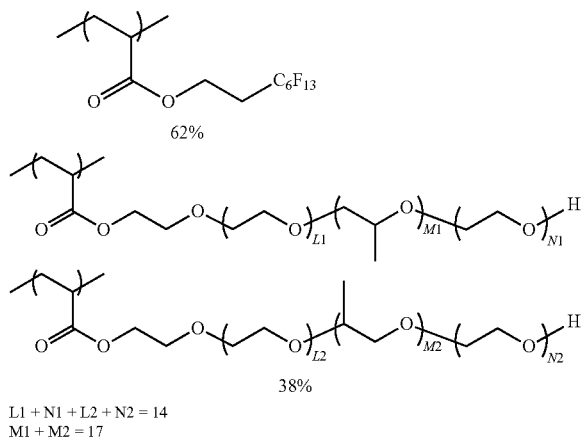

L1 + N1 + L2 + N2 = 14
M1 + M2 = 17

(Polymerization Inhibitor)
G-1: p-methoxyphenol
(Solvent)
PGMEA: propylene glycol monomethyl ether acetate
PGME: propylene glycol monomethyl ether
BDGAC: diethylene glycol monobutyl ether acetate
<Evaluation>
(Rectangularity)

Each of the radiation-sensitive compositions was applied to a silicon wafer with an undercoat layer using a spin coating method such that the thickness after the application was 0.7 μm, and then was heated using a hot plate at 100° C. for 2 minutes. As a result, a radiation-sensitive composition layer was obtained.

Next, using an i-ray stepper exposure device FPA-3000 i5+(manufactured by Canon Corporation), the obtained radiation-sensitive composition layer was exposed (an optimum exposure dose was selected such that the line width was 1.1 μm) through a mask having a 1.1 μm×1.1 μm Bayer pattern.

Next, puddle development was performed on the exposed radiation-sensitive composition layer at 23° C. for 60 seconds using a tetramethylammonium hydroxide (TMAH) 0.3 mass % aqueous solution. Next, the silicon wafer was rinsed by spin showering and was washed with pure water. As a result, a pattern was obtained.

A cross-section (pixel side wall) of the pattern portion was observed (magnification: 25000 times) with a scanning electron microscope (SEM) to evaluate rectangularity. The results are shown in the table below.

4: the angle of the pixel side wall was 85° or more and less than 95°

3: the angle of the pixel side wall was 80° or more and less than 85°, or was 95° or more and less than 100°

2: the angle of the pixel side wall was 70° or more and less than 80°, or was 100° or more and less than 110°

1: the angle of the pixel side wall was lower than 70°, or was 110° or more

<Remaining of Residues>

Each of the radiation-sensitive compositions was applied to a silicon wafer with an undercoat layer using a spin coating method such that the thickness after the application was 0.7 μm, and then was heated using a hot plate at 100° C. for 2 minutes. As a result, a radiation-sensitive composition layer was obtained.

Next, using an i-ray stepper exposure device FPA-3000 i5+(manufactured by Canon Corporation), the obtained radiation-sensitive composition layer was exposed (an optimum exposure dose was selected such that the line width was 1.1 μm) through a mask having a 1.1 μm×1.1 μm Bayer pattern.

Next, puddle development was performed on the exposed radiation-sensitive composition layer at 23° C. for 60 seconds using a tetramethylammonium hydroxide (TMAH) 0.3 mass % aqueous solution. Next, the silicon wafer was rinsed by spin showering and was washed with pure water. As a result, a pattern was obtained.

The amount of residues remaining on the underlayer of the obtained pattern was evaluated by binarization of the image. The results are shown in the table below.

3: the amount of the residues was lower than 1% with respect to the total area of the underlayer 2: the amount of the residues was 1% to 3% with respect to the total area of the underlayer 1: the amount of the residues was higher than 3% with respect to the total area of the underlayer (Spectral Characteristics)

Each of the radiation-sensitive compositions according to Examples and Comparative Examples obtained as described above was applied to a glass wafer using a spin coating method such that the thickness after the application was 0.7 μm, and then was heated using a hot plate at 100° C. for 2 minutes. Next, the glass wafer was exposed using an i-ray stepper exposure device FPA-3000 i5+ (manufactured by Canon Corporation) at 1000 mJ/cm$^2$. Further, the glass wafer was heated using a hot plate at 220° C. for 5 minutes. As a result a radiation-sensitive composition layer was formed. Regarding the substrate on which the radiation-sensitive composition layer was formed, an absorption maximum, an absorbance Amax at the absorption maximum, and an absorbance A550 at a wavelength of 550 nm were obtained using a spectrophotometer U-4100 (manufactured by Hitachi High-Technologies Corporation). Next, a ratio (absorbance Amax/absorbance A550) of the absorbance Amax at the absorption maximum to the absorbance A550 at a wavelength of 550 nm was calculated.

5: the ratio absorbance Amax/absorbance A550 was 100 to 500, and the absorption maximum was 700 nm to 1000 nm 4: the ratio absorbance Amax/absorbance A550 was 50 or higher and lower than 100, and the absorption maximum was 700 nm to 1000 nm 3: the ratio absorbance Amax/absorbance A550 was 20 or higher and lower than 50, and the absorption maximum was 700 nm to 1000 nm 2: the ratio absorbance Amax/absorbance A550 was lower than 20, and the absorption maximum was 700 nm to 1000 nm 1: the ratio absorbance Amax/absorbance A550 was lower than 20, and the absorption maximum was lower than 700 nm or higher than 1000 nm

TABLE 2

| | Rectangularity | Remaining of Residues | Spectral Characteristics |
|---|---|---|---|
| Example 1 | 4 | 3 | 5 |
| Example 2 | 4 | 3 | 5 |
| Example 3 | 4 | 3 | 5 |
| Example 4 | 3 | 3 | 5 |
| Example 5 | 3 | 2 | 5 |
| Example 6 | 4 | 3 | 5 |
| Example 7 | 3 | 3 | 5 |
| Example 8 | 4 | 2 | 5 |
| Example 9 | 4 | 2 | 5 |

TABLE 2-continued

| | Rectangularity | Remaining of Residues | Spectral Characteristics |
|---|---|---|---|
| Example 10 | 4 | 3 | 5 |
| Example 11 | 3 | 2 | 5 |
| Example 12 | 3 | 2 | 5 |
| Example 13 | 3 | 2 | 5 |
| Example 14 | 3 | 3 | 5 |
| Example 15 | 4 | 3 | 5 |
| Example 16 | 4 | 3 | 4 |
| Example 17 | 4 | 3 | 4 |
| Example 18 | 4 | 3 | 4 |
| Example 19 | 4 | 3 | 5 |
| Example 20 | 4 | 3 | 5 |
| Example 21 | 4 | 3 | 5 |
| Example 22 | 3 | 3 | 5 |
| Example 23 | 3 | 3 | 5 |
| Example 24 | 4 | 3 | 5 |
| Example 25 | 4 | 3 | 5 |
| Comparative Example 1 | 2 | 2 | 5 |
| Comparative Example 2 | 2 | 3 | 5 |
| Comparative Example 3 | 2 | 1 | 5 |
| Comparative Example 4 | 2 | 2 | 5 |
| Comparative Example 6 | 3 | 2 | 1 |
| Comparative Example 7 | 3 | 2 | 2 |

As shown above in the table, in Examples, spectral characteristics and rectangularity were excellent. Therefore, a pattern having excellent infrared shielding properties and rectangularity was able to be formed. Further, the remaining of residues was able to be suppressed. In addition, in a case where a cured film which was formed using each of the radiation-sensitive compositions according to Examples was incorporated into a solid image pickup element, infrared shielding properties were high, and the visibility of an image was excellent.

On the other hand, in Comparative Examples, at least either rectangularity or spectral characteristics were poor.

Example 101

The radiation-sensitive composition according to Example 1 was applied to a silicon wafer with an undercoat layer using a spin coating method such that the thickness after the application was 0.7 m, and then was heated using a hot plate at 100° C. for 2 minutes. As a result, a radiation-sensitive composition layer was obtained.

Next, using an i-ray stepper exposure device FPA-3000 i5+ (manufactured by Canon Corporation), the obtained radiation-sensitive composition layer was exposed (an optimum exposure dose was selected such that the line width was 1.1 μm) through a mask having a 1.1 μm×1.1 μm Bayer pattern.

Next, puddle development was performed on the exposed radiation-sensitive composition layer at 23° C. for 60 seconds using a tetramethylammonium hydroxide (TMAH) 0.3 mass % aqueous solution. Next, the silicon wafer was rinsed by spin showering, was washed with pure water, and was heated using a hot plate at 220° C. for 5 minutes. As a result, a pattern was obtained.

Example 102

The radiation-sensitive composition according to Example 1 was applied to a silicon wafer with an undercoat layer using a spin coating method such that the thickness after the application was 0.7 μm, and then was heated using a hot plate at 100° C. for 2 minutes. As a result, a radiation-sensitive composition layer was obtained.

Next, using an i-ray stepper exposure device FPA-3000 i5+ (manufactured by Canon Corporation), the obtained radiation-sensitive composition layer was exposed (an optimum exposure dose was selected such that the line width was 1.1 μm) through a mask having a 1.1 μm×1.1 μm Bayer pattern.

Next, puddle development was performed on the exposed radiation-sensitive composition layer at 23° C. for 60 seconds using a tetramethylammonium hydroxide (TMAH) 0.3 mass % aqueous solution. Next, the silicon wafer was rinsed by spin showering and was washed with pure water. Further, the entire surface of the silicon wafer was exposed using an i-ray stepper exposure device FPA-3000 i5+ (manufactured by Canon Corporation) at 1000 mJ/cm$^2$. Next, the silicon wafer was heated using a hot plate at 220° C. for 5 minutes. As a result, a pattern was obtained.

In Examples 101 and 102, a pattern having excellent infrared shielding properties and rectangularity was able to be formed. In addition, in a case where cross-sections (pixel side walls) of the pattern portions of Examples 101 and 102 were observed (magnification: 25000 times) with a scanning electron microscope (SEM), the rectangularity of Example 102 was higher than that of Example 101.

EXPLANATION OF REFERENCES

110: solid image pickup element
111: near infrared cut filter
112: color filter
114: infrared transmitting filter
115: microlens
116: planarizing layer

What is claimed is:
1. A radiation-sensitive composition comprising:
a near infrared absorber;
a resin;
a radically polymerizable compound; and
a photoradical polymerization initiator,
wherein the radiation-sensitive composition has an absorption maximum in a wavelength range of 700 to 1000 nm,
a ratio of an absorbance Amax at the absorption maximum to an absorbance A550 at a wavelength of 550 nm is 50 to 500,
the resin includes a resin having an acid group, and
a mass ratio of the radically polymerizable compound to the resin having an acid group is 0.5 to 0.7.
2. The radiation-sensitive composition according to claim 1,
wherein the photoradical polymerization initiator includes an oxime compound.
3. The radiation-sensitive composition according to claim 1,
wherein the photoradical polymerization initiator includes an oxime compound and an α-aminoketone compound.
4. The radiation-sensitive composition according to claim 1,
wherein the radically polymerizable compound is a radically polymerizable compound having an acid group.
5. The radiation-sensitive composition according to claim 1, further comprising:
a chain transfer agent.
6. The radiation-sensitive composition according to claim 1, further comprising:
an ultraviolet absorber.
7. The radiation-sensitive composition according to claim 1,
wherein the near infrared absorber includes at least one selected from the group consisting of an organic pigment and an inorganic pigment.

8. The radiation-sensitive composition according to claim 1,
wherein a content of the near infrared absorber is 20 mass % or higher with respect to a total solid content of the radiation-sensitive composition.

9. An optical filter which is obtained using the radiation-sensitive composition according to claim 1.

10. The optical filter according to claim 9,
wherein the optical filter is a near infrared cut filter or an infrared transmitting filter.

11. The optical filter according to claim 9, further comprising:
an antireflection film.

12. A solid image pickup element comprising:
the optical filter according to claim 9.

13. An image display device comprising:
the optical filter according to claim 9.

14. An infrared sensor comprising:
the optical filter according to claim 9.

15. A laminate comprising:
a near infrared cut filter that is formed using the radiation-sensitive composition according to claim 1; and
a color filter that includes a chromatic colorant.

16. A pattern forming method comprising:
forming a radiation-sensitive composition layer on a support using the radiation-sensitive composition according to claim 1;
exposing the radiation-sensitive composition layer in a pattern shape; and
forming a pattern by removing a non-exposed portion by development.

17. The pattern forming method according to claim 16, further comprising:
exposing the radiation-sensitive composition layer after removing the non-exposed portion by development.

18. The radiation-sensitive composition according to claim 1, wherein a mass ratio of the radically polymerizable compound to the resin having an acid group is 0.5 to 0.65.

19. The radiation-sensitive composition according to claim 1, wherein the near infrared absorber contains a pyrrolopyrrole compound.

20. The radiation-sensitive composition according to claim 1, wherein the resin having an acid group is an alkali-soluble resin.

21. The radiation-sensitive composition according to claim 20, wherein the acid value of the alkali-soluble resin is 30 to 500 mgKOH/g.

22. The radiation-sensitive composition according to claim 20, wherein the alkali-soluble resin does not have a polymerizable group.

23. The radiation-sensitive composition according to claim 1, wherein the content of the near infrared absorber is 20 mass % or higher with respect to the total solid content of the radiation-sensitive composition.

24. The radiation-sensitive composition according to claim 1, wherein the content of the radically polymerizable compound is 10 to 35 mass % with respect to the total solid content of the radiation-sensitive composition.

25. The radiation-sensitive composition according to claim 1, wherein the near infrared absorber contains a compound represented by Formula (5):

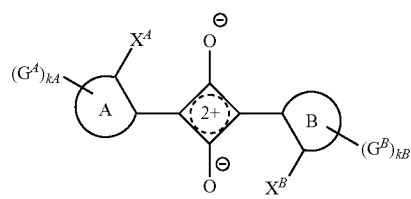

(5)

wherein a ring A and a ring B each independently represent an aromatic ring or a heteroaromatic ring;
$X^A$ and $X^B$ each independently represent a substituent;
$G^A$ and $G^B$ each independently represent a substituent;
kA represents an integer of 0 to $n_A$;
kB represents an integer of 0 to $n_B$;
$n_A$ represents integers representing the maximum numbers of $G^A$'s which may be substituted in the ring A;
$n_B$ represents integers representing the maximum numbers of $G^B$'s which may be substituted in the ring B;
$X^A$ and $G^A$ may be bonded to each other to form ring structures;
$X^B$ and $G^B$ may be bonded to each other to form ring structures;
in a case where a plurality of $G^A$'s are present, $G^A$'s may be bonded to each other to form ring structures, respectively; and
in a case where a plurality of $G^B$'s are present, $G^B$'s may be bonded to each other to form ring structures, respectively.

26. The radiation-sensitive composition according to claim 25, wherein:
the ring A and the ring B represent naphthalene ring;
$X^A$ and $X^B$ each independently represent —$NR^{X1}R^{X2}$;
$R^{X1}$ and $R^{X1}$ each independently represent a hydrogen atom or a sub stituent;
kA represents 1;
kB represents 1;
$X^A$ and $G^A$ bonded to each other to form ring structures; and
$X^B$ and $G^B$ bonded to each other to form ring structures.

* * * * *